(12) United States Patent
Lin et al.

(10) Patent No.: US 8,531,024 B2
(45) Date of Patent: Sep. 10, 2013

(54) SEMICONDUCTOR CHIP ASSEMBLY WITH POST/BASE HEAT SPREADER AND MULTILEVEL CONDUCTIVE TRACE

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 298 days.

(21) Appl. No.: 13/091,162

(22) Filed: Apr. 21, 2011

(65) Prior Publication Data

US 2011/0198662 A1    Aug. 18, 2011

Related U.S. Application Data

(63) Continuation-in-part of application No. 12/616,773, filed on Nov. 11, 2009, now Pat. No. 8,067,784, and a continuation-in-part of application No. 12/616,775, filed on Nov. 11, 2009, now abandoned, which is a continuation-in-part of application No. 12/557,540, filed on Sep. 11, 2009, now Pat. No. 8,378,372, and a continuation-in-part of application No. 12/557,541, filed on Sep. 11, 2009, now Pat. No. 7,948,076, said application No. 12/557,540 is a continuation-in-part of application No. 12/406,510, filed on Mar. 18, 2009.

(60) Provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
| | | |
|---|---|---|
| H01L 23/34 | (2006.01) | |
| H01L 23/10 | (2006.01) | |
| H01L 33/00 | (2010.01) | |

(52) U.S. Cl.
USPC ............. 257/706; 257/99; 257/711; 257/717; 257/E23.102; 257/E23.104; 438/122

(58) Field of Classification Search
USPC .......... 257/703–709, 711, 717, 720, E23.102, 257/E23.104; 438/26, 27, 118, 122
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |
| 4,420,767 A | 12/1983 | Hodge et al. | 257/713 |

(Continued)

FOREIGN PATENT DOCUMENTS

JP    2005-166775    6/2005

*Primary Examiner* — Jenny L Wagner
*Assistant Examiner* — Abbigale Boyle
(74) *Attorney, Agent, or Firm* — Jackson IPG PLLC

(57) ABSTRACT

A semiconductor chip assembly includes a semiconductor device, a heat spreader, a conductive trace, a substrate and an adhesive. The heat spreader includes a post and a base. The conductive trace includes a pad, a terminal, a conductive pattern and first and second vias. The substrate includes the conductive pattern and a dielectric layer. The semiconductor device is electrically connected to the conductive trace and thermally connected to the heat spreader. The post extends upwardly from the base into an opening in the adhesive and an aperture in the substrate, and the base extends laterally from the post. The conductive trace provides signal routing between the pad and the terminal using the conductive pattern and the vias.

35 Claims, 39 Drawing Sheets

(56) References Cited

U.S. PATENT DOCUMENTS

| | | | |
|---|---|---|---|
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,201,300 B1* | 3/2001 | Tseng et al. | 257/706 |
| 6,265,767 B1* | 7/2001 | Gaku et al. | 257/678 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,548,895 B1* | 4/2003 | Benavides et al. | 257/712 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,112,883 B2* | 9/2006 | Hasunuma | 257/714 |
| 7,196,403 B2 | 3/2007 | Karim | 257/675 |
| 7,335,522 B2 | 2/2008 | Wang et al. | 438/26 |
| 7,462,933 B2* | 12/2008 | Zhao et al. | 257/713 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,919,853 B1* | 4/2011 | Lee | 257/706 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2008/0296599 A1* | 12/2008 | Mazzochette | 257/98 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

SEMICONDUCTOR CHIP ASSEMBLY WITH POST/BASE HEAT SPREADER AND MULTILEVEL CONDUCTIVE TRACE

CROSS-REFERENCE TO RELATED APPLICATIONS

This application is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009 now abandoned, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 now U.S. Pat. No. 8,378,372 and a continuation-in-part of U.S. application Ser. No. 12/557,541 filed Sep. 11, 2009 U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, a substrate, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace, a substrate and an adhesive. The heat spreader includes a post and a base. The conductive trace includes a pad, a terminal, a conductive pattern and first and second vias. The substrate includes the conductive pattern and a dielectric layer. The semiconductor device is electrically connected to the conductive trace and thermally connected to the heat spreader. The post extends upwardly from the base into an opening in the adhesive and an aperture in the substrate, and the base extends laterally from the post. The conductive trace provides signal routing between the pad and the terminal using the conductive pattern and the vias.

In accordance with an aspect of the present invention, a semiconductor chip assembly includes a semiconductor device, an adhesive, a heat spreader, a substrate and a conductive trace. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a first conductive segment, a second conductive segment and a dielectric layer, wherein the first conductive segment is attached to and extends above the dielectric layer, the second conductive segment is attached to and extends below the dielectric layer, the dielectric layer contacts and is sandwiched between the conductive segments and an aperture extends through the substrate. The conductive trace includes a pad, a terminal, a conductive pattern, a first via and a second via, wherein the conductive pattern is a part of the substrate and includes the first and/or second conductive segment, the first via extends through the adhesive and extends to the conductive pattern, the second via extends through the adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via.

The semiconductor device overlaps the post, is electrically connected to the pad and thereby electrically connected to the terminal, and is thermally connected to the post and thereby thermally connected to the base. The adhesive is mounted on and extends above the base, extends above and below the substrate, extends laterally from the post to or beyond the terminal and is sandwiched between the post and the substrate, between the base and the substrate, between the pad and the substrate and between the terminal and the substrate. The substrate is mounted on the adhesive and extends above the base. The post extends into the opening, extends through the aperture and extends above and below the substrate. The base covers the semiconductor device in the downward direction.

In accordance with another aspect of the present invention, a semiconductor chip assembly includes a semiconductor device, an adhesive, a heat spreader, a substrate and a conductive trace. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a first conductive segment, a second conductive segment and a dielectric layer, wherein the first conductive segment is attached to and extends above the dielectric layer, the second conductive segment is attached to and extends below the dielectric layer, the dielectric layer contacts and is sandwiched between the conductive segments and an aperture extends through the substrate. The conductive trace includes a pad, a terminal, a conductive pattern, a first via and a second via, wherein the pad is located above the substrate, the terminal is located below the substrate, the conductive pattern is a part of the substrate and includes the first and/or second conductive segment, the first via is located above the conductive pattern and extends through the adhesive and extends to the conductive pattern, the second via is located below the conductive pattern and extends through the adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via.

The semiconductor device overlaps the post, is electrically connected to the pad and thereby electrically connected to the terminal, and is thermally connected to the post and thereby thermally connected to the base. The adhesive is mounted on and extends above the base, extends above and below the substrate, extends laterally from the post to or beyond the terminal and is sandwiched between the post and the substrate, between the base and the substrate, between the pad and the substrate and between the terminal and the substrate. The substrate is mounted on the adhesive and extends above the base. The post extends into the opening, extends through the aperture and extends above and below the substrate. The base covers the semiconductor device in the downward direction.

The heat spreader can include a cap that extends above and is adjacent to and covers in the upward direction and extends laterally from a top of the post. For instance, the cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and overlap a portion of the adhesive that is coplanar with and adjacent to the post. The cap can also overlap the dielectric layer. The cap can also be coplanar with the pad above the adhesive at a top surface that faces in the upward direction. Furthermore, the cap and the pad can have the same thickness where closest to one another and different thickness where the cap is adjacent to the post. In addition, the cap can be thermally connected to the base by the post.

The heat spreader can consist of the post and the base or the post, the base and the cap. The heat spreader can also consist essentially of copper, aluminum or copper/nickel/aluminum. The heat spreader can also consist of a buried copper, aluminum or copper/nickel/aluminum core and plated surface contacts that consist of gold, silver and/or nickel. In any case, the heat spreader provides heat dissipation and spreading from the semiconductor device to the next level assembly.

The semiconductor device can be mounted on the heat spreader and the conductive trace. For instance, the semiconductor device can be mounted on and overlap the post and the pad, be electrically connected to the pad using a first solder joint and be thermally connected to the heat spreader using a second solder joint. Alternatively, the semiconductor device can be mounted on and overlap the post but not the conductive trace, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the cap and the pad, overlaps the post and the pad, is electrically connected to the pad using a first solder joint and is thermally connected to the cap using a second solder joint. Alternatively, the semiconductor device can be a semiconductor chip such as an LED chip that is mounted on the cap but not the pad, overlaps the post but not the pad, is electrically connected to the pad using a wire bond and is thermally connected to the cap using a die attach.

The adhesive can contact the post and the dielectric layer in a gap in the aperture between the post and the substrate, extend across the dielectric layer in the gap and contact the post, the base, the pad, the terminal, the conductive pattern, the vias and the dielectric layer outside the gap. The adhesive can also contact and be sandwiched between the post and the substrate, between the base and the substrate, between the pad and the substrate and between the terminal and the substrate. The adhesive can also cover and surround the post in the lateral directions, cover the base outside the post in the upward direction and cover the cap outside the post in the downward direction. The adhesive can also conformally coat the sidewalls of the post and top surface portions of the base and the terminal. The adhesive can also fill the space between the post and the dielectric layer.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive alone can intersect an imaginary horizontal line between the post and the dielectric layer, an imaginary horizontal line between the post and the conductive pattern, an imaginary horizontal line between the post and the first via, an imaginary horizontal line between the post and the second via, an imaginary vertical line between the base and the cap, an imaginary vertical line between the base and the dielectric layer, an imaginary vertical line between the pad and the dielectric layer and an imaginary vertical line between the terminal and the dielectric layer.

The post can be integral with the base. For instance, the post and the base can be a single-piece metal or include a single-piece metal at their interface, and the single-piece metal can be copper. The post can also be coplanar with the adhesive above the dielectric layer at the cap and below the dielectric layer at the base. The post can also have a cut-off conical or pyramidal shape in which its diameter decreases as it extends upwardly from the base to its top.

The base can cover the post in the downward direction, support the substrate and the adhesive and extend to or be spaced from peripheral edges of the assembly. Furthermore, the base and the terminal can have the same thickness and be coplanar with one another at a bottom surface that faces in the downward direction.

The substrate can be spaced from the post, the base, the pad and the terminal. The substrate can also be a laminated structure. The substrate can also include a second-level power/ground plane at the first conductive segment, a third-level power/ground plane at the second conductive segment or both.

The conductive pattern can be the first conductive segment, the second conductive segment or the first and second conductive segments and an electrical interconnect that is a part of the substrate and contacts and extends through the dielectric layer and electrically connects the conductive segments.

The conductive pattern can be the first conductive segment and the second conductive segment can be part of another conductive trace. For instance, the first conductive segment can be a routing line or a power/ground plane. In addition, the first via can be located above the first conductive segment and extend through the adhesive to the first conductive segment and be spaced from the dielectric layer and the second via can be located below the first conductive segment and extend through the adhesive and the dielectric layer to the first conductive segment.

The conductive pattern can be the second conductive segment and the first conductive segment can be part of another conductive trace. For instance, the second conductive segment can be a routing line or a power/ground plane. In addition, the first via can be located above the second conductive segment and extend through the adhesive and the dielectric layer to the second conductive segment and the second via can be located below the second conductive segment and extend through the adhesive to the second conductive segment and be spaced from the dielectric layer.

The conductive pattern can be the first and second conductive segments and the electrical interconnect. For instance, the first conductive segment can be a first routing line between the first via and the electrical interconnect and the second conductive segment can be a second routing line between the second via and the electrical interconnect. In addition, the first via can be located above the first conductive segment and extend through the adhesive to the first conductive segment and be spaced from the dielectric layer and the second via can be located below the second conductive segment and extend through the adhesive to the second conductive segment and be spaced from the dielectric layer.

The vias can be laterally offset or axially aligned with one another. For instance, the vias can be laterally offset and spaced from one another. Alternatively, the vias can be axially aligned and integral with one another at a power/ground plane.

The conductive trace can include a routing line, the pad and the routing line can overlap the adhesive and the routing line can be in an electrically conductive path between the pad and the first via. Likewise, the conductive trace can include a routing line, the terminal and the routing line can be overlapped the adhesive and the routing line can be in an electrically conductive path between the terminal and the second via.

The conductive trace can provide horizontal and/or vertical routing. For instance, the pad, the terminal and the vias can be located above the conductive pattern and the pad and the terminal can have the same thickness, be coplanar with one another above the adhesive at a surface that faces in the upward direction and provide horizontal routing. Alternatively, the pad and the first via can be located above the conductive pattern, the terminal and the via can be located below the conductive pattern, the pad can extend above the adhesive, the terminal can extend below the adhesive and the pad and the terminal can provide vertical routing.

The conductive trace can consist of the pad, the terminal, the conductive pattern and the vias. The conductive trace can also consist essentially of copper. The conductive trace can also consist of a buried copper core and plated surface contacts that consist of gold, silver and/or nickel. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The base, the cap, the pad and the terminal can be the same metals. For instance, the base, the cap, the pad and the terminal can include a gold, silver or nickel surface layer and a buried copper core and be primarily copper and the post and the conductive pattern can be copper. In this instance, a plated contact can include a gold or silver surface layer and a buried nickel layer that contacts and is sandwiched between the surface layer and the buried copper core or a nickel surface layer that contacts the buried copper core. Furthermore, the heat spreader can include a copper core shared by the post, the base and the cap and the conductive trace can include a copper core shared by the pad, the terminal, the conductive pattern and the vias. For instance, the heat spreader and the conductive trace can include a gold, silver or nickel surface layer and a buried copper core and be primarily copper. In this instance, the heat spreader can include a plated contact at the cap and another plated contact at the base, and the conductive trace can include a plated contact at the pad and another plated contact at the terminal.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting a second adhesive on the base, mounting a substrate with a conductive pattern on the second adhesive, mounting a first adhesive on the substrate and mounting a conductive layer on the first adhesive, then flowing the first adhesive upward between the post and the conductive layer and flowing the second adhesive upward between the post and the substrate, solidifying the adhesives, then providing a conductive trace that includes a pad, a terminal, the conductive pattern, first and second vias and a selected portion of the conductive layer, mounting a semiconductor device on the post, wherein a heat spreader includes the post and the base, electrically connecting the semiconductor device to the conductive trace and thermally connecting the semiconductor device to the heat spreader.

In accordance with an aspect of the present invention, a method of making a semiconductor chip assembly includes (1) providing a post, a base, a first adhesive, a second adhesive, a substrate and a conductive layer, wherein (a) the post is adjacent to the base, extends above the base in an upward direction, extends into a first opening in the first adhesive and is aligned with a second opening in the second adhesive, a hole in the conductive layer and an aperture in the substrate, (b) the base extends below the post in a downward direction opposite the upward direction and extends laterally from the post in lateral directions orthogonal to the upward and downward directions, (c) the second adhesive is mounted on and extends above the base and is non-solidified, (d) the substrate is mounted on and extends above the second adhesive, wherein the substrate includes a first conductive segment, a second conductive segment and a dielectric layer, the first conductive segment is attached to and extends above the dielectric layer, the second conductive segment is attached to and extends below the dielectric layer and the dielectric layer is solidified, (e) the first adhesive is mounted on and extends above the substrate and is non-solidified and (f) the conductive layer is mounted on and extends above the first adhesive, then (2) flowing the first adhesive into and upward in a first gap located in the hole between the post and the conductive layer, (3) flowing the second adhesive into and upward in a second gap located in the aperture between the post and the substrate, (4) solidifying the adhesives, then (5) providing a conductive trace that includes a pad, a terminal, a conductive pattern, a first via, a second via and a selected portion of the conductive layer, wherein the conductive pattern is a part of the substrate and includes the first and/or second conductive segment, the first via extends to the conductive pattern, the second via extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via, then (6) mounting a semiconductor device on the post, wherein a heat spreader includes the post and the base and the semiconductor device overlaps the post, (7) electrically connecting the semiconductor device to the pad, thereby electrically connecting the semiconductor device to the terminal, and (8) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing a first adhesive, wherein a first opening extends through the first adhesive, (3) providing a second adhesive, wherein a second opening extends through the second adhesive, (4) providing a conductive layer, wherein a hole extends through the conductive layer, (5) providing a substrate that includes a first conductive segment, a second conductive segment and a dielectric layer, wherein an aperture extends through the substrate, (6) mounting the second adhesive on the base, including inserting the post into the second opening, wherein the second adhesive extends above the base and is non-solidified, (7) mounting the substrate on the second adhesive, including aligning the post with the aperture, wherein the substrate extends above the second adhesive, the first conductive segment is attached to and extends above the dielectric layer, the second conductive segment is attached to and extends below the dielectric layer and the dielectric layer is solidified, (8) mounting the first adhesive on the substrate, including aligning the post with the first opening, wherein the first adhesive extends above the substrate and is non-solidified, (9) mounting the conductive layer on the first adhesive, including aligning the post with the hole, wherein the conductive layer extends above the first adhesive, then (10) applying heat to melt the adhesives, (11) moving the base and the conductive layer towards one another, thereby moving the post upward in the hole and the aperture, applying pressure to the molten first adhesive between the conductive layer and the substrate, applying pressure to the molten second adhesive between the base and the substrate, forcing the molten first adhesive to flow into and upward in a first gap located in the hole between the post and the conductive layer and forcing the molten second adhesive to flow into and upward in a second gap located in the aperture between the post and the substrate, (12) applying heat to solidify the molten adhesives, thereby mechanically attaching the post to the conductive layer, the post to the substrate, the base to the substrate and the conductive layer to the substrate, then (13) providing a conductive trace that includes a pad, a terminal, a conductive pattern, a first via, a second via and a selected portion of the conductive layer, wherein the conductive pattern is a part of the substrate and includes the first and/or second conductive segment, the first via extends to the conductive pattern, the second via extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via, then (14) mounting a semiconductor device on the post, wherein a heat spreader includes the post and the base and the semiconductor device overlaps the post, (15) electrically connecting the semiconductor device to the pad, thereby electrically connecting the semiconductor device to the terminal, and (16) thermally connecting the semiconductor device to the post, thereby thermally connecting the semiconductor device to the base.

Mounting the conductive layer can include mounting the conductive layer alone on the first adhesive, or alternatively, attaching the conductive layer to a carrier, then mounting the conductive layer and the carrier on the first adhesive such that the carrier overlaps the conductive layer and the conductive layer contacts the first adhesive and is sandwiched between the first adhesive and the carrier, and then, after solidifying the first adhesive, removing the carrier and then providing the conductive trace. As another alternative, mounting the conductive layer can include mounting the conductive layer and a dielectric layer on the first adhesive such that the conductive layer overlaps the dielectric layer and is spaced from the first adhesive and the dielectric layer contacts and is sandwiched between the conductive layer and the first adhesive.

In accordance with another aspect of the present invention, a method of making a semiconductor chip assembly includes (1) providing a post, a base, a first adhesive, a second adhesive, a substrate and a conductive layer, wherein (a) the post is adjacent to and integral with the base, extends above the base in an upward direction, extends through a first opening in the first adhesive into an aperture in the substrate and is aligned with a second opening in the second adhesive and a hole in the conductive layer, (b) the base extends below the post in a downward direction opposite the upward direction and extends laterally from the post in lateral directions orthogonal to the upward and downward directions, (c) the second adhesive is mounted on and extends above the base, contacts and is sandwiched between the base and the substrate and is non-solidified, (d) the substrate is mounted on and extends above the second adhesive and contacts and is sandwiched between the adhesives, wherein the substrate includes a first conductive segment, a second conductive segment and a dielectric layer, the first conductive segment is attached to and extends above the dielectric layer, the second conductive segment is attached to and extends below the dielectric layer and the dielectric layer contacts and is sandwiched between the conductive segments and is solidified, (e) the first adhesive is mounted on and extends above the substrate, contacts and is sandwiched between the conductive layer and the substrate and is non-solidified and (f) the conductive layer is mounted on and extends above the first adhesive, then (2) flowing the first adhesive into and upward in a first gap located in the hole between the post and the conductive layer, (3) flowing the second adhesive into and upward in a second gap located in the aperture between the post and the substrate, (4) flowing the adhesives into contact with one another, (5) solidifying the adhesives, then (6) providing a conductive trace that includes a pad, a terminal, a conductive pattern, a first via, a second via and a selected portion of the conductive layer, wherein the pad is located above the substrate, the terminal is located below the substrate, the conductive pattern is a part of the substrate and includes the first and/or second conductive segment, the first via extends through the first adhesive and extends to the conductive pattern, the second via extends through the second adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via, (7) providing a cap that extends above and is adjacent to and covers in the upward direction and extends laterally from a top of the post and that overlaps the aperture and includes a selected portion of the conductive layer, then (8) mounting a semiconductor device on the cap, wherein a heat spreader includes the post, the base and the cap and the semiconductor device overlaps the post, (9) electrically connecting the semiconductor device to the pad, thereby electrically connecting the semiconductor device to the terminal, and (10) thermally connecting the semiconductor device to the cap, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing a first adhesive, wherein a first opening extends through the first adhesive, (3) providing a second adhesive, wherein a second opening extends through the second adhesive, (4) providing a conductive layer, wherein a hole extends through the conductive layer, (5) providing a substrate that includes a first conductive segment, a second conductive segment and a dielectric layer, wherein an aperture extends through the substrate, (6) mounting the second adhesive on the base, including inserting the post into the second opening, wherein the second adhesive contacts and extends above the base and is non-solidified, (7) mounting the substrate on the second adhesive, including inserting the post into the aperture, wherein the substrate contacts and extends above the second adhesive, the first conductive segment is attached to and extends above the dielectric layer, the second conductive segment is attached to and extends below the dielectric layer and the dielectric layer contacts and is sandwiched between the conductive segments and is solidified, (8) mounting the first adhesive on the substrate, including inserting the post into the first opening, wherein the first adhesive contacts and extends above the substrate and is non-solidified, (9) mounting the conductive layer on the first adhesive, including aligning the post with the hole, wherein the conductive layer contacts and extends above the first adhesive, then (10) applying heat to melt the adhesives, (11) moving the base and the conductive layer towards one another, thereby moving the post upward in the hole and the aperture, applying pressure to the molten first adhesive between the conductive layer and the substrate, applying pressure to the molten second adhesive between the base and the substrate, forcing the molten first adhesive to flow into and upward in a first gap located in the hole between the post and the conductive layer, forcing the molten second adhesive to flow into and upward in a second gap located in the aperture between the post and the substrate and forcing the molten adhesives to contact and merge with one another, (12) applying heat to solidify the molten adhesives, thereby mechanically attaching the post to the conductive layer, the post to the substrate, the base to the substrate and the conductive layer to the substrate, then (13) providing a conductive trace that includes a pad, a terminal, a conductive pattern, a first via, a second via and a selected portion of the conductive layer, wherein the pad is located above the substrate, the terminal is located below the substrate, the conductive pattern is a part of the substrate and includes the first and/or second conductive segment, the first via extends through the first adhesive and extends to the conductive pattern, the second via extends through the second adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via, (14) providing a cap that extends above and is adjacent to and covers in the upward direction and extends laterally from a top of the post and that covers the aperture in the upward direction and includes a selected portion of the conductive layer, then (15) mounting a semiconductor device on the cap, wherein a heat spreader includes the post, the base and the cap and the semiconductor device overlaps the post, (16) electrically connecting the semiconductor device to the pad, thereby electrically connecting the semiconductor device to the terminal, and (17) thermally connecting the semiconductor device to the cap, thereby thermally connecting the semiconductor device to the base.

Providing the post and the base can include providing a metal plate, forming an etch mask on the metal plate that selectively exposes the metal plate and defines the post, etching the metal plate in a pattern defined by the etch mask, thereby forming a recess in the metal plate that extends into but not through the metal plate, wherein the post is an unetched portion of the metal plate that protrudes above the base and is laterally surrounded by the recess and the base is an unetched portion of the metal plate below the post and the recess and then removing the etch mask.

Providing the first adhesive can include providing a first prepreg with a first uncured epoxy, flowing the first adhesive can include melting the first uncured epoxy and compressing the first uncured epoxy between the conductive layer and the substrate, and solidifying the first adhesive can include curing the molten first uncured epoxy. Likewise, providing the second adhesive can include providing a second prepreg with a second uncured epoxy, flowing the second adhesive can include melting the second uncured epoxy and compressing the second uncured epoxy between the base and the substrate, and solidifying the second adhesive can include curing the molten second uncured epoxy.

Providing the heat spreader can include providing a cap on the post that extends above and is adjacent to and covers in the upward direction and extends laterally from a top of the post and covers the aperture in the upward direction after solidifying the adhesives and before mounting the semiconductor device.

Providing the first via can include forming a first window that extends through the conductive layer and the first adhesive and selectively exposes the conductive pattern and then depositing the first via into the first window. Likewise, providing the second via can include forming a second window that extends through the base and the second adhesive and selectively exposes the conductive pattern and then depositing the second via into the second window.

Providing the pad can include removing selected portions of the conductive layer after forming the first via. The removing can include applying a wet chemical etch to the conductive layer using an etch mask that defines the pad such that the pad includes a selected portion of the conductive layer.

Providing the cap can include removing selected portions of the conductive layer after forming the first via. The removing can include applying a wet chemical etch to the conductive layer using an etch mask that defines the cap such that the cap includes a selected portion of the conductive layer.

Providing the terminal can include removing selected portions of the base after forming the second via. The removing can include applying a wet chemical etch to the base using an etch mask that defines the terminal such that the terminal includes a selected portion of the base that is spaced and separated from and no longer part of the base.

Providing the base can include removing selected portions of the base after forming the second via. The removing can include applying a wet chemical etch to the base using an etch mask that defines a smaller portion of the base such that the base is trimmed.

Providing the pad and the cap can include removing selected portions of the conductive layer using an etch mask that defines the pad and the cap. Thus, the pad and the cap can be formed simultaneously using the same etch mask and wet chemical etch.

Providing the terminal and the base can include removing selected portions of the base using an etch mask that defines the terminal and the base. Thus, the terminal and the base can be formed simultaneously using the same etch mask and wet chemical etch.

Providing the pad can also include grinding the post, the first adhesive and the conductive layer after solidifying the first adhesive such that the post, the first adhesive and the conductive layer are laterally aligned with one another at a top lateral surface that faces in the upward direction, and then removing selected portions of the conductive layer such that the pad includes a selected portion of the conductive layer. The grinding can include grinding the first adhesive without grinding the post and then grinding the post, the first adhesive and the conductive layer. The removing can include applying a wet chemical etch to the conductive layer using an etch mask that defines the pad.

Providing the pad and the first via can include forming a window that extends through the conductive layer and the first adhesive and selectively exposes the conductive pattern after solidifying the first adhesive, then depositing a plated layer on the post, the conductive layer, the first adhesive and the conductive pattern, wherein the plated layer covers the post in the upward direction and forms the first via in the window, then forming an etch mask on the plated layer that defines the pad, etching the conductive layer and the plated layer in a pattern defined by the etch mask and then removing the etch mask.

Providing the terminal and the second via can include forming a window that extends through the base and the second adhesive and selectively exposes the conductive pattern after solidifying the second adhesive, then depositing a plated layer on the base, the second adhesive and the conductive pattern, wherein the plated layer covers the post in the downward direction and forms the second via in the window, then forming an etch mask on the plated layer that defines the terminal, etching the base and the plated layer in a pattern defined by the etch mask, wherein the terminal includes an unetched portion of the base that is adjacent to the second via and spaced and separated from and no longer part of the base and then removing the etch mask.

Providing the pad, the terminal and the vias can include forming a first window that extends through the conductive layer and the first adhesive and selectively exposes the conductive pattern after solidifying the first adhesive, forming a second window that extends through the base and the second adhesive and selectively exposes the conductive pattern after solidifying the second adhesive, then depositing a first plated layer on the post, the conductive layer, the first adhesive and the conductive pattern, wherein the first plated layer covers the post in the upward direction and forms the first via in the first window, depositing a second plated layer on the base, the second adhesive and the conductive pattern, wherein the second plated layer covers the post in the downward direction and forms the second via in the second window, then forming a first etch mask on the first plated layer that defines the pad, forming a second etch mask on the second plated layer that defines the terminal, then etching the conductive layer and the first plated layer in a pattern defined by the first etch mask, etching the base and the second plated layer in a pattern defined by the second etch mask and then removing the etch masks.

The first window can be formed in a single step by mechanical drilling or laser drilling or multiple steps in which the conductive layer is opened by wet chemical etching and the first adhesive and optionally the dielectric layer is opened by laser drilling or plasma etching. Likewise, the second window can be formed in a single step by mechanical drilling or laser drilling or multiple steps in which the base is opened by wet chemical etching and the second adhesive and optionally the dielectric layer is opened by laser drilling or plasma etching.

The windows can be formed simultaneously or in sequence. For instance, the windows can be formed in sequence using separate mechanical drilling steps and spaced from one another such that the vias are spaced from one another. Alternatively, the windows can be formed simultaneously using a single mechanical drilling step to form a single unitary window that extends through the base, the conductive layer, a power/ground plane, the dielectric layer and the adhesives such that the vias are axially aligned and integral with one another to form a single unitary via that extends through and is electrically connected to the power/ground plane.

Etching the conductive layer and the first plated layer can include exposing the first adhesive in the upward direction without exposing the second adhesive or the substrate in the upward direction, and etching the base and the second plated layer can include exposing the second adhesive in the downward direction without exposing the first adhesive or the substrate in the downward direction.

Providing the cap can include removing selected portions of the first plated layer. Providing the cap can also include the grinding and then removing selected portions of the first plated layer using the etch mask to define the pad and the cap such that the cap includes a selected portion of the first plated layer. The cap can also include a selected portion of the conductive layer. Thus, the pad and the cap can be formed simultaneously using the same grinding, wet chemical etch and etch mask.

The pad can be formed before, during or after the terminal is formed. Thus, the pad and the terminal can be formed simultaneously using the same wet chemical etch and different etch masks or sequentially using different etch masks. Similarly, the pad, the terminal and the cap can be formed simultaneously or sequentially.

Flowing the adhesives can include merging the adhesives into a single unitary adhesive that fills the gaps. Furthermore, flowing the first adhesive can also include squeezing the first adhesive through the first gap, above the post and the conductive layer and on top surface portions of the post and the conductive layer adjacent to the first gap.

Solidifying the adhesives can include mechanically bonding the post to the conductive layer, the post to the substrate, the base to the substrate and the conductive layer to the substrate.

Mounting the semiconductor device on the post can include mounting the semiconductor device on the cap and thus the post. Mounting the semiconductor device can also include positioning the semiconductor device above and overlapping the post, the cap, the pad, the adhesives and the dielectric layer, or alternatively, positioning the semiconductor device above and overlapping the post, the cap, the openings and the aperture without overlapping the conductive trace, the adhesives and the substrate.

Mounting the semiconductor device can include providing a first solder joint between an LED package that includes an LED chip and the pad and a second solder joint between the LED package and the post, electrically connecting the semiconductor device can include providing the first solder joint between the LED package and the pad, and thermally connecting the semiconductor device can include providing the second solder joint between the LED package and the post.

Mounting the semiconductor device can include providing a die attach between a semiconductor chip such as an LED chip and the post, electrically connecting the semiconductor device can include providing a wire bond between the chip and the pad, and thermally connecting the semiconductor device can include providing the die attach between the chip and the post.

The adhesive formed by the first and second adhesives can contact the post, the base, the cap, the pad, the terminal, the conductive pattern, the vias and the dielectric layer, cover and surround the post in the lateral directions and extend to peripheral edges of the assembly after the assembly is manufactured and detached from other assemblies in a batch.

The base can cover the semiconductor device, the post and the cap but not the conductive pattern, the vias, the terminal, the adhesives and the dielectric layer in the downward direction, support the substrate and the adhesives and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The post can provide thermal expansion matching with a semiconductor device mounted thereon, thereby increasing reliability. The cap can be customized for the semiconductor device, thereby enhancing the thermal connection. The adhesive can be sandwiched between the post and the substrate and between the base and the substrate, thereby providing a robust mechanical bond between the heat spreader and the substrate. The conductive trace can provide signal routing with simple circuitry patterns or flexible multi-layer signal routing with complex circuitry patterns. The conductive trace can also provide vertical signal routing between the pad above the adhesive and the dielectric layer and the terminal below the adhesive and the dielectric layer. The conductive trace can also provide a power/ground plane, thereby improving electrical performance. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
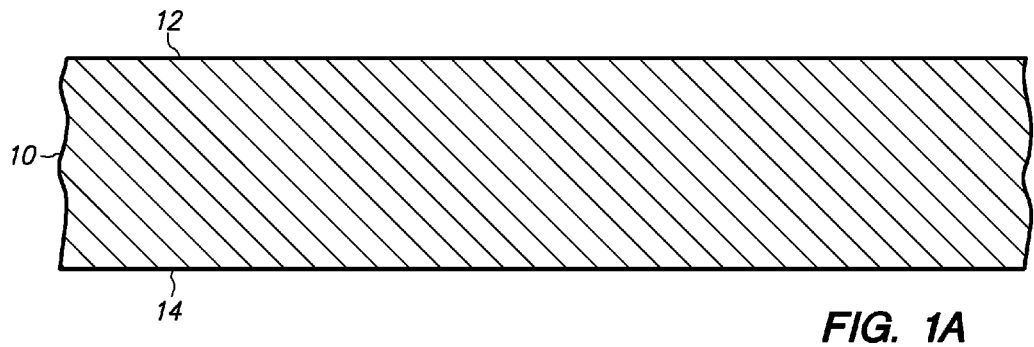
FIGS. 1A-1D are cross-sectional views showing a method of making a post and a base in accordance with an embodiment of the present invention.
Figure 1B:
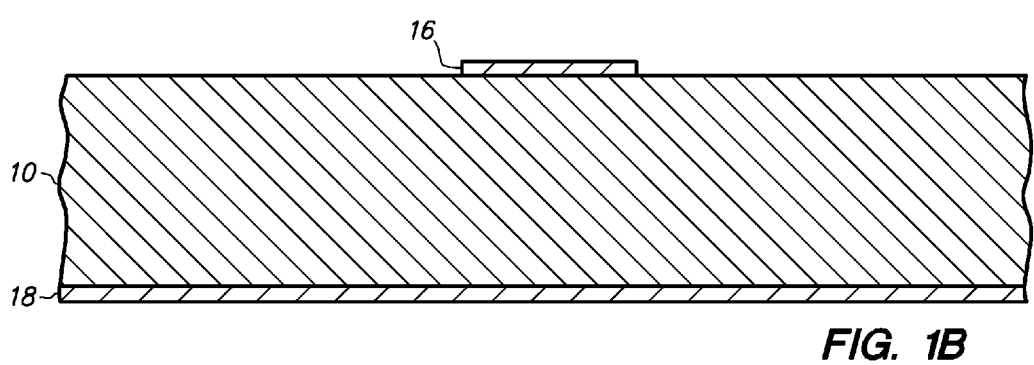
Figure 1C:
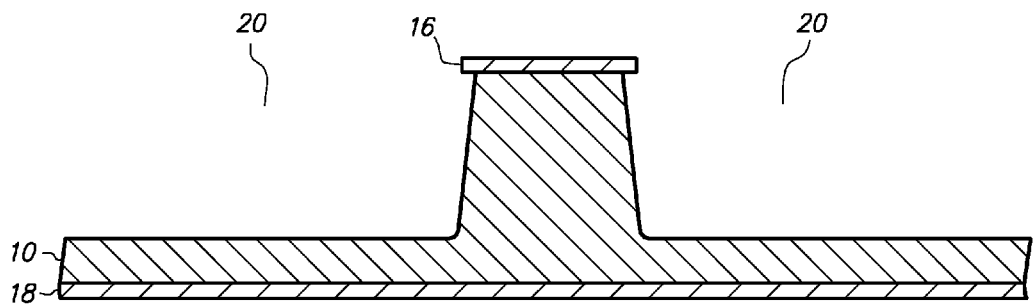
Figure 1D:
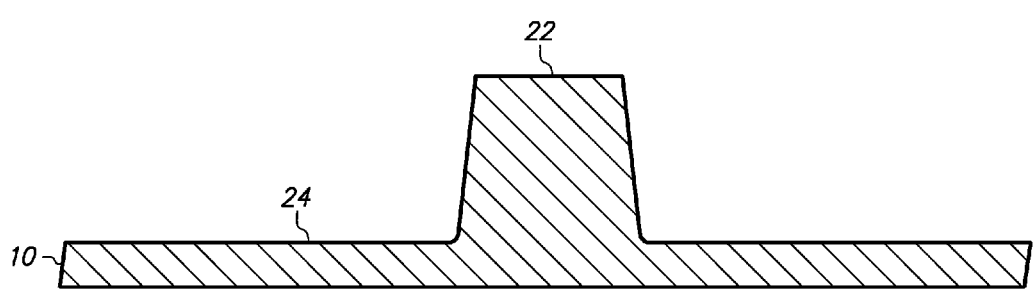
Figure 1E:
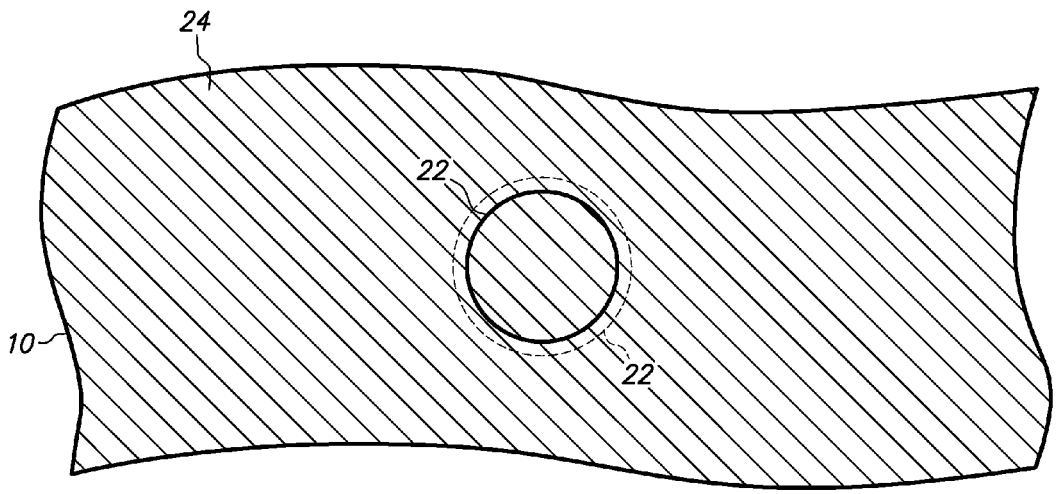
FIGS. 1E and 1F are top and bottom views, respectively, corresponding to FIG. 1D.
Figure 1F:
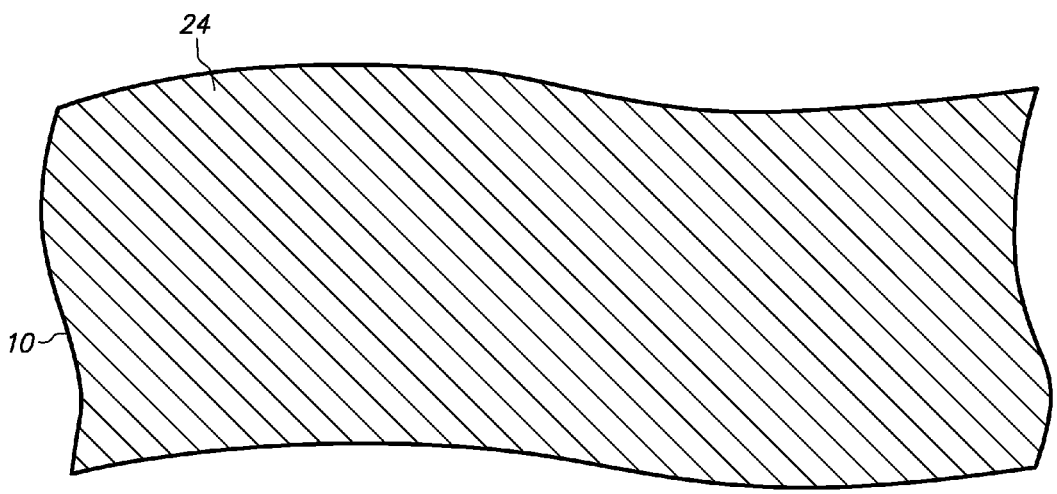

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A is a cross-sectional view of metal plate 10 which includes opposing major surfaces 12 and 14. Metal plate 10 is illustrated as a copper plate with a thickness of 450 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a frontside wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides backside protection. The wet chemical etch is highly selective of copper and etches 350 microns into metal plate 10. As a result, recess 20 extends from surface 12 into but not through metal plate 10, is spaced from surface 14 by 100 microns and has a depth of 350 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes post 22 and base 24.

Post 22 is an unetched portion of metal plate 10 defined by etch mask 16. Post 22 is adjacent to and integral with and protrudes above base 24 and is laterally surrounded by recess 20. Post 22 has a height of 350 microns (recess 20 depth), a diameter at its top surface (circular portion of surface 12) of 1000 microns and a diameter at its bottom (circular portion adjacent to base 24) of 1200 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of metal plate 10 that is below post 22, covers post 22 in the downward direction, extends laterally from post 22 in a lateral plane (with lateral directions such as left and right) and has a thickness of 100 microns (450-350).

Post 22 and base 24 can be treated to improve bondability to epoxy and solder. For instance, post 22 and base 24 can be chemically oxidized or microetched to provide rougher surfaces.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing upper portions of post 22 on etch-defined lower portions of post 22. Post 22 can also be formed semi-additively by depositing conformal upper portions of post 22 on etch-defined lower portions of post 22. Post 22 can also be sintered to base 24.

Figure 2A:
FIGS. 2A and 2B are cross-sectional views showing a method of making a conductive layer in accordance with an embodiment of the present invention.
Figure 2B:
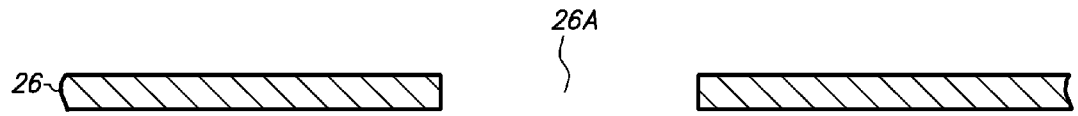
Figure 2C:
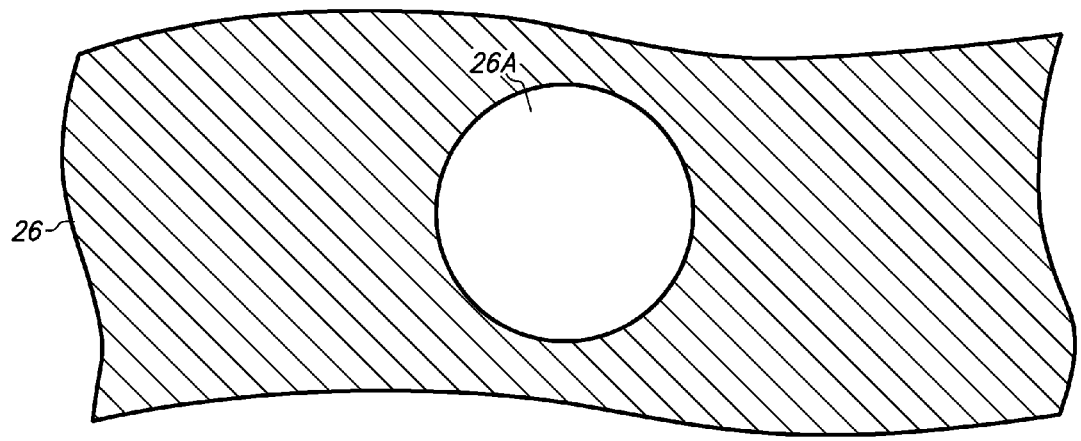
FIGS. 2C and 2D are top and bottom views, respectively, corresponding to FIG. 2B.
Figure 2D:
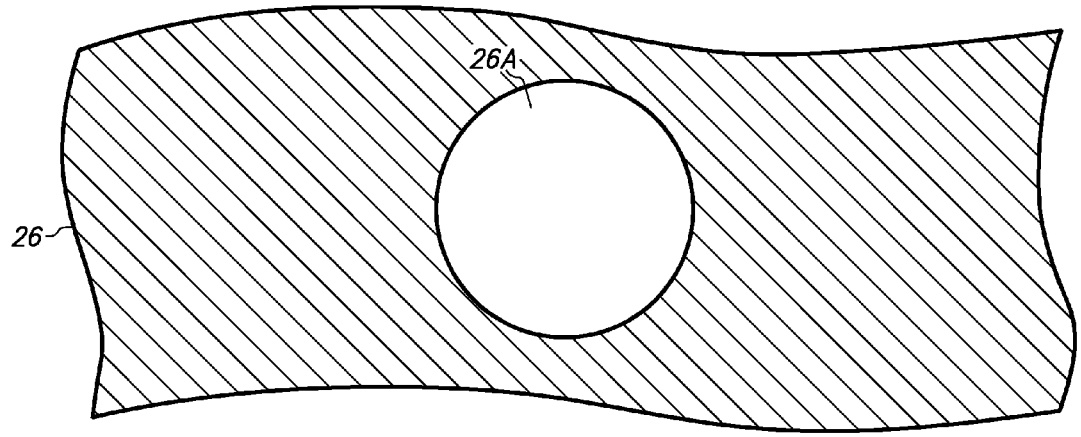

FIGS. 2A and 2B are cross-sectional views showing a method of making a conductive layer in accordance with an embodiment of the present invention, and FIGS. 2C and 2D are top and bottom views, respectively, corresponding to FIG. 2B.

FIG. 2A is a cross-sectional view of conductive layer 26. For instance, conductive layer 26 is an unpatterned copper sheet with a thickness of 80 microns.

FIGS. 2B, 2C and 2D are cross-sectional, top and bottom views, respectively, of conductive layer 26 with hole 26A. Hole 26A is a window that extends through conductive layer 26 and has a diameter of 1250 microns. Hole 26A is formed by mechanical drilling through conductive layer 26 although other techniques such as wet chemical etching, punching and stamping can be used.

Figure 3A:
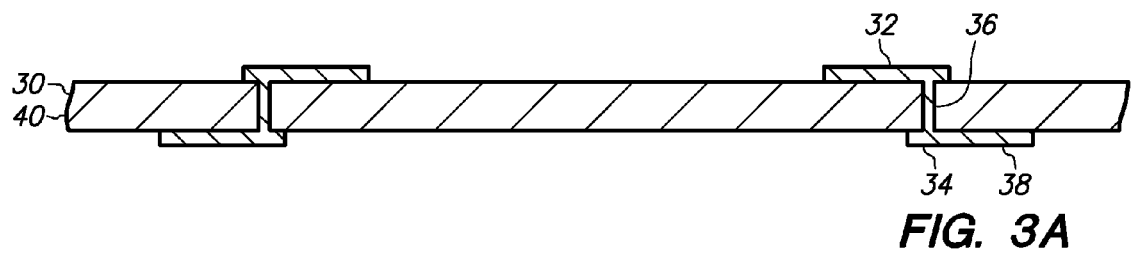
FIGS. 3A and 3B are cross-sectional views showing a method of making a substrate with a conductive pattern in accordance with an embodiment of the present invention.
Figure 3B:
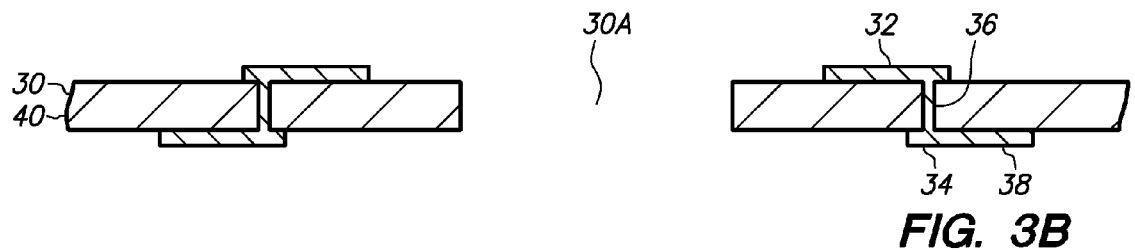
Figure 3C:
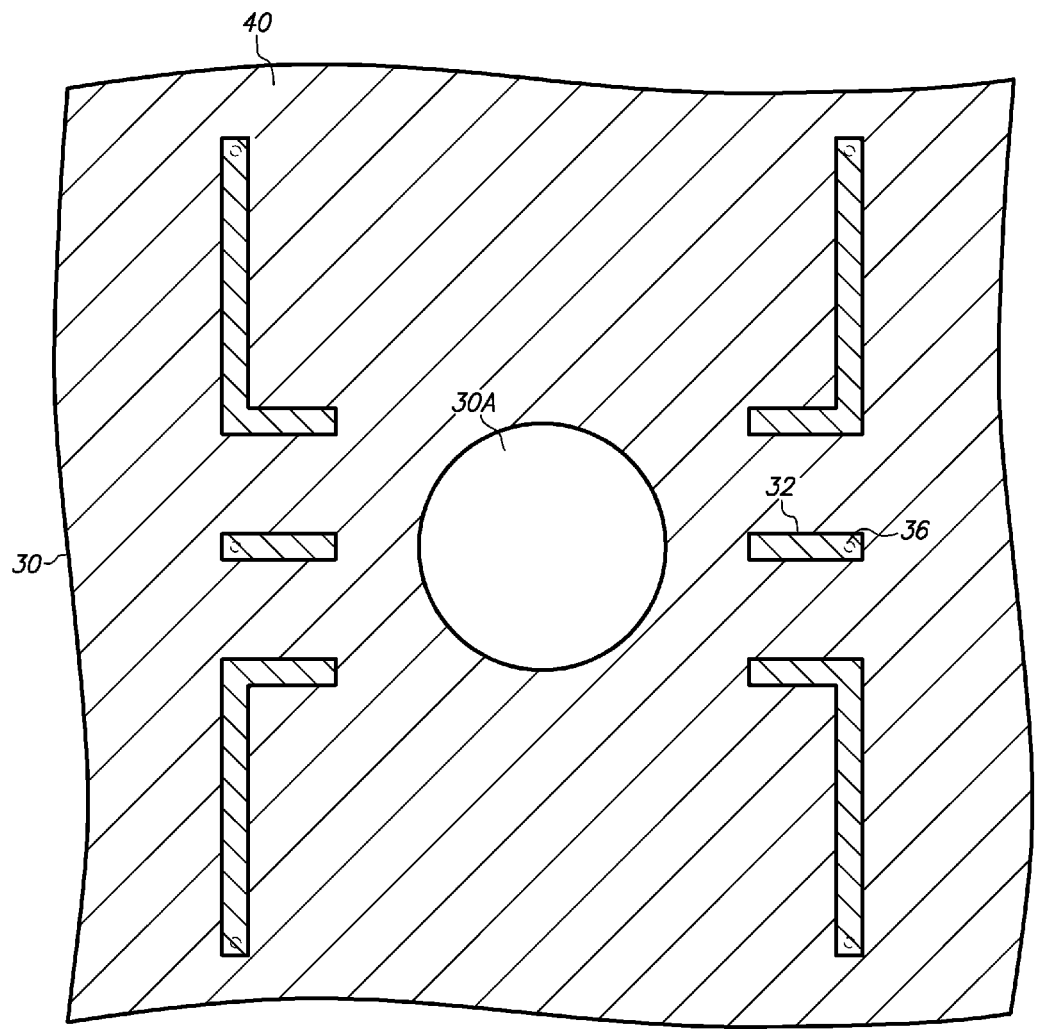
FIGS. 3C and 3D are top and bottom views, respectively, corresponding to FIG. 3B.
Figure 3D:
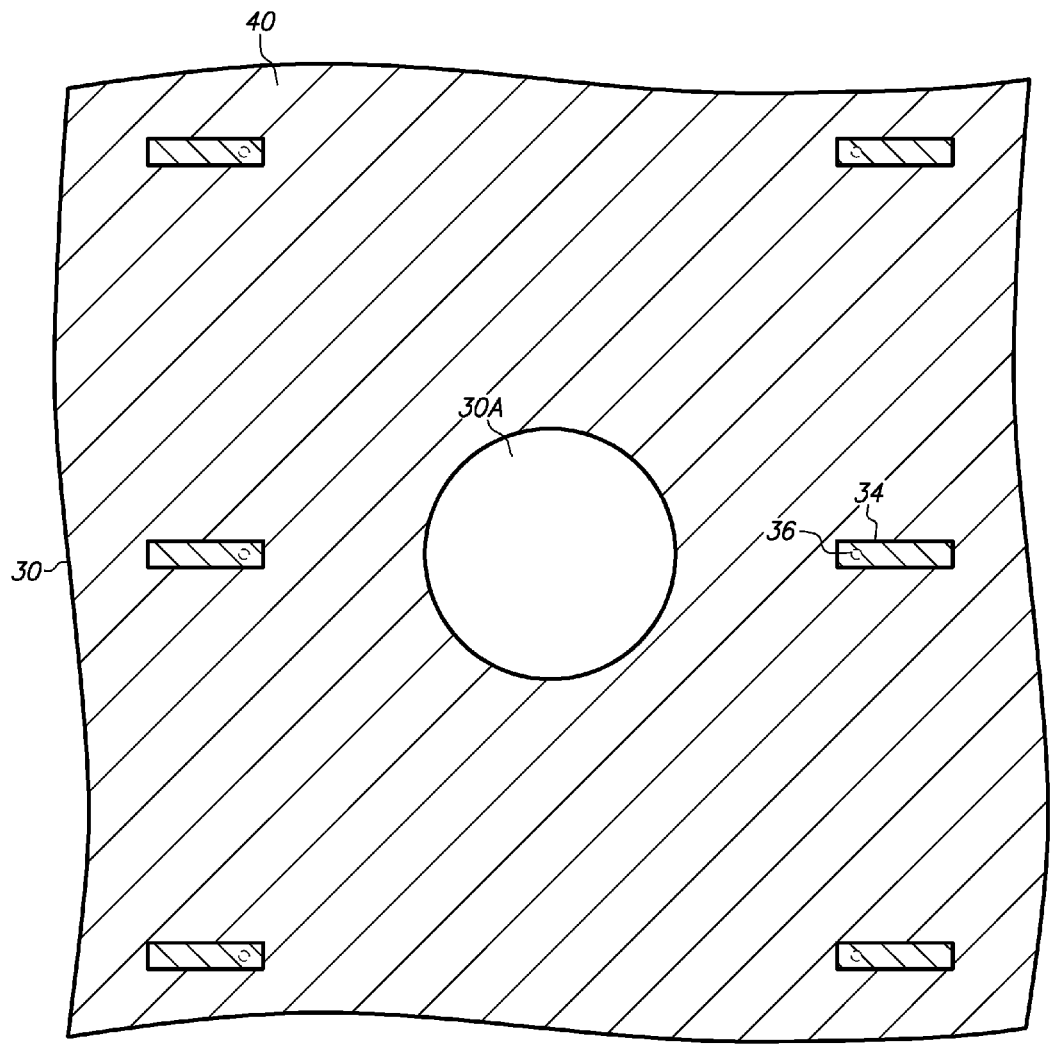

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 30 that includes conductive segments 32 and 34 and electrical interconnect 36, which collectively form conductive pattern 38, and dielectric layer 40. Conductive segment 32 is a routing line that contacts and is located above dielectric layer 40, conductive segment 34 is a routing line that contacts and is located below dielectric layer 40 and electrical interconnect 36 is a plated through-hole that contacts and extends through dielectric layer 40 and electrically connects conductive segments 32 and 34. Dielectric layer 40 is an electrical insulator that contacts and is sandwiched between conductive segments 32 and 34. For instance, conductive segment 32 is a patterned copper trace with a thickness of 30 microns, conductive segment 34 is a patterned copper trace with a thickness of 30 microns, electrical interconnect 36 is a copper tube with a thickness of 20 microns between its inner and outer sidewalls and dielectric layer 40 is epoxy with a thickness of 110 microns.

Conductive pattern 38 is provided by conductive segments 32 and 34 and electrical interconnect 36. Thus, conductive pattern 38 is a part of substrate 30. Similarly, an electrically conductive path between conductive segments 32 and 34 is electrical interconnect 36.

Conductive pattern 38 can be manufactured by providing first and second unpatterned copper sheets on opposite sides of dielectric layer 40, then drilling a hole through the copper sheets and dielectric layer 40, then forming electrical interconnect 36 in the hole using plating, then providing a first etch mask above the first copper sheet that defines conductive segment 32 and a second etch mask below the second copper sheet that defines conductive segment 34, then applying a wet chemical etch that etches through the copper sheets in the patterns defined by the etch masks and then removing the etch masks, as is conventional.

FIGS. 3B, 3C and 3D are cross-sectional, top and bottom views, respectively, of substrate 30 with aperture 30A. Aperture 30A is a window that extends through substrate 30 and has a diameter of 1250 microns. Aperture 30A is formed by mechanical drilling through dielectric layer 40 although other techniques such as laser drilling, punching and stamping can be used.

Substrate 30 is illustrated as a laminated structure. Substrate 30 can be other electrical interconnects such as a ceramic board or a printed circuit board. Likewise, substrate 30 can include additional layers of embedded circuitry.

Electrical interconnect 36 is shown as a post rather than a hollow tube in FIGS. 3A and 3B and is shown in phantom in FIGS. 3C and 3D for convenience of illustration.

Figure 4A:
FIGS. 4A and 4B are cross-sectional views showing a method of making a first adhesive in accordance with an embodiment of the present invention.
Figure 4B:
Figure 4C:
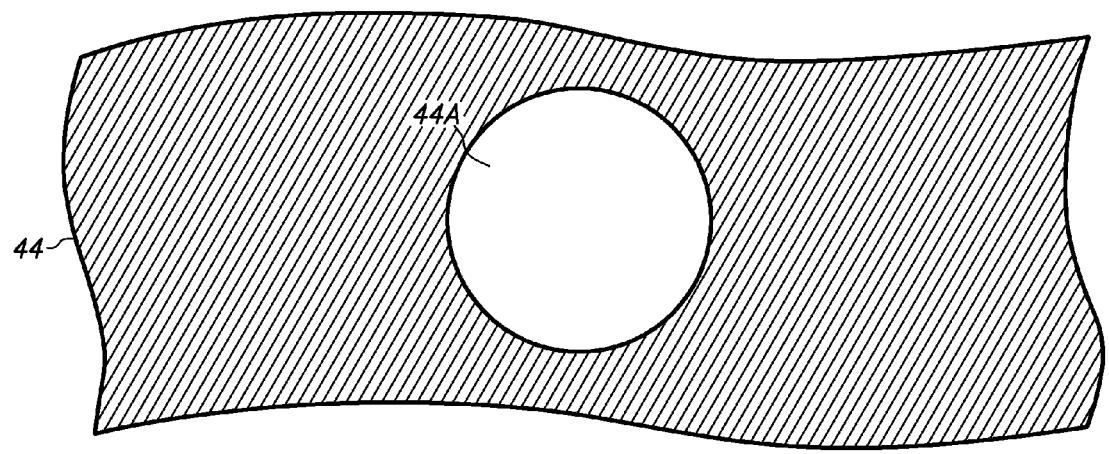
FIGS. 4C and 4D are top and bottom views, respectively, corresponding to FIG. 4B.
Figure 4D:
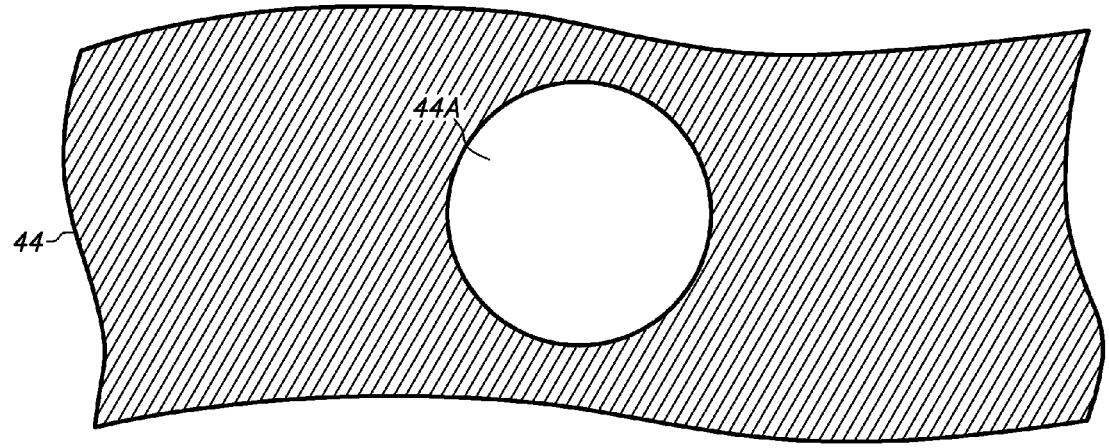

FIGS. 4A and 4B are cross-sectional views showing a method of making a first adhesive in accordance with an embodiment of the present invention, and FIGS. 4C and 4D are top and bottom views, respectively, corresponding to FIG. 4B.

FIG. 4A is a cross-sectional view of adhesive 44. Adhesive 44 is illustrated as a prepreg with B-stage uncured epoxy provided as a non-solidified unpatterned sheet with a thickness of 100 microns.

Adhesive 44 can be various dielectric films or prepregs formed from numerous organic or inorganic electrical insulators. For instance, adhesive 44 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD prepreg by W.L. Gore & Associates of Eau Claire, Wis. are suitable.

FIGS. 4B, 4C and 4D are cross-sectional, top and bottom views, respectively, of adhesive 44 with opening 44A. Opening 44A is a window that extends through adhesive 44 and has a diameter of 1250 microns. Opening 44A is formed by mechanical drilling through the prepreg although other techniques such as punching and stamping can be used.

Figure 5A:
FIGS. 5A and 5B are cross-sectional views showing a method of making a second adhesive in accordance with an embodiment of the present invention.
Figure 5B:
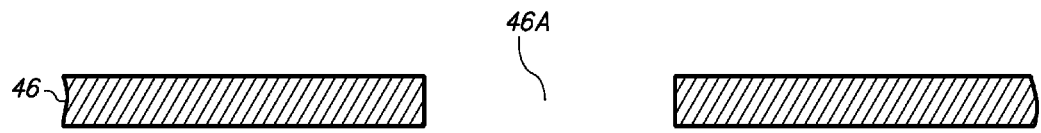
Figure 5C:
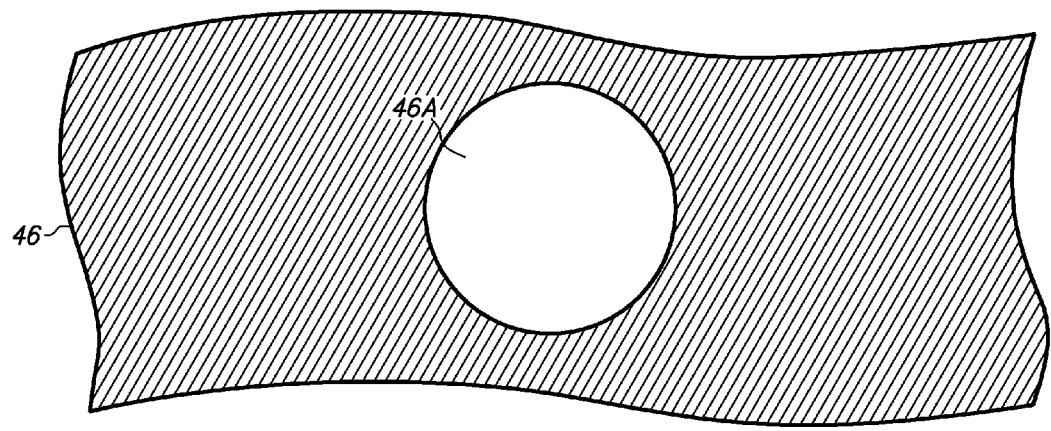
FIGS. 5C and 5D are top and bottom views, respectively, corresponding to FIG. 5B.
Figure 5D:
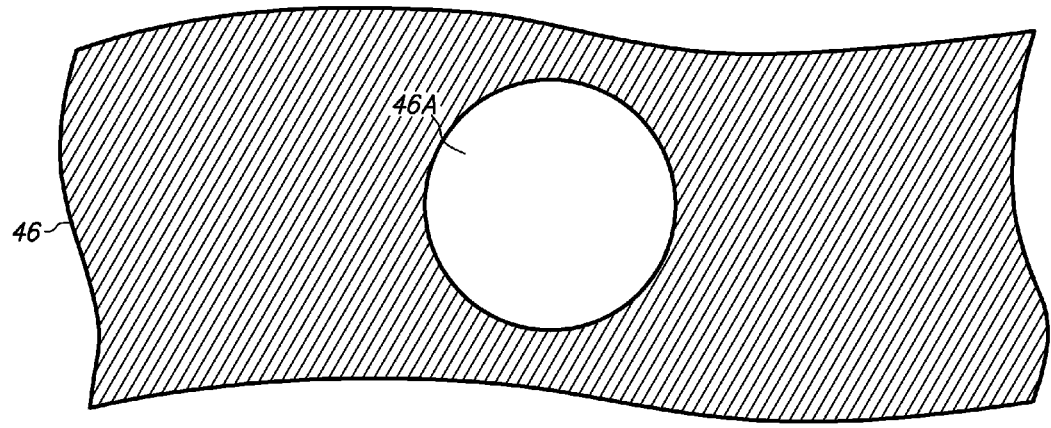

FIGS. 5A and 5B are cross-sectional views showing a method of making a second adhesive in accordance with an embodiment of the present invention, and FIGS. 5C and 5D are top and bottom views, respectively, corresponding to FIG. 5B.

FIG. 5A is a cross-sectional view of adhesive 46. Adhesive 46 is illustrated as a prepreg with B-stage uncured epoxy provided as a non-solidified unpatterned sheet with a thickness of 100 microns that is identical to adhesive 44.

FIGS. 5B, 5C and 5D are cross-sectional, top and bottom views, respectively, of adhesive 46 with opening 46A. Opening 46A is a window that extends through adhesive 46 and has a diameter of 1250 microns. Opening 46A is formed by mechanical drilling through the prepreg although other techniques such as punching and stamping can be used.

Adhesives 44 and 46 are identical prepregs. Furthermore, hole 26A, aperture 30A and openings 44A and 46A have the same diameter and can be formed in the same manner with the same drill bit at the same drilling station.

Figure 6A:
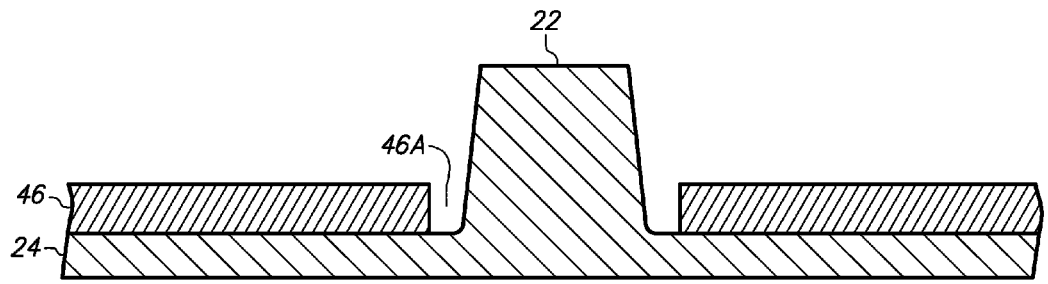
FIGS. 6A-6O are cross-sectional views showing a method of making a thermal board with a four-level conductive trace in accordance with an embodiment of the present invention.
Figure 6B:
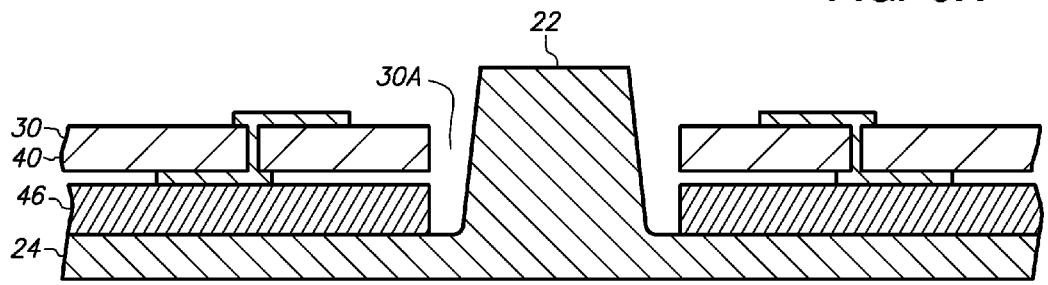
FIGS. 6P and 6Q are top and bottom views, respectively, corresponding to FIG. 6O.
Figure 6C:
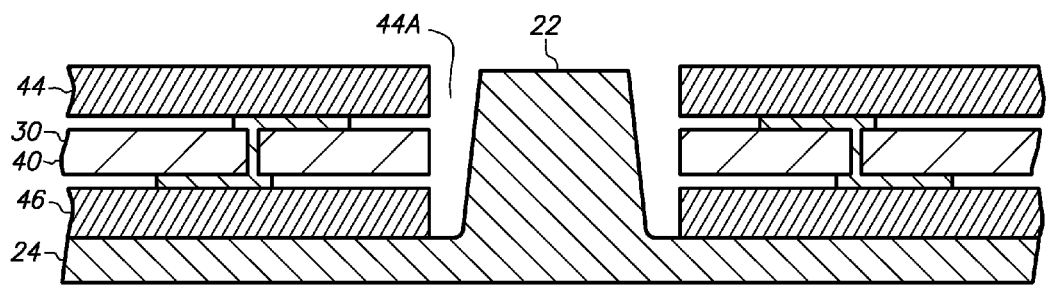
Figure 6D:
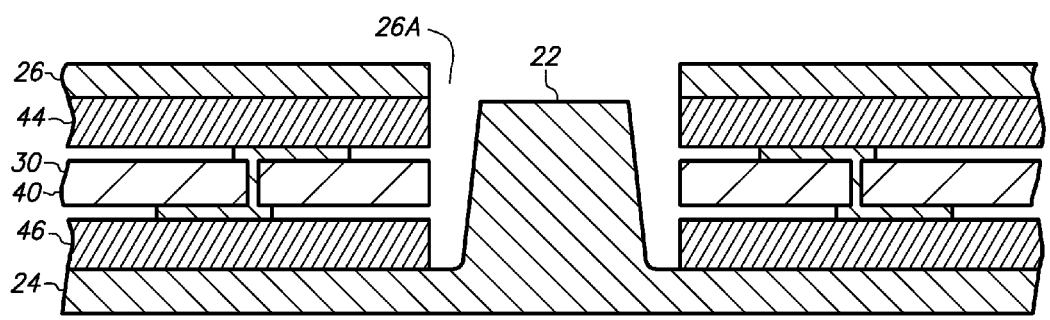
Figure 6E:
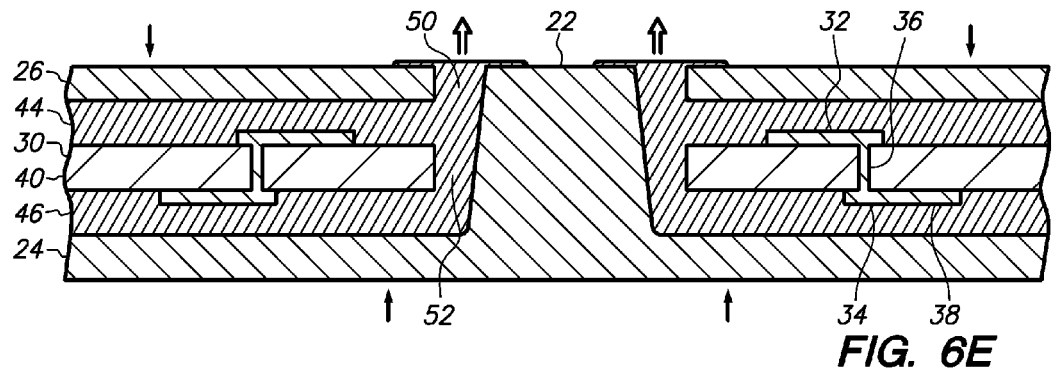
Figure 6F:
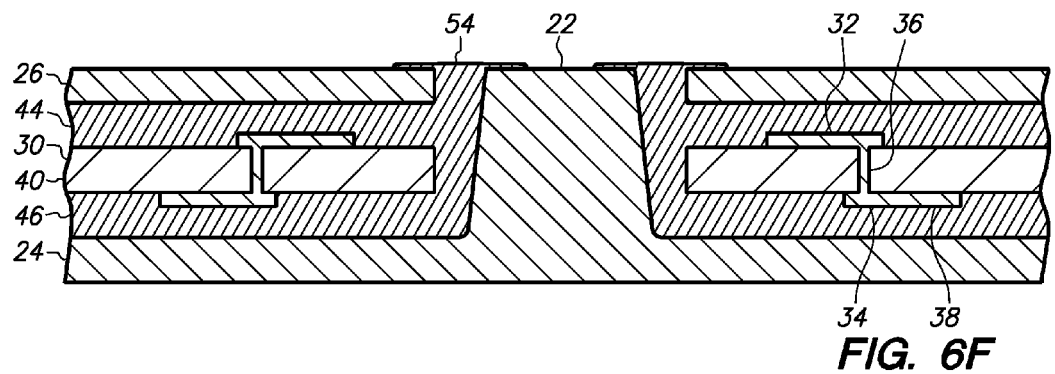
Figure 6G:
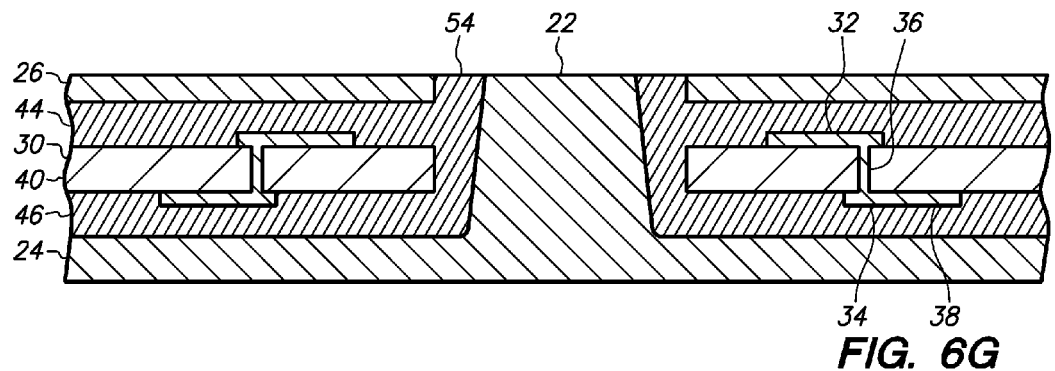
Figure 6H:
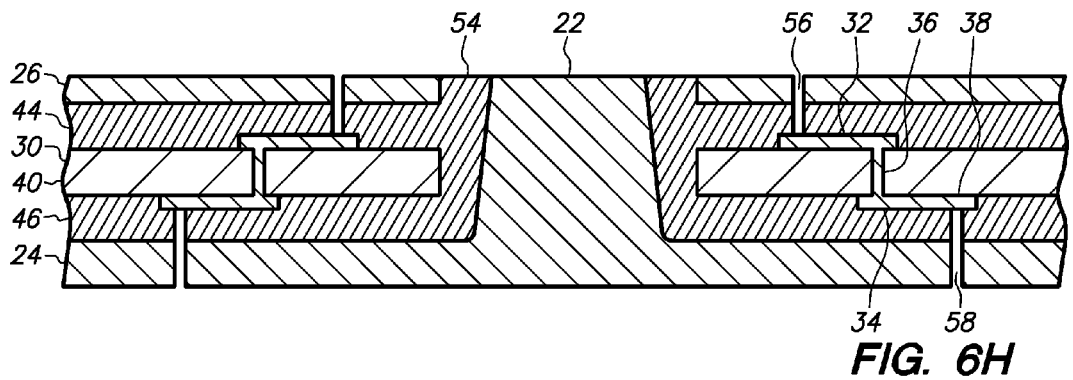
Figure 6I:
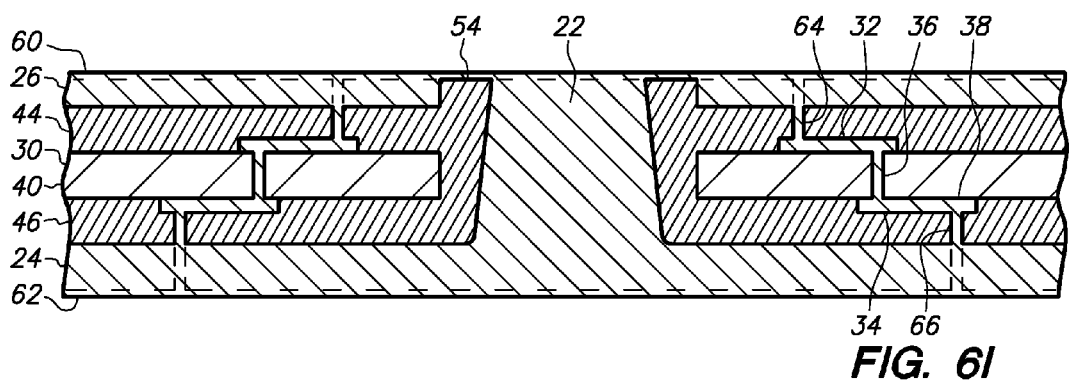
Figure 6J:
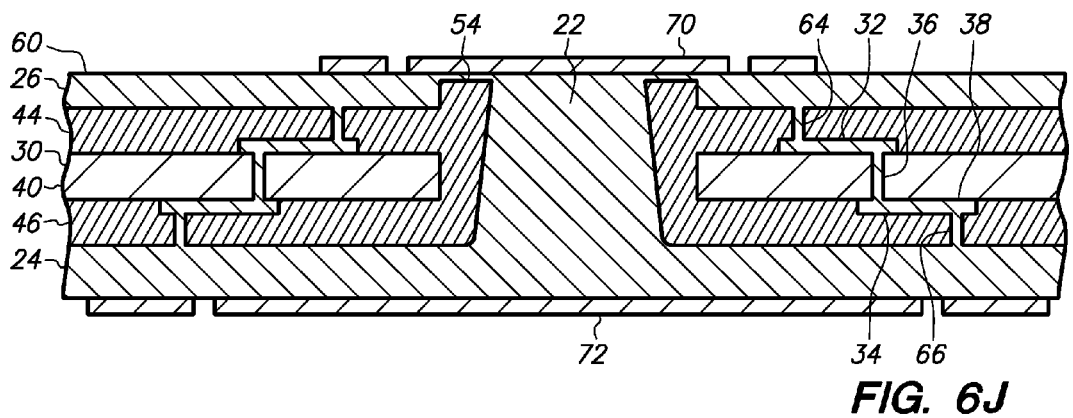
Figure 6K:
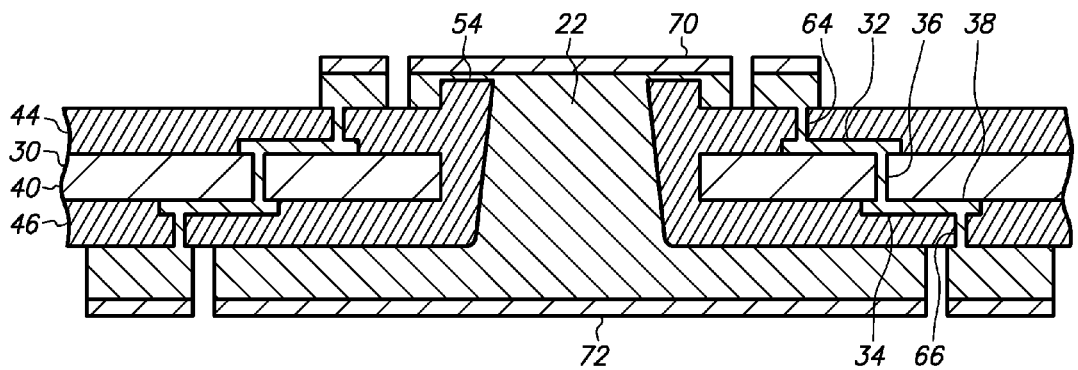
Figure 6L:
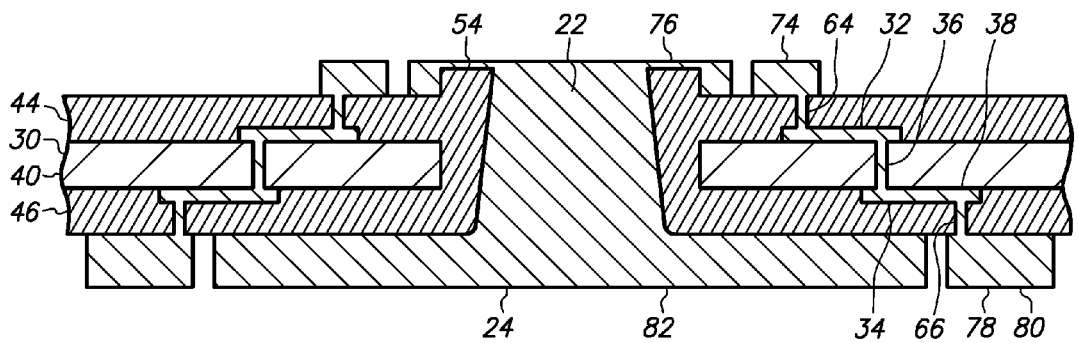
Figure 6M:
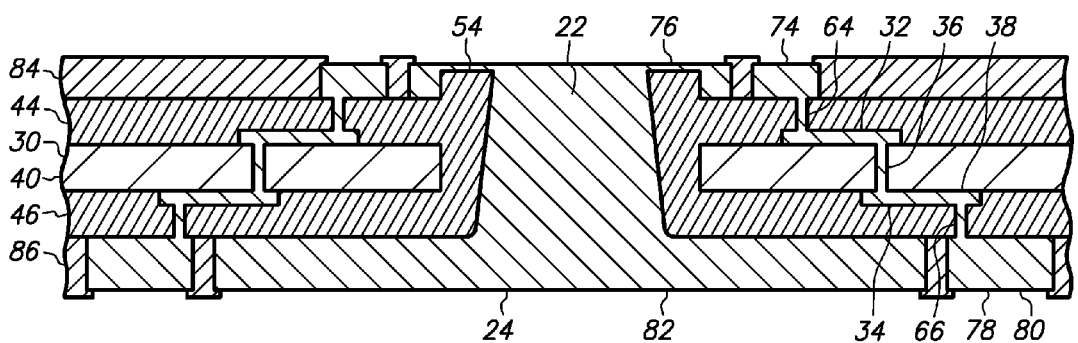
Figure 6N:
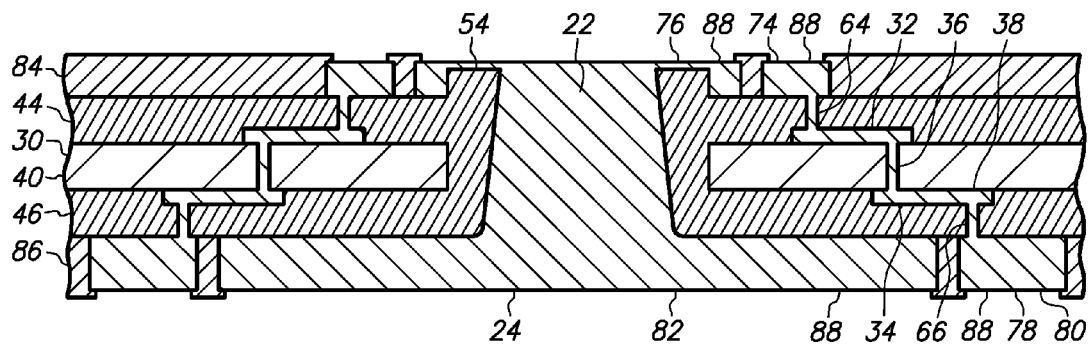
Figure 6O:
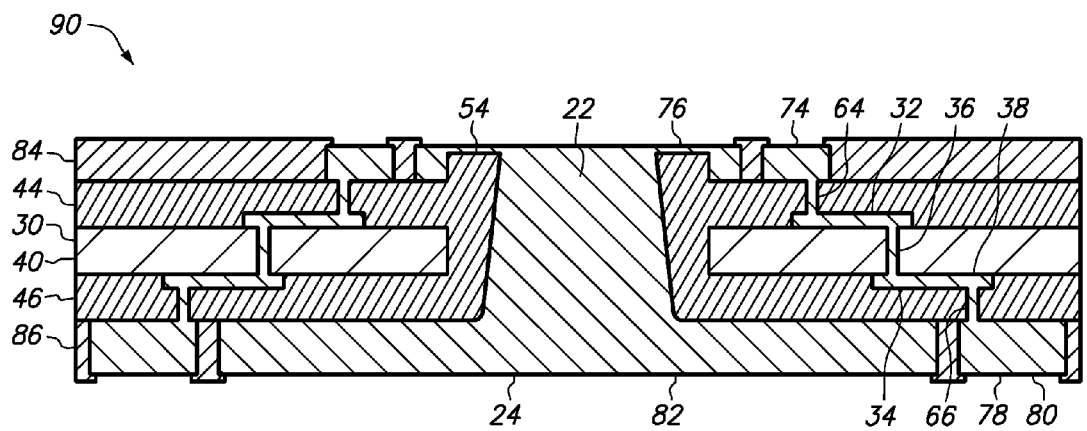
Figure 6P:
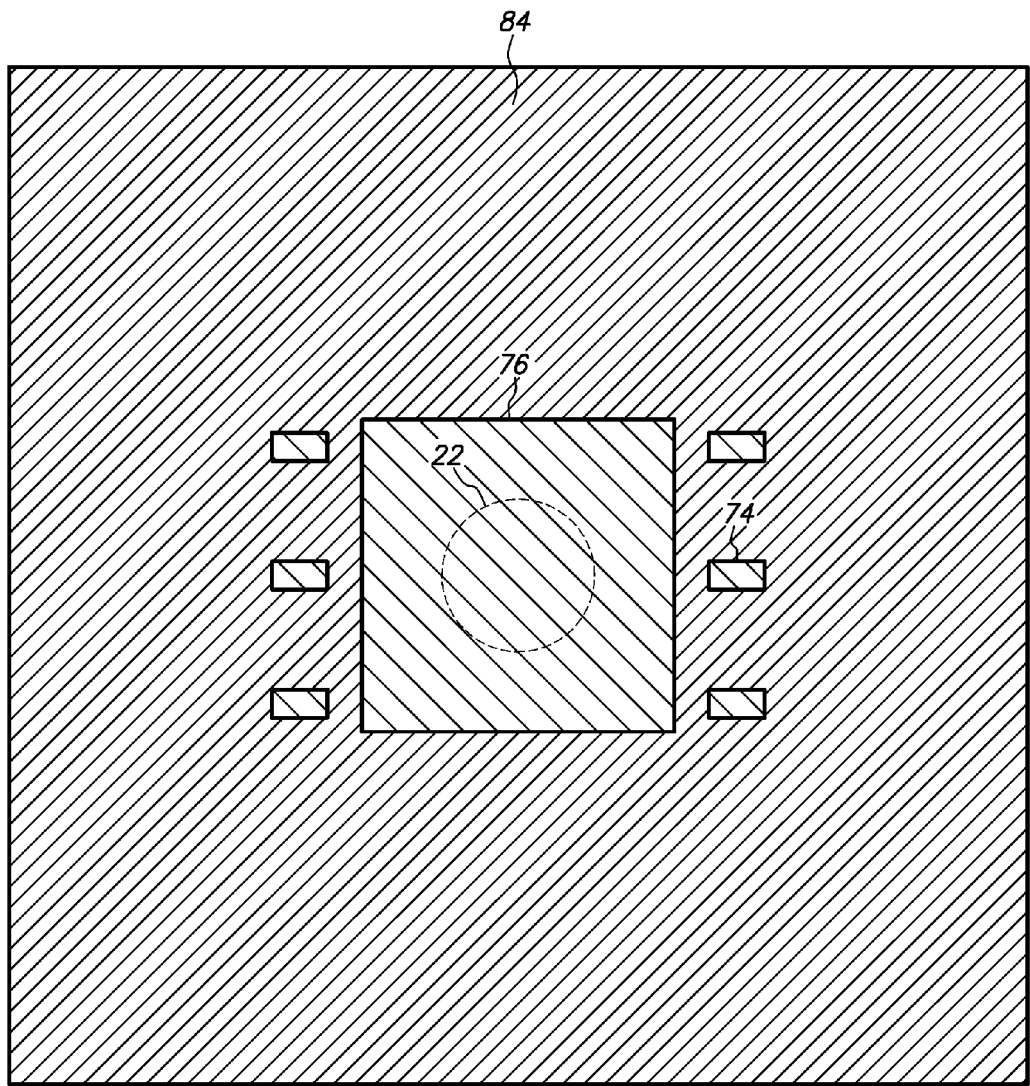
Figure 6Q:
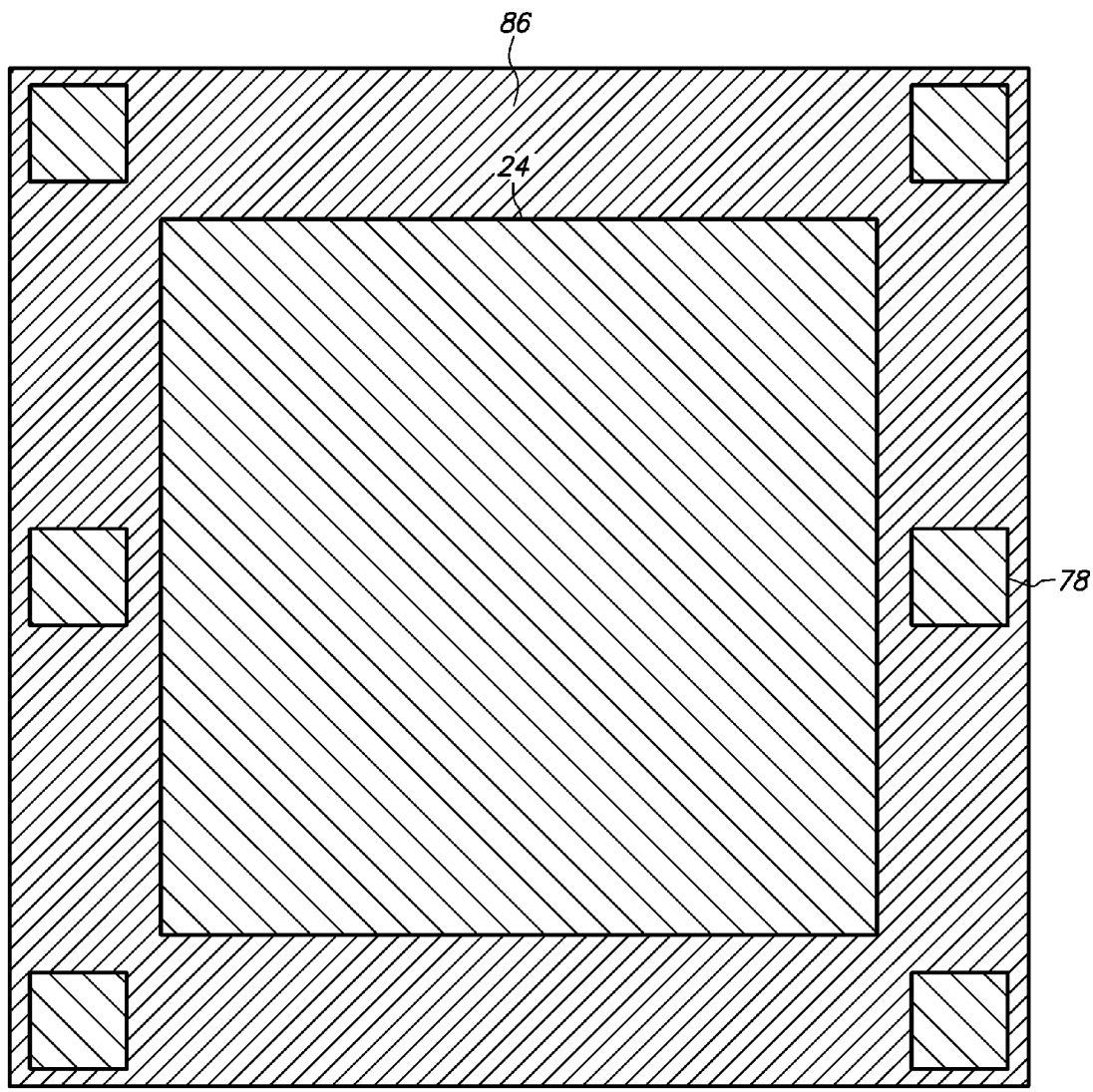

FIGS. 6A-6O are cross-sectional views showing a method of making a thermal board that includes post 22, base 24, conductive layer 26, substrate 30 and adhesives 44 and 46 and provides a four-level conductive trace in accordance with an embodiment of the present invention, and FIGS. 6P and 6Q are top and bottom views, respectively, corresponding to FIG. 6O.

FIG. 6A is a cross-sectional view of the structure with adhesive 46 mounted on base 24. Adhesive 46 is mounted by lowering it onto base 24 as post 22 is inserted into and through and upwards in opening 46A. Adhesive 46 eventually contacts and rests on base 24. Post 22 is inserted into and extends through opening 46A without contacting adhesive 46 and is aligned with and centrally located within opening 46A.

FIG. 6B is a cross-sectional view of the structure with substrate 30 mounted on adhesive 46. Substrate 30 is mounted by lowering it onto adhesive 46 as post 22 is inserted into and through and upwards in aperture 30A. Substrate 30 eventually contacts and rests on adhesive 46.

Post 22 is inserted into and extends through aperture 30A without contacting substrate 30 and is aligned with and centrally located within aperture 30A. In addition, aperture 30A and opening 46A are precisely aligned with one another and have the same diameter.

FIG. 6C is a cross-sectional view of the structure with adhesive 44 mounted on substrate 30. Adhesive 44 is mounted by lowering it onto substrate 30 as post 22 is inserted into and upwards in opening 44A. Adhesive 44 eventually contacts and rests on substrate 30. Post 22 is inserted into and extends into but not through opening 44A without contacting adhesive 44 and is aligned with and centrally located within opening 44A. In addition, aperture 30A and opening 44A are precisely aligned with one another and have the same diameter.

FIG. 6D is a cross-sectional view of the structure with conductive layer 26 mounted on adhesive 44. Conductive layer 26 is mounted by lowering it onto adhesive 44 as post 22 is aligned with but located beneath and spaced from hole 26A. Conductive layer 26 eventually contacts and rests on adhesive 44. In addition, hole 26A and opening 44A are precisely aligned with one another and have the same diameter.

At this stage, conductive layer 26 is mounted on and contacts and extends above adhesive 44, adhesive 44 is mounted on and contacts and extends above substrate 30, substrate 30 is mounted on and contacts and extends above adhesive 46 and adhesive 46 is mounted on and contacts and extends above base 24. Thus, adhesive 44 contacts and is sandwiched between conductive layer 26 and substrate 30 and is spaced from base 24 and adhesive 46, substrate 30 contacts and is sandwiched between adhesives 44 and 46 and is spaced from base 24 and conductive layer 26 and adhesive 46 contacts and is sandwiched between base 24 and substrate 30 and is spaced from conductive layer 26 and adhesive 44.

Conductive segment 32 contacts and is attached to and extends above dielectric layer 40, conductive segment 34 contacts and is attached to and extends below dielectric layer 40 and dielectric layer 40 contacts and is sandwiched between conductive segments 32 and 34 and is solidified.

Post 22 extends through opening 46A and aperture 30A to opening 44A, is spaced from hole 26A, is 100 microns below the top surface of conductive layer 26 and is exposed through hole 26A and opening 44A in the upward direction. Post 22 remains adjacent to and integral with base 24 and spaced from conductive layer 26, substrate 30 and adhesives 44 and 46. Adhesive 44 remains a non-solidified prepreg with B-stage uncured epoxy and adhesive 46 remains a non-solidified prepreg with B-stage uncured epoxy.

FIG. 6E is a cross-sectional view of the structure with adhesives 44 and 46 flowed into contact with post 22 and one another.

Gap 50 is located in hole 26A between post 22 and conductive layer 26 and gap 52 is located in aperture 30A between post 22 and substrate 30. Gap 50 laterally surrounds post 22 and is laterally surrounded by conductive layer 26 and gap 52 laterally surrounds post 22 and is laterally surrounded by substrate 30.

Adhesive 44 is flowed into gap 50 and adhesive 46 is flowed into gap 52 by applying heat and pressure. In this illustration, adhesive 44 is forced into gap 50 and adhesive 46 is forced into gap 52 by applying downward pressure to conductive layer 26 and/or upward pressure to base 24, thereby moving base 24 and conductive layer 26 towards one another and applying pressure to adhesives 44 and 46 while simultaneously applying heat to adhesives 44 and 46. Adhesives 44 and 46 become compliant enough under the heat and pressure to conform to virtually any shape. As a result, adhesive 44 sandwiched between conductive layer 26 and substrate 30 is compressed, forced out of its original shape and flows into and upward in gap 50. Likewise, adhesive 46 sandwiched between base 24 and substrate 30 is compressed, forced out of its original shape and flows into and upward in gap 52. Base 24 and conductive layer 26 continue to move towards one another and adhesives 44 and 46 contact and merge with one another and collectively fill gaps 50 and 52. Moreover, adhesive 44 remains sandwiched between and continues to fill the reduced space between conductive layer 26 and substrate 30 and adhesive 46 remains sandwiched between and continues to fill the reduced space between base 24 and substrate 30.

For instance, base 24 and conductive layer 26 can be disposed between top and bottom platens (not shown) of a press. In addition, a top cull plate and top buffer paper (not shown) can be sandwiched between conductive layer 26 and the top platen, and a bottom cull plate and bottom buffer paper (not shown) can be sandwiched between base 24 and the bottom platen. The stack includes the top platen, top cull plate, top buffer paper, conductive layer 26, adhesive 44, substrate 30, adhesive 46, base 24, bottom buffer paper, bottom cull plate and bottom platen in descending order. Furthermore, the stack may be positioned on the bottom platen by tooling pins (not shown) that extend upward from the bottom platen through registration holes (not shown) in metal plate 10.

The platens are heated and move towards one another, thereby applying heat and pressure to adhesives 44 and 46. The cull plates disperse the heat from the platens so that it is more uniformly applied to base 24 and conductive layer 26 and thus adhesives 44 and 46, and the buffer papers disperse the pressure from the platens so that it is more uniformly applied to base 24 and conductive layer 26 and thus adhesives 44 and 46. Initially, conductive segment 32 tunnels into and becomes embedded in adhesive 44 and conductive segment 34 tunnels into and becomes embedded in adhesive 46. As this occurs, dielectric layer 40 contacts and presses up on adhesive 44 and contacts and presses down on adhesive 46.

As the platen motion and heat continue, adhesive 44 between conductive layer 26 and substrate 30 is compressed, melted and flows into and upward in gap 50 and adhesive 46 between base 24 and substrate 30 is compressed, melted and flows into and upward in gap 52. For instance, in adhesive 44 the uncured epoxy is melted by the heat and the molten uncured epoxy is squeezed by the pressure into gap 50, however the reinforcement and the filler remain between conductive layer 26 and substrate 30. Likewise, in adhesive 46 the uncured epoxy is melted by the heat and the molten uncured epoxy is squeezed by the pressure into gap 52, however the reinforcement and the filler remain between base 24 and substrate 30.

Adhesive 44 elevates more rapidly than post 22 in hole 26A, rises slightly above gap 50 and overflows onto the top surfaces of post 22 and conductive layer 26 adjacent to gap 50 before the platen motion stops. This may occur due to the prepreg being slightly thicker than necessary. As a result, adhesive 44 creates a thin coating on the top surfaces of post 22 and conductive layer 26. The platen motion is eventually blocked by post 22 and the platens become stationary but continue to apply heat to adhesives 44 and 46.

The upward flow of adhesive 44 in gap 50 is shown by the thick upward arrows, the upward motion of post 22 and base 24 relative to conductive layer 26 and substrate 30 is shown by the thin upward arrows, and the downward motion of conductive layer 26 relative to post 22, base 24 and substrate 30 is shown by the thin downward arrows.

The flow dynamics of adhesives 44 and 46 are influenced by several factors such as the upward velocity of post 22 in hole 26A and aperture 30A, viscosity and thickness of adhesives 44 and 46, height and diameter of hole 26A and aperture 30A, width of gaps 50 and 52, amount and duration of heat and pressure applied and gravitational assistance. For instance, adhesive 44 may flow downward in gap 52 and initially contact adhesive 46 in gap 52 and then combine with adhesive 46 to fill gap 52. Furthermore, adhesive 44 may fill gap 50 or adhesive 46 may flow upward through gap 52 into gap 50 and combine with adhesive 44 to fill gap 50. In any case, moving base 24 and conductive layer 26 towards one another forces adhesives 44 and 46 to flow into gaps 50 and 52, respectively.

FIG. 6F is a cross-sectional view of the structure with adhesives 44 and 46 solidified.

For instance, the platens continue to clamp post 22 and base 24 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesives 44 and 46 as solidified and in contact with one another combine to form a single unitary adhesive 54. The boundary between adhesives 44 and 46 may be difficult or impossible to detect since they are the same dielectric material. However, the boundary between adhesive 54 and post 22, base 24, conductive layer 26 and substrate 30 is clear.

Adhesive 54 provides a secure robust mechanical bond between post 22 and conductive layer 26, between post 22 and substrate 30, between base 24 and substrate 30 and between conductive layer 26 and substrate 30. Adhesive 54 can withstand normal operating pressure without distortion or damage and is only temporarily distorted under unusually high pressure. Furthermore, adhesive 54 can absorb thermal expansion mismatch between post 22 and substrate 30 and between base 24 and substrate 30.

At this stage, post 22 and conductive layer 26 are essentially coplanar with one another and conductive layer 26 and adhesive 54 extend to a top surface that faces in the upward direction. For instance, adhesive 44 between conductive layer 26 and dielectric layer 40 has a thickness of 80 microns which is 20 microns less than its initial thickness of 100 microns and adhesive 46 between base 24 and dielectric layer 40 has a thickness of 80 microns which is 20 microns less than its initial thickness of 100 microns. Likewise, adhesive 44 between conductive layer 26 and conductive segment 32 has a thickness of 50 microns and adhesive 46 between base 24 and conductive segment 34 has a thickness of 50 microns.

Post 22 ascends 100 microns (30+30+20+20) relative to conductive layer 26 due to conductive segments 32 and 34 tunneling into adhesives 44 and 46, respectively, and adhesives 44 and 46 compressing at dielectric layer 40. The 350 micron height of post 22 is essentially the same as the combined height of conductive layer 26 (80 microns), dielectric layer 40 (110 microns), adhesive 44 (80 microns) and adhesive 46 (80 microns). Post 22 is centrally located in hole 26A, aperture 30A and openings 44A and 46A and remains spaced from conductive layer 26 and substrate 30. Adhesive 54 fills the space between post 22 and conductive layer 26, between post 22 and substrate 30, between base 24 and substrate 30 and between conductive layer 26 and substrate 30 and fills gaps 50 and 52. For instance, gap 50 (as well as adhesive 54 between post 22 and conductive layer 26) has a width of 125 microns ((1250−1000)/2) at the top surface of conductive layer 26.

Adhesive 54 extends across conductive layer 26 in gap 50 and across and dielectric layer 40 in gap 52. That is, adhesive 54 in gap 50 extends in the upward and downward directions across the thickness of conductive layer 26 at the outer sidewall of gap 50 and across the thickness of dielectric layer 40 at the outer sidewall of gap 52. Adhesive 54 also includes a thin top portion above gap 50 that contacts the top surfaces of post 22 and conductive layer 26 and extends above post 22 by 10 microns.

FIG. 6G is a cross-sectional view of the structure after upper portions of post 22, conductive layer 26 and adhesive 54 are removed.

Post 22, conductive layer 26 and adhesive 54 have their upper portions removed by grinding. For instance, a rotating diamond sand wheel and distilled water are applied to the top of the structure. Initially, the diamond sand wheel grinds only adhesive 54. As the grinding continues, adhesive 54 becomes thinner as its grinded surface migrates downwardly. Eventually the diamond sand wheel contacts post 22 and conductive layer 26 (not necessarily at the same time), and as a result, begins to grind post 22 and conductive layer 26 as well. As the grinding continues, post 22, conductive layer 26 and adhesive 54 become thinner as their grinded surfaces migrate downwardly. The grinding continues until the desired thickness has been removed. Thereafter, the structure is rinsed in distilled water to remove contaminants.

The grinding removes a 30 micron thick upper portion of adhesive 54, a 20 micron thick upper portion of post 22 and a 20 micron thick upper portion of conductive layer 26. The decreased thickness does not appreciably affect post 22, conductive layer 26 or adhesive 54.

At this stage, post 22, conductive layer 26 and adhesive 54 are coplanar with one another at a smoothed lapped lateral top surface that is above dielectric layer 40 and faces in the upward direction.

FIG. 6H is a cross-sectional view of the structure with windows 56 and 58. Window 56 extends through conductive layer 26 and adhesive 54 to conductive segment 32 and window 56 extends through base 24 and adhesive 54 to conductive segment 34. Window 56 is located above and selectively exposes conductive segment 32, extends through conductive layer 26 and adhesive 44 to conductive segment 32, is spaced from dielectric layer 40 and adhesive 46 and has a diameter of 60 microns. Likewise, window 58 is located below and selectively exposes conductive segment 34, extends through base 24 and adhesive 46 to conductive segment 34, is spaced from dielectric layer 40 and adhesive 44 and has a diameter of 60 microns.

Windows 56 and 58 are formed by laser drilling although other techniques such as wet chemical etching, mechanical drilling and plasma etching can be used. Windows 56 and 58 may have tapered sidewalls and a diameter which decreases with depth but are shown with vertical sidewalls and a constant diameter for convenience of illustration.

FIG. 6I is a cross-sectional view of the structure with plated layers 60 and 62 and vias 64 and 66.

Plated layer 60 is deposited on and contacts post 22, conductive layer 26 and adhesive 44 at the lateral top surface and covers them in the upward direction. Plated layer 60 is also deposited into window 56 and forms via 64 that contacts conductive segment 32 and adhesive 44 in window 56. Plated layer 60 is an unpatterned copper layer with a thickness of 20 microns.

Plated layer 62 is deposited on and contacts base 24 at the lateral bottom surface and covers it in the downward direction. Plated layer 62 is also deposited into window 58 and forms via 66 that contacts conductive segment 34 and adhesive 46 in window 58. Plated layer 62 is an unpatterned copper layer with a thickness of 20 microns.

Via 64 is a blind via that contacts and electrically connects conductive layer 26 and conductive segment 32, is located above conductive segment 32, extends through conductive layer 26 and adhesive 44 to conductive segment 32, is spaced from dielectric layer 40 and adhesive 46 and has a thickness of 20 microns.

Via 66 is a blind via that contacts and electrically connects base 24 and conductive segment 34, is located below conductive segment 34, extends through base 24 and adhesive 46 to conductive segment 34, is spaced from dielectric layer 40 and adhesive 44 and has a thickness of 20 microns.

For instance, the structure is dipped in an activator solution to render adhesives 44 and 46 catalytic to electroless copper, then a first electroless copper layer is electrolessly plated on post 22, conductive layer 26, conductive segment 32 and adhesive 44 and a second electroless copper layer is electrolessly plated on base 24, conductive segment 34 and adhesive 46 and then a first electroplated copper layer is electroplated on the first electroless copper layer to form plated layer 60 and a second electroplated copper layer is electroplated on the second electroless copper layer to form plated layer 62. The electroless copper layers have a thickness of 2 microns, the electroplated copper layers have a thickness of 18 microns, and plated layers 60 and 62 (and vias 64 and 66) have a thickness of 20 microns. As a result, base 24 essentially grows and has a thickness of 120 microns (100+20) and conductive layer 26 essentially grows and has a thickness of 80 microns (60+20).

Plated layer 60 serves as a cover layer for post 22 and a build-up layer for conductive layer 26 and plated layer 62 serves as a build-up layer for base 24.

Post 22, conductive layer 26, plated layer 60 and via 64 are shown as a single layer for convenience of illustration. Likewise, base 24, plated layer 62 and via 66 are shown as a single layer for convenience of illustration. The boundary (shown in phantom) between post 22 and plated layer 60, between conductive layer 26 and plated layer 60, between conductive layer 26 and via 64, between conductive segment 32 and via 64, between base 24 and plated layer 62, between base 24 and via 66 and between conductive segment 34 and via 66 may be difficult or impossible to detect since copper is plated on copper. However, the boundary between adhesive 44 and plated layer 60 and between adhesive 46 and plated layer 62 is clear. Moreover, vias 64 and 66 are shown as cylinders that fill windows 56 and 58 rather than as bowl-like and inverted bowl-like structures, respectively, for convenience of illustration.

FIG. 6J is a cross-sectional view of the structure with etch masks 70 and 72 formed on plated layers 60 and 62, respectively. Etch masks 70 and 72 are illustrated as photoresist layers similar to photoresist layer 16. Photoresist layer 70 has a pattern that selectively exposes plated layer 60, and photoresist layer 72 has a pattern that selectively exposes plated layer 62.

FIG. 6K is a cross-sectional view of the structure with selected portions of conductive layer 26 and plated layer 60 removed by etching conductive layer 26 and plated layer 60 in the pattern defined by etch mask 70, and selected portions of base 24 and plated layer 62 removed by etching base 24 and plated layer 62 in the pattern defined by etch mask 72. The etching is a frontside and backside wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layer 26 and plated layer 60 to expose adhesive 44 in the upward direction without exposing substrate 30 and adhesive 46 in the upward direction and converts conductive layer 26 and plated layer 60 from unpatterned into patterned layers. The wet chemical etch also etches through base 24 and plated layer 62 to expose adhesive 46 in the downward direction without exposing substrate 30 and adhesive 44 in the downward direction.

FIG. 6L is a cross-sectional view of the structure after etch masks 70 and 72 are removed. Photoresist layers 70 and 72 can be stripped in the same manner as photoresist layers 16 and 18.

Conductive layer 26 and plated layer 60 as etched include pad 74 and cap 76. Pad 74 and cap 76 are unetched portions of conductive layer 26 and plated layer 60 defined by etch mask 70. Thus, conductive layer 26 and plated layer 60 are a patterned layer that includes pad 74 and cap 76. Pad 74 is an unetched portion of conductive layer 26 and plated layer 60 defined by etch mask 70 that is adjacent to and extends laterally from and is electrically connected to via 64, and cap 76 is an unetched portion of conductive layer 26 and plated layer 60 defined by etch mask 70 that extends above and is adjacent to and covers in the upward direction and extends laterally from and is thermally connected to post 22. Pad 74 has a thickness of 80 microns (60+20) and cap 76 has a thickness of 20 microns where it is adjacent to post 22 and where it overlaps aperture 30A and a thickness of 80 microns (60+20) where it includes conductive layer 26. Thus, pad 74 and cap 76 contact and extend above adhesive 44, have the same thickness where they overlap dielectric layer 40 and are closest to one another, have different thickness where cap 76 is adjacent to post 22 and are spaced from and coplanar with one another.

Base 24 and plated layer 62 as etched include base 24, reduced to its central portion and enlarged by plated layer 62 in the downward direction, and terminal 78. Base 24 is an unetched portion of base 24 and plated layer 62 defined by etch mask 72 that is adjacent to and extends laterally beyond post 22 by 1000 microns. Terminal 78 is an unetched portion of base 24 and plated layer 62 defined by etch mask 72 that is adjacent to and extends laterally from and is electrically connected to via 66. Thus, terminal 78 is spaced and separated from and no longer a part of base 24. Furthermore, base 24 and terminal 78 contact and extend below adhesive 46, have a thickness of 120 microns (100+20) and are spaced from and coplanar with one another.

Conductive trace 80 is provided by conductive pattern 38, vias 64 and 66, pad 74 and terminal 78. Similarly, an electrically conductive path between pad 74 and terminal 78 is conductive pattern 38 and vias 64 and 66, an electrically conductive path between pad 74 and conductive pattern 38 is via 64 and an electrically conductive path between terminal 78 and conductive pattern 38 is via 66.

Conductive trace 80 is a four-level electrical conductor with pad 74 at the first level, conductive segment 32 at the second level, conductive segment 34 at the third level and terminal 78 at the fourth level. Furthermore, via 64 provides a first-to-second level interconnect, electrical interconnect 36 provides a second-to-third level interconnect and via 66 provides a third-to-fourth level interconnect.

Heat spreader 82 is provided by post 22, base 24 and cap 76. Post 22 and base 24 are integral with one another and cap 76 extends above and is adjacent to and covers in the upward direction and extends laterally in the lateral directions from the top of post 22. Cap 76 is positioned so that post 22 is centrally located within its periphery.

Heat spreader 82 is essentially a heat slug with an I-like shape that includes a pedestal (post 22), upper wings that extend laterally from the pedestal (cap 76) and lower wings that extend laterally from the pedestal (base 24).

FIG. 6M is a cross-sectional view of the structure with solder masks formed on the structure.

Solder mask 84 is an electrically insulative layer that selectively exposes pad 74 and cap 76 in the upward direction and covers adhesive 44 where it is otherwise exposed in the upward direction, and solder mask 86 is an electrically insulative layer that selectively exposes base 24 and terminal 78 in the downward direction and covers adhesive 46 where it is otherwise exposed in the downward direction.

Solder masks 84 and 86 are initially a photoimageable liquid resin that is dispensed on the top and bottom surfaces, respectively. Thereafter, solder masks 84 and 86 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

FIG. 6N is a cross-sectional view of the structure with plated contacts 88 formed on conductive trace 80 and heat spreader 82.

Plated contacts 88 are thin spot plated metal coatings that contact the exposed copper surfaces. Thus, plated contacts 88 contact pad 74 and cap 76 and cover the exposed portions in the upward direction and contact base 24 and terminal 78 and cover the exposed portions in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 88 have a thickness of 3.5 microns.

Base 24, pad 74, cap 76 and terminal 78 treated with plated contacts 88 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 88 also protect conductive trace 80 and heat spreader 82 from corrosion. Plated contacts 88 can include a wide variety of metals to accommodate the external connection media. For instance, a gold surface layer can be plated on a buried nickel layer or a nickel surface layer alone can be employed.

Conductive trace 80 and heat spreader 82 treated with plated contacts 88 are shown as single layers for convenience of illustration. The boundary (not shown) in base 24, pad 74, cap 76 and terminal 78 with plated contacts 88 occurs at the copper/nickel interface.

At this stage, the manufacture of thermal board 90 can be considered complete.

FIGS. 6O, 6P and 6Q are cross-sectional, top and bottom views, respectively, of thermal board 90 after it is detached at peripheral edges along cut lines from a support frame and/or adjacent thermal boards in a batch.

Thermal board 90 includes substrate 30, adhesive 54, conductive trace 80, heat spreader 82 and solder masks 84 and 86. Substrate 30 includes conductive pattern 38 and dielectric layer 40. Conductive pattern 38 includes conductive segments 32 and 34 and electrical interconnect 36. Adhesive 54 includes adhesives 44 and 46. Conductive trace 80 includes conductive pattern 38, vias 64 and 66, pad 74 and terminal 78. Heat spreader 82 includes post 22, base 24 and cap 76.

Post 22 extends into and remains centrally located within aperture 30A and openings 44A and 46A, extends through aperture 30A and extends above and below substrate 30. Post 22 retains its cut-off conical shape with tapered sidewalls in which its diameter decreases as it extends upwardly from base 24 to its flat circular top adjacent to cap 76.

Base 24 covers post 22 in the downward direction and is spaced from the peripheral edges of thermal board 90.

Adhesive 54 is mounted on and extends above base 24 and terminal 78, extends across dielectric layer 40 in gap 52 and fills the space between post 22 and dielectric layer 40. Adhesive 54 also contacts and is sandwiched between post 22 and conductive segment 32, between post 22 and conductive segment 34, between post 22 and dielectric layer 40, between post 22 and via 64, between post 22 and via 66, between post 22 and pad 74, between base 24 and dielectric layer 40, between base 24 and cap 76, between dielectric layer 40 and pad 74, between dielectric layer 40 and cap 76 and between dielectric layer 40 and terminal 78. Adhesive 54 also extends laterally from post 22 beyond and overlaps terminal 78, covers base 24 outside the periphery of post 22 in the upward direction, covers cap 76 outside the periphery of post 22 in the downward direction, covers and surrounds post 22 in the lateral directions, overlaps and is overlapped by substrate 30, fills most of the space between substrate 30 and heat spreader 82 and is solidified.

Adhesive 54 alone can intersect an imaginary horizontal line between post 22 and conductive segment 32, an imaginary horizontal line between post 22 and conductive segment 34, an imaginary horizontal line between post 22 and dielectric layer 40, an imaginary horizontal line between post 22 and via 64 and an imaginary horizontal line between post 22 and via 66. Adhesive 54 alone can also intersect an imaginary vertical line between base 24 and dielectric layer 40, an imaginary vertical line between base 24 and cap 76, an imaginary vertical line between dielectric layer 40 and pad 74, an imaginary vertical line between dielectric layer 40 and cap 76 and an imaginary vertical line between dielectric layer 40 and terminal 78. Thus, an imaginary horizontal line exists that intersects only adhesive 54 as the line extends from post 22 to dielectric layer 40, an imaginary vertical line exists that intersects only adhesive 54 as the line extends from base 24 to dielectric layer 40 and so on.

Substrate 30 is mounted on and extends above adhesive 46, is located above and spaced from base 24 and terminal 78, supports and extends below adhesive 44 and is located below and spaced from pad 74 and cap 76. Conductive segment 32 contacts and is located above dielectric layer 40, conductive segment 34 contacts and is located below dielectric layer 40 and electrical interconnect 36 contacts and extends through dielectric layer 40 and electrically connects conductive segments 32 and 34. Furthermore, dielectric layer 40 contacts and is sandwiched between conductive segments 32 and 34 and between adhesives 44 and 46.

Via 64 is located above conductive segment 32, extends through adhesive 44 to conductive segment 32, is spaced from dielectric layer 40 and adhesive 46 and electrically connects conductive segment 32 and pad 74. Via 66 is located below conductive segment 34, extends through adhesive 46 to conductive segment 34, is spaced from dielectric layer 40 and adhesive 44 and electrically connects conductive segment 34 and terminal 78.

Pad 74 and cap 76 contact and extend above adhesive 44, are located above and spaced from substrate 30 and adhesive 46 and are spaced from one another. Base 24 and terminal 78 contact and extend below adhesive 46, are located below and spaced from substrate 30 and adhesive 44 and are spaced from one another.

Post 22 is coplanar with adhesive 54 at their tops at cap 76 and at their bottoms at base 24. Pad 74 and cap 76 have the same thickness where they are closest to one another, have different thickness where cap 76 is adjacent to post 22 and are coplanar with one another above adhesive 44 at a top surface that faces in the upward direction. Base 24 and terminal 78 have the same thickness and are coplanar with one another below adhesive 46 at a bottom surface that faces in the downward direction.

Dielectric layer 40, adhesives 44 and 46 and solder masks 84 and 86 extend to straight vertical peripheral edges of thermal board 90 after it is detached or singulated from a batch of identical simultaneously manufactured thermal boards.

Pad 74 is customized as an electrical interface for a semiconductor device such as an LED chip that is subsequently mounted on cap 76, terminal 78 is customized as an electrical interface for the next level assembly such as a solderable electrical contact from a printed circuit board, cap 76 is customized as a thermal interface for the semiconductor device, and base 24 is customized as a thermal interface for the next level assembly such as the printed circuit board or a heat sink for an electronic device.

Pad 74 and terminal 78 are horizontally and vertically offset from one another and exposed at the top and bottom surfaces, respectively, of thermal board 90, thereby providing horizontal and vertical signal routing between the semiconductor device and the next level assembly.

Conductive trace 80 provides horizontal (fan-out) routing by conductive segments 32 and 34 and vertical (top to bottom) routing by electrical interconnect 36 and vias 64 and 66. Conductive trace 80 is not limited to this configuration. For instance, pad 74 can be electrically connected to via 64 by a routing line above adhesive 44 as defined by etch mask 70, and terminal 78 can be electrically connected to via 46 by a routing line below adhesive 46 as defined by etch mask 72. Pad 74 can be electrically connected to terminal 78 by separate conductive patterns 38 and/or vias 64 and 66 in separate electrically conductive paths. Furthermore, the electrically conductive path can include passive components such as resistors and capacitors mounted on additional pads.

Conductive trace 80 is shown in cross-section as a continuous circuit trace for convenience of illustration. However, conductive trace 80 can provide horizontal signal routing in both the X and Y directions. That is, pad 74 and terminal 78 can be laterally offset from one another in the X and Y directions. Furthermore, via 64 can be located near or at a corner or peripheral edge of thermal board 90 and via 66 can be located near or at a corner or peripheral edge of thermal board 90.

Conductive trace 80 and heat spreader 82 remain spaced from one another. As a result, conductive trace 80 and heat spreader 82 are mechanically attached and electrically isolated from one another.

Heat spreader 82 provides heat spreading and heat dissipation from a semiconductor device that is subsequently mounted on cap 76 to the next level assembly that thermal board 90 is subsequently mounted on. The semiconductor device generates heat that flows into cap 76, from cap 76 into post 22 and through post 22 into base 24 where it is spread out and dissipated in the downward direction, for instance to an underlying heat sink.

Post 22, conductive pattern 38 and vias 64 and 66 are copper. Base 24, pad 74, cap 76 and terminal 78 are copper/nickel/silver. Base 24, pad 74, cap 76 and terminal 78 consist of a silver surface layer, a buried copper core and a buried nickel layer that contacts and is sandwiched between the silver surface layer and the buried copper core. Base 24, pad 74, cap 76 and terminal 78 are also primarily copper at the buried copper core. Plated contacts 88 provide the silver surface layer and the buried nickel layer and various combinations of metal plate 10, conductive layer 26 and plated layers 60 and 62 provide the buried copper core.

Conductive trace 80 includes a buried copper core shared by conductive pattern 38, vias 64 and 66, pad 74 and terminal 78 and heat spreader 82 includes a buried copper core shared by post 22, base 24 and cap 76. Furthermore, conductive trace 80 includes a plated contact 88 at pad 74 and a plated contact 88 at terminal 78 and heat spreader 82 includes a plated contact 88 at base 24 and a plated contact 88 at cap 76. Moreover, conductive trace 80 and heat spreader 82 consist of copper/nickel/silver and are primarily copper at the buried copper core.

Thermal board 90 does not expose post 22 which is covered by cap 76 in the upward direction. Post 22 is shown in phantom in FIG. 6P for convenience of illustration.

Thermal board 90 can include multiple conductive traces 80 with a conductive pattern 38, vias 64 and 66, pad 74 and terminal 78. A single conductive trace 80 is described and labeled for convenience of illustration. In conductive traces 80, vias 64 and 66, pads 74 and terminals 78 generally have similar shapes and sizes but conductive patterns 38 can have a wide variety of configurations. For instance, some conductive traces 80 may be spaced and separated and electrically isolated from one another whereas other conductive traces 80 can intersect or route to the same pad 74 or terminal 78 and be electrically connected to one another. Likewise, some pads 74 may receive independent signals whereas other pads 74 share a common signal, power or ground.

Thermal board 90 can be adapted for an LED package with blue, green and red LED chips, with each LED chip including an anode and a cathode and each LED package including a corresponding anode terminal and cathode terminal. In this instance, thermal board 90 can include six pads 74 and four terminals 78 so that each anode is routed from a separate pad 74 to a separate terminal 78 whereas each cathode is routed from a separate pad 74 to a common ground terminal 78.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 80 after they are formed. A plating bus can be disconnected during the wet chemical etch that forms pad 74 and cap 76.

Thermal board 90 can include registration holes (not shown) that are drilled or sliced through dielectric layer 40, adhesives 44 and 46 and solder masks 84 and 86 so that thermal board 90 can be positioned by inserting tooling pins through the registration holes when it is subsequently mounted on an underlying carrier.

Thermal board 90 can accommodate multiple semiconductor devices rather than one with a single post 22 or multiple posts 22. Thus, multiple semiconductor devices can be mounted on a single post 22 or separate semiconductor devices can be mounted on separate posts 22.

Thermal board 90 with a single post 22 for multiple semiconductor devices can be accomplished by providing substrate 30 with additional conductive patterns 38, drilling additional windows 56 and 58 to define additional vias 64 and 66, adjusting etch mask 70 to define additional pads 74 and adjusting etch mask 72 to define additional terminals 78. The vias 64 and 66, pads 74 and terminals 78 can be laterally repositioned to provide a 2×2 array for four semiconductor devices. In addition, the topography (lateral shape) can be adjusted for pads 74 and terminals 78.

Thermal board 90 with multiple posts 22 for multiple semiconductor devices can be accomplished by adjusting etch mask 16 to define additional posts 22, adjusting conductive layer 26 to include additional holes 26A, adjusting substrate 30 to include additional conductive patterns 38 and apertures 30A, adjusting adhesive 44 to include additional openings 44A, adjusting adhesive 46 to include additional openings 46A, drilling additional windows 56 and 58 to define additional vias 64 and 66, adjusting etch mask 70 to define additional pads 74 and caps 76 and adjusting etch mask 72 to define additional bases 24 and terminals 78. These elements can be laterally repositioned to provide a 2×2 array for four semiconductor devices. In addition, the topography (lateral shape) can be adjusted for posts 22, bases 24, pads 74, caps 76 and terminals 78. Furthermore, posts 22 can have separate bases 24 or share a single base 24 as defined by etch mask 72.

Figure 7A:
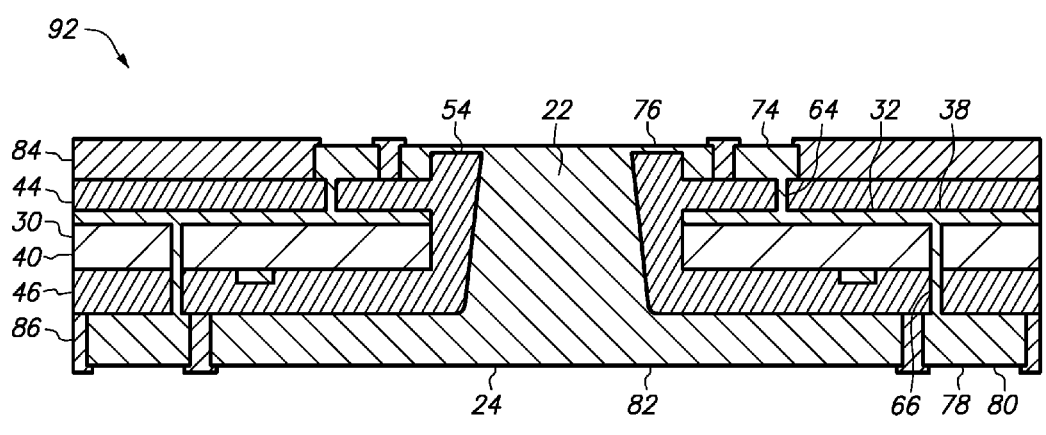
FIGS. 7A, 7B and 7C are cross-sectional, top and bottom views, respectively, of a thermal board with a second-level power/ground plane in accordance with an embodiment of the present invention.
Figure 7B:
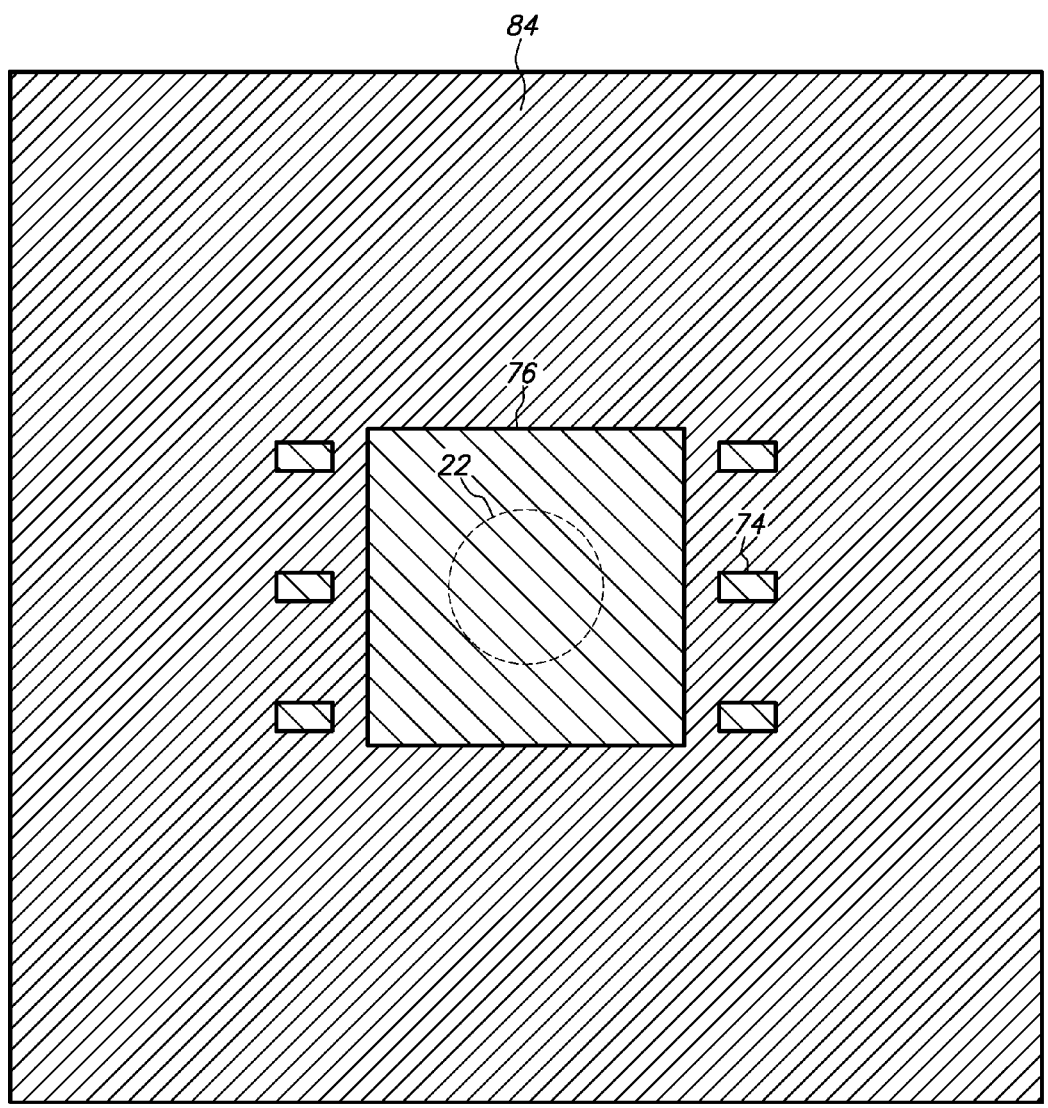
Figure 7C:
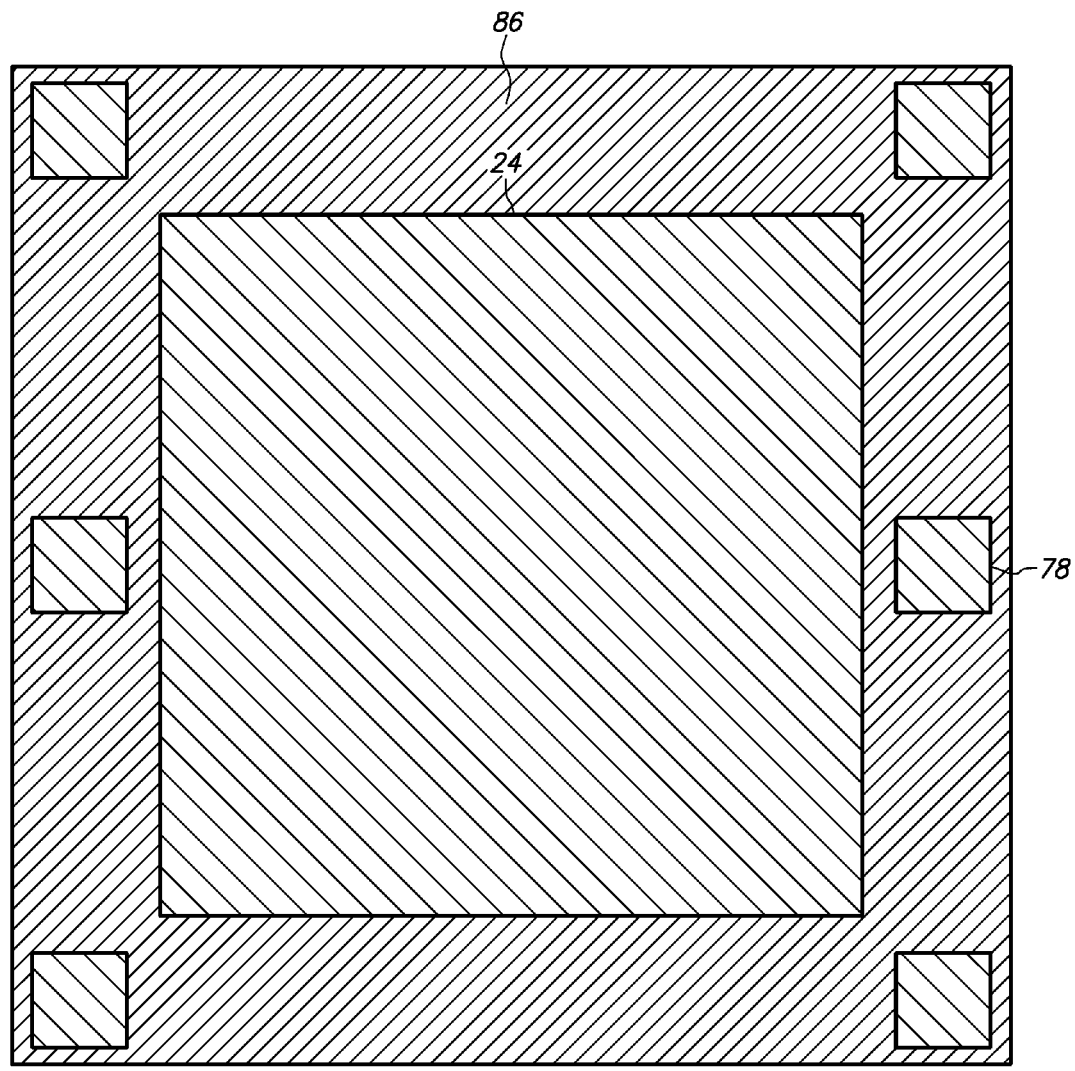

FIGS. 7A, 7B and 7C are cross-sectional, top and bottom views, respectively, of a thermal board with a second-level power/ground plane in accordance with an embodiment of the present invention.

In this embodiment, the conductive segment above the dielectric layer is a power/ground plane and the conductive pattern is the power/ground plane. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 92 includes substrate 30, adhesive 54, conductive trace 80, heat spreader 82 and solder masks 84 and 86. Substrate 30 includes conductive pattern 38 and dielectric layer 40. Conductive pattern 38 includes conductive segment 32. Adhesive 54 includes adhesives 44 and 46. Conductive trace 80 includes conductive pattern 38, vias 64 and 66, pad 74 and terminal 78. Heat spreader 82 includes post 22, base 24 and cap 76.

Conductive segment 32 is a power/ground plane rather than a routing line. Conductive pattern 38 is conductive segment 32 alone. Via 66 contacts and extends through dielectric layer 40 and adhesive 46 to conductive segment 32 and electrically connects conductive segment 32 and terminal 78. Thus, conductive trace 80 is a three-level conductor with pad 74 at the first level, conductive segment 32 at the second level and terminal 78 at the fourth level and with via 64 a first-to-second level interconnect and via 66 a second-to-fourth level interconnect.

Thermal board 92 can be manufactured in a manner similar to thermal board 90 with suitable adjustments for substrate 30 and via 66. For instance, substrate 30 is patterned to provide conductive segment 32 as a power/ground plane that is electrically isolated from the other conductors of substrate 30. Thereafter, adhesive 46 is mounted on base 24, substrate 30 is mounted on adhesive 46, adhesive 44 is mounted on substrate 30 and conductive layer 26 is mounted on adhesive 44. Thereafter, heat and pressure are applied to flow and solidify adhesives 44 and 46, grinding is applied to planarize the top surface, window 56 is formed through adhesive 44 to selectively expose conductive segment 32 in the upward direction and window 58 is formed through dielectric layer 40 and adhesive 46 to selectively expose conductive segment 32 in the downward direction and then plated layers 60 and 62 are deposited on the structure to form vias 64 and 66, respectively, in windows 56 and 58, respectively. Thereafter, conductive layer 26 and plated layer 60 are etched to form pad 74 and cap 76 and base 24 and plated layer 62 are etched to form terminal 78 and further define base 24, then solder mask 84 is formed on the top surface and solder mask 86 is formed on the bottom surface and then plated contacts 88 provide a surface finish for base 24, pad 74, cap 76 and terminal 78. Thereafter, dielectric layer 40, adhesives 44 and 46 and solder masks 84 and 86 are cut or cracked at the peripheral edges of thermal board 92 to detach it from the batch.

Figure 8A:
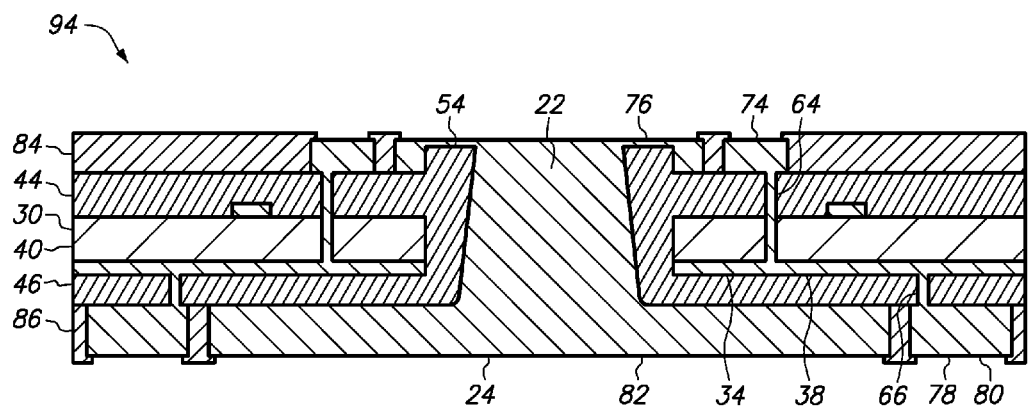
FIGS. 8A, 8B and 8C are cross-sectional, top and bottom views, respectively, of a thermal board with a third-level power/ground plane in accordance with an embodiment of the present invention.
Figure 8B:
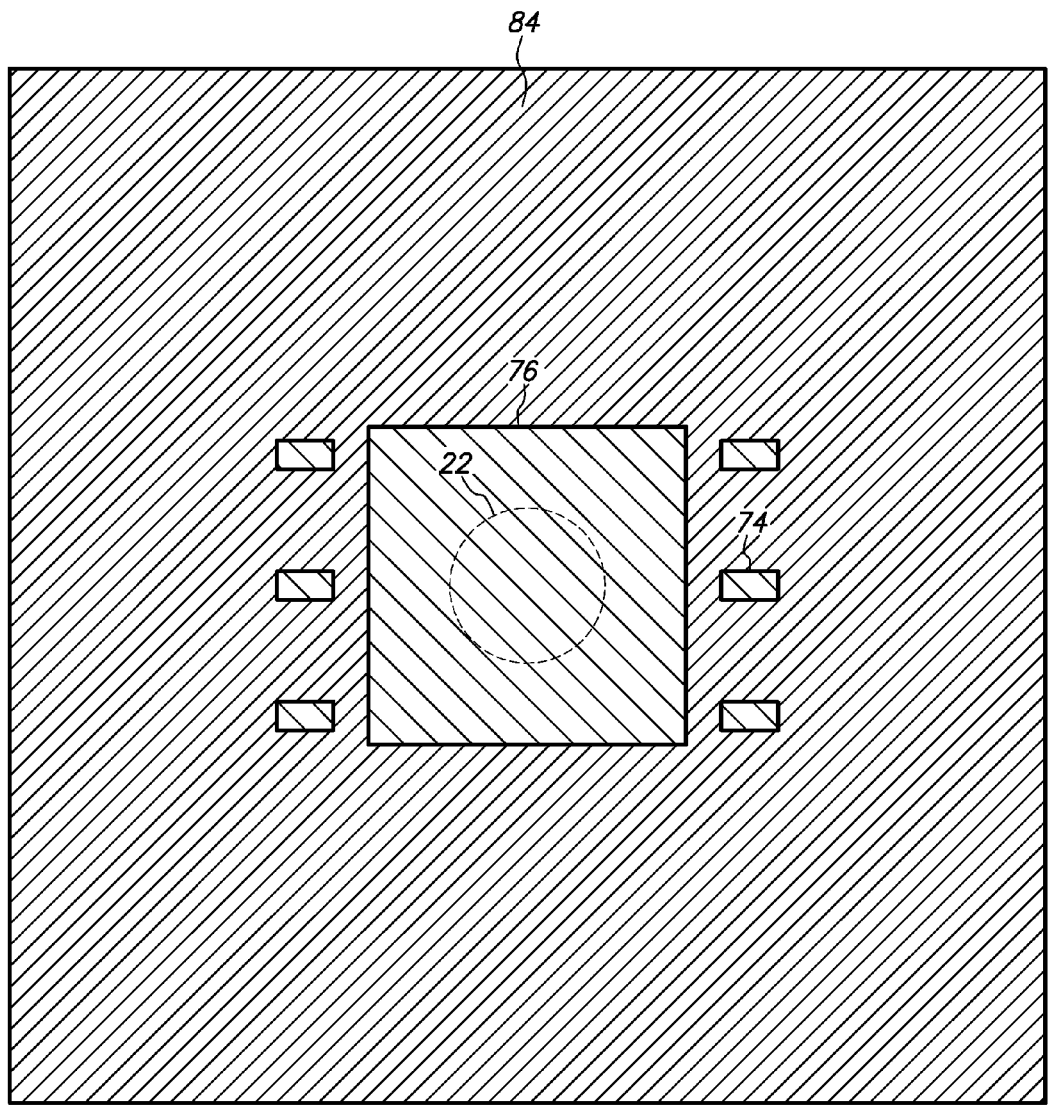
Figure 8C:
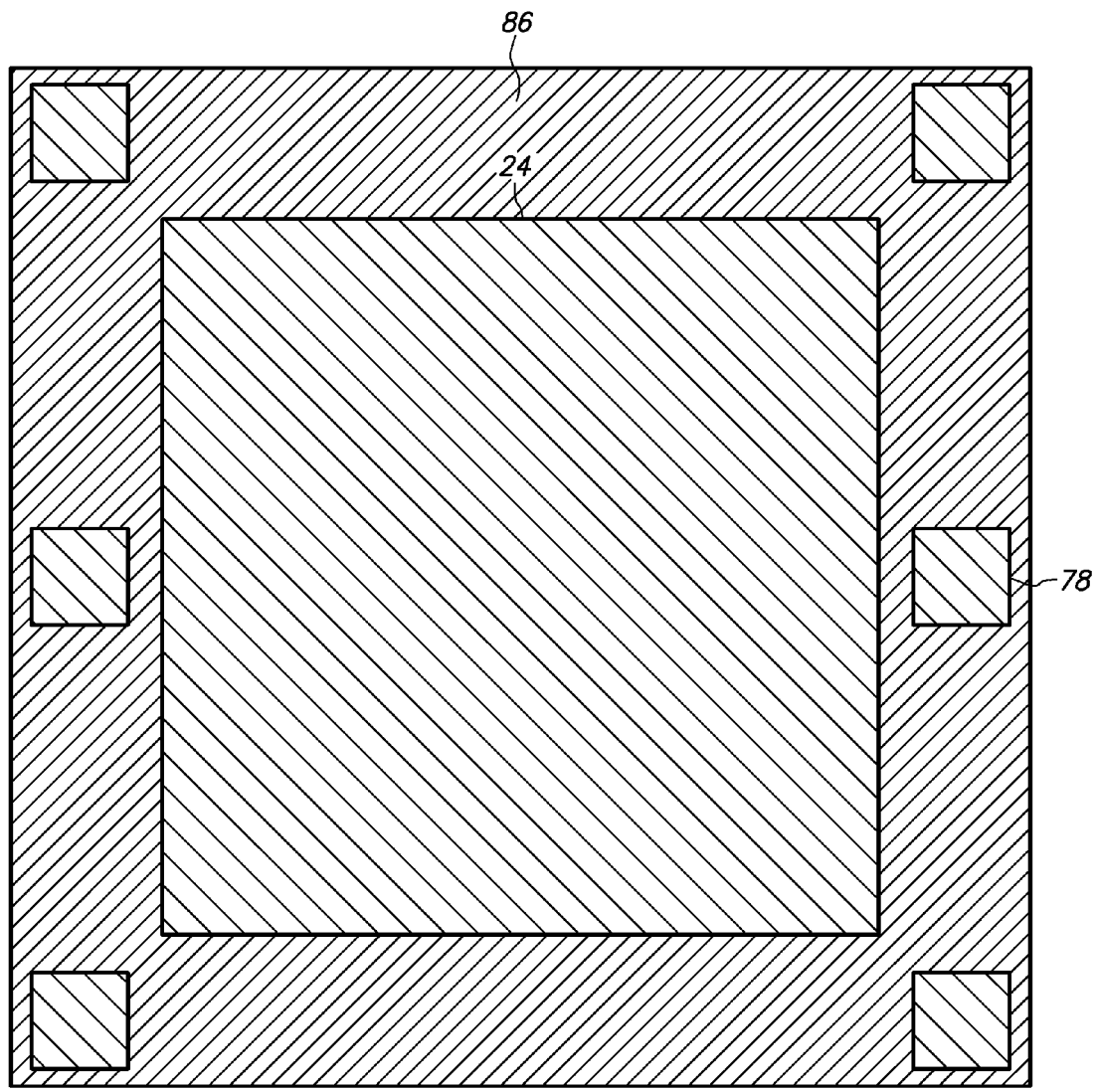

FIGS. 8A, 8B and 8C are cross-sectional, top and bottom views, respectively, of a thermal board with a third-level power/ground plane in accordance with an embodiment of the present invention.

In this embodiment, the conductive segment below the dielectric layer is a power/ground plane and the conductive pattern is the power/ground plane. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 94 includes substrate 30, adhesive 54, conductive trace 80, heat spreader 82 and solder masks 84 and 86. Substrate 30 includes conductive pattern 38 and dielectric layer 40. Conductive pattern 38 includes conductive segment 34. Adhesive 54 includes adhesives 44 and 46. Conductive trace 80 includes conductive pattern 38, vias 64 and 66, pad 74 and terminal 78. Heat spreader 82 includes post 22, base 24 and cap 76.

Conductive segment 34 is a power/ground plane rather than a routing line. Conductive pattern 38 is conductive segment 34 alone. Via 64 contacts and extends through dielectric layer 40 and adhesive 44 to conductive segment 34 and electrically connects conductive segment 34 and pad 74. Thus, conductive trace 80 is a three-level conductor with pad 74 at the first level, conductive segment 34 at the third level and terminal 78 at the fourth level and with via 64 a first-to-third level interconnect and via 66 a third-to-fourth level interconnect.

Thermal board 94 can be manufactured in a manner similar to thermal board 90 with suitable adjustments for substrate 30 and via 66. For instance, substrate 30 is patterned to provide conductive segment 34 as a power/ground plane that is electrically isolated from the other conductors of substrate 30. Thereafter, adhesive 46 is mounted on base 24, substrate 30 is mounted on adhesive 46, adhesive 44 is mounted on substrate 30 and conductive layer 26 is mounted on adhesive 44. Thereafter, heat and pressure are applied to flow and solidify adhesives 44 and 46, grinding is applied to planarize the top surface, window 56 is formed through dielectric layer 40 and adhesive 44 to selectively expose conductive segment 34 in the upward direction and window 58 is formed through adhesive 46 to selectively expose conductive segment 34 in the downward direction and then plated layers 60 and 62 are deposited on the structure to form vias 64 and 66, respectively, in windows 56 and 58, respectively. Thereafter, conductive layer 26 and plated layer 60 are etched to form pad 74 and cap 76 and base 24 and plated layer 62 are etched to form terminal 78 and further define base 24, then solder mask 84 is formed on the top surface and solder mask 86 is formed on the bottom surface and then plated contacts 88 provide a surface finish for base 24, pad 74, cap 76 and terminal 78. Thereafter, dielectric layer 40, adhesives 44 and 46 and solder masks 84 and 86 are cut or cracked at the peripheral edges of thermal board 94 to detach it from the batch.

Figure 9A:
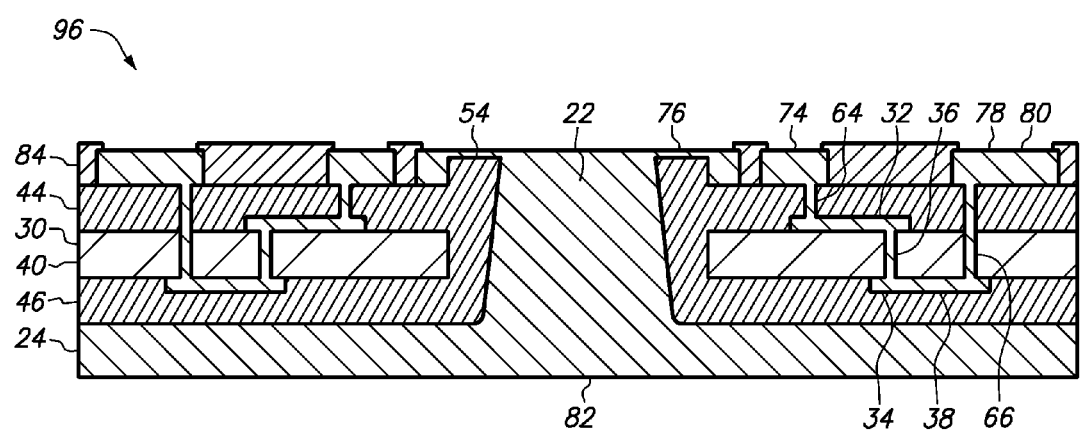
FIGS. 9A, 9B and 9C are cross-sectional, top and bottom views, respectively, of a thermal board with horizontal signal routing in accordance with an embodiment of the present invention.
Figure 9B:
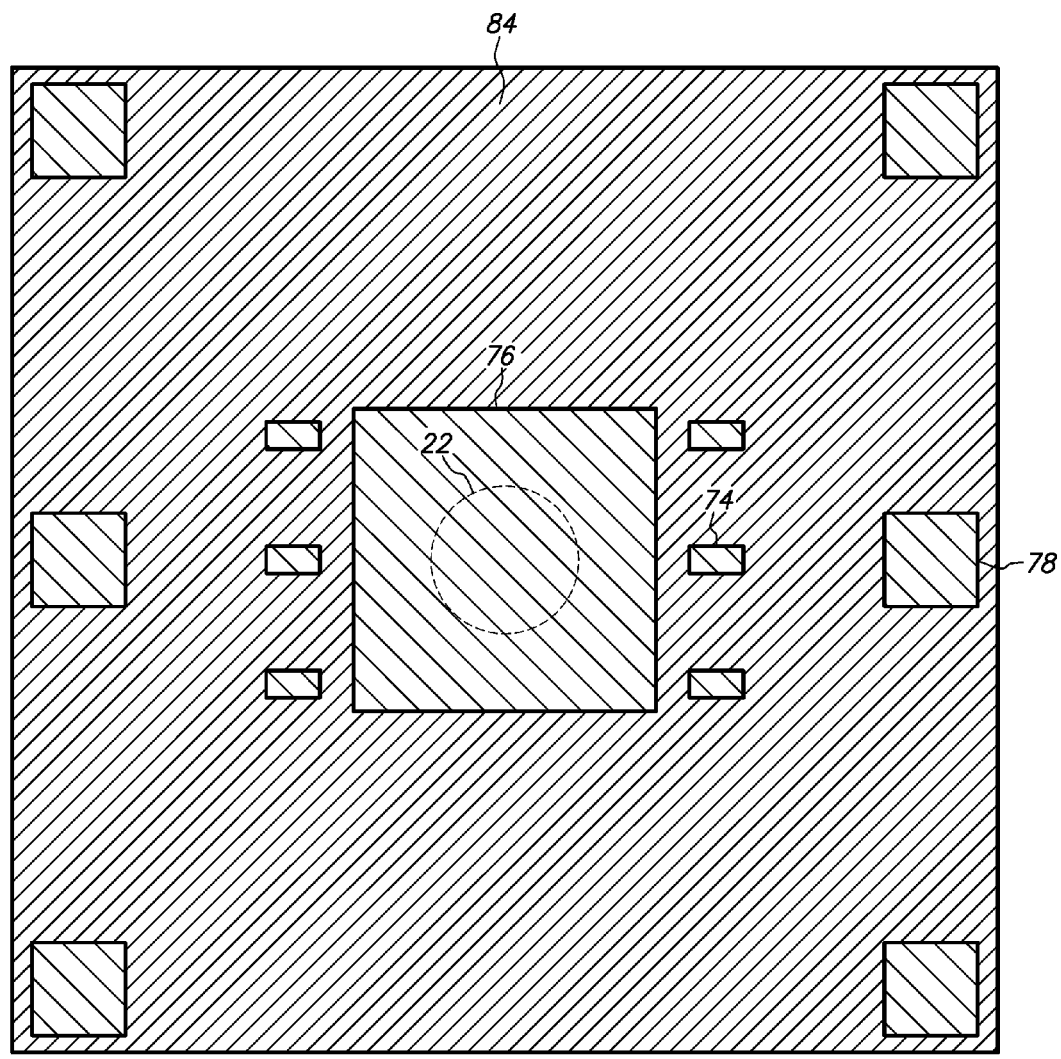
Figure 9C:
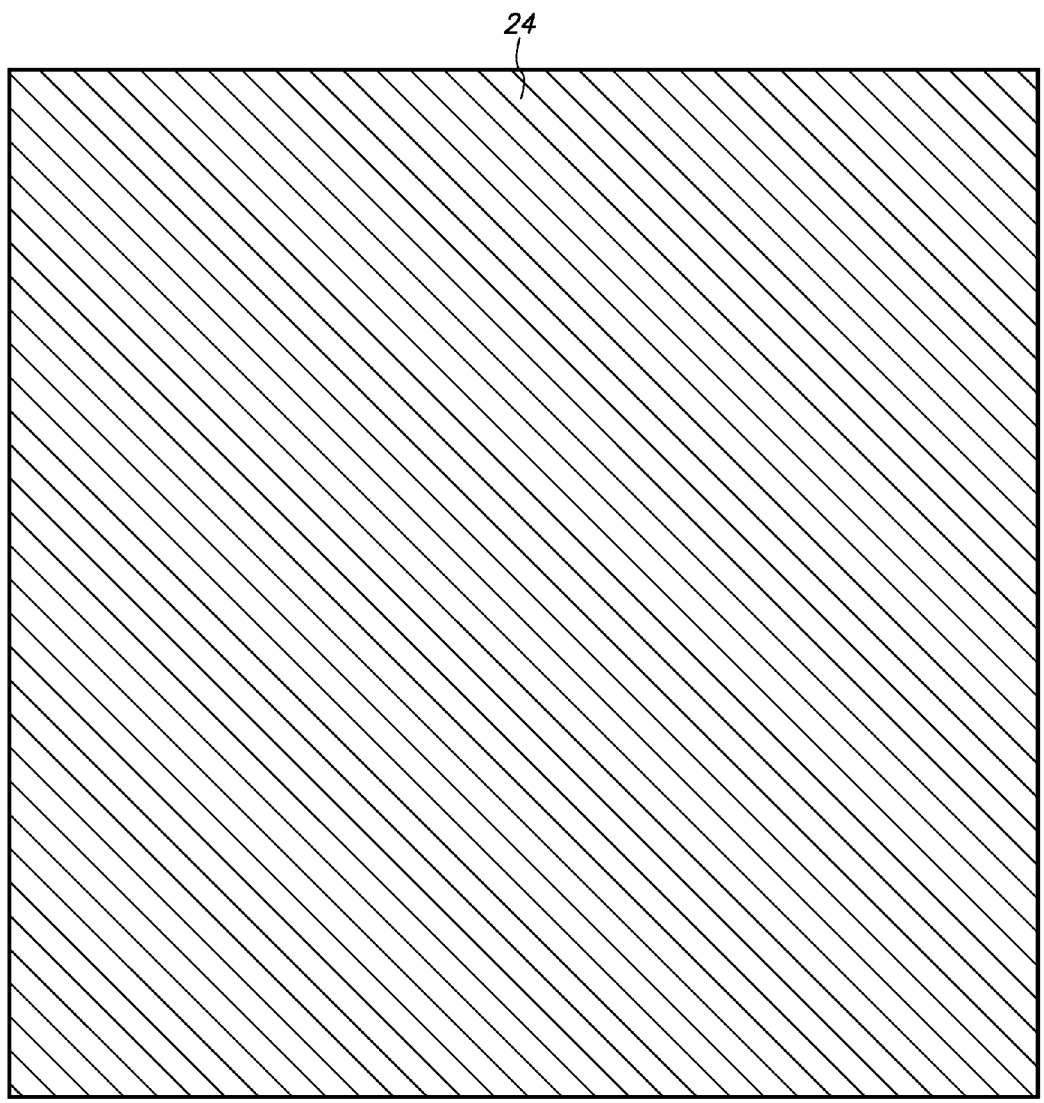

FIGS. 9A, 9B and 9C are cross-sectional, top and bottom views, respectively, of a thermal board with horizontal routing in accordance with an embodiment of the present invention.

In this embodiment, the pad and the terminal extend above the adhesive. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 96 includes substrate 30, adhesive 54, conductive trace 80, heat spreader 82 and solder mask 84. Substrate 30 includes conductive pattern 38 and dielectric layer 40. Conductive pattern 38 includes conductive segments 32 and 34 and electrical interconnect 36. Adhesive 54 includes adhesives 44 and 46. Conductive trace 80 includes conductive pattern 38, vias 64 and 66, pad 74 and terminal 78. Heat spreader 82 includes post 22, base 24 and cap 76.

Conductive trace 80 provides horizontal (lateral) fan-out routing from pad 74 to terminal 78. Pad 74 and terminal 78 contact and extend above adhesive 44, are spaced from and located above base 24, substrate 30 and adhesive 46 and are coplanar with one another at a top surface that faces in the upward direction. Via 66 contacts and extends through dielectric layer 40 and adhesive 44 to conductive segment 34, is located above conductive segment 34 and is spaced from adhesive 46. Thus, conductive trace 80 is a three-level conductor with pad 74 and terminal 78 at the first level, conductive segment 32 at the second level and conductive segment 34 at the third level and with via 64 a first-to-second level interconnect and via 66 a first-to-third level interconnect.

Base 24 covers post 22, substrate 30, adhesives 44 and 46, cap 76, conductive trace 80 and solder mask 84 in the downward direction and extends to the peripheral edges of thermal board 96 and solder mask 86 is omitted.

Thermal board 96 can be manufactured in a manner similar to thermal board 90 with suitable adjustments for via 66 and terminal 78. For instance, adhesive 46 is mounted on base 24, substrate 30 is mounted on adhesive 46, adhesive 44 is mounted on substrate 30 and conductive layer 26 is mounted on adhesive 44. Thereafter, heat and pressure are applied to flow and solidify adhesives 44 and 46, grinding is applied to planarize the top surface, window 56 is formed through adhesive 44 to selectively expose conductive segment 32 in the upward direction and window 58 is formed through dielectric layer 40 and adhesive 44 to selectively expose conductive segment 34 in the upward direction and then plated layer 60 is deposited on the structure to form vias 64 and 66 in windows 56 and 58, respectively. Thereafter, conductive layer 26 and plated layer 60 are etched to form pad 74, cap 76 and terminal 78 as defined by etch mask 60 and base 24 remains unpatterned, then solder mask 84 is formed on the top surface to selectively expose pad 74, cap 76 and terminal 78 and then plated contacts 88 provide a surface finish for base 24, pad 74, cap 76 and terminal 78. Thereafter, base 24, dielectric layer 40, adhesives 44 and 46 and solder mask 84 are cut or cracked at the peripheral edges of thermal board 96 to detach it from the batch.

Figure 10A:
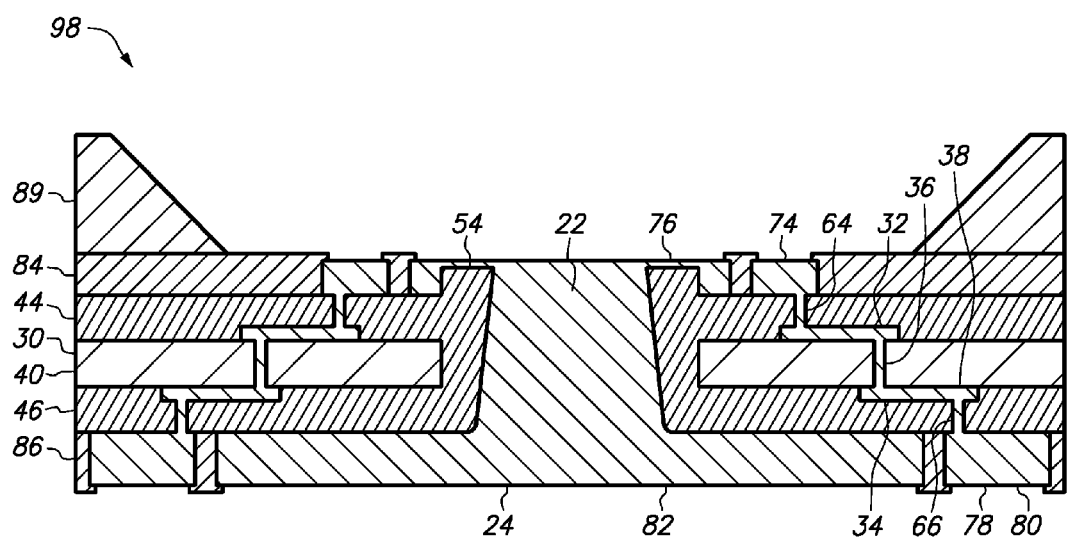
FIGS. 10A, 10B and 10C are cross-sectional, top and bottom views, respectively, of a thermal board with a rim in accordance with an embodiment of the present invention.
Figure 10B:
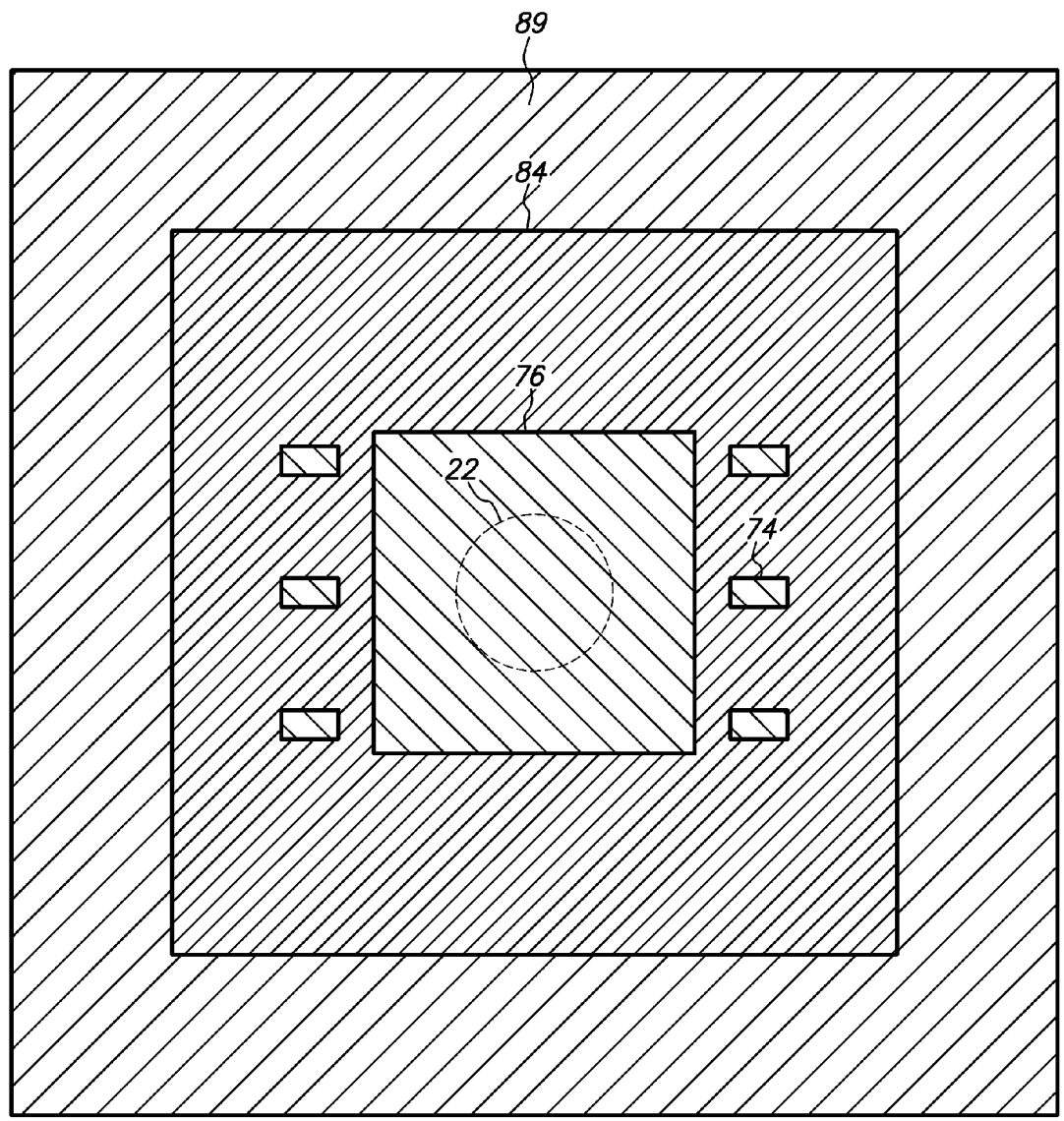
Figure 10C:
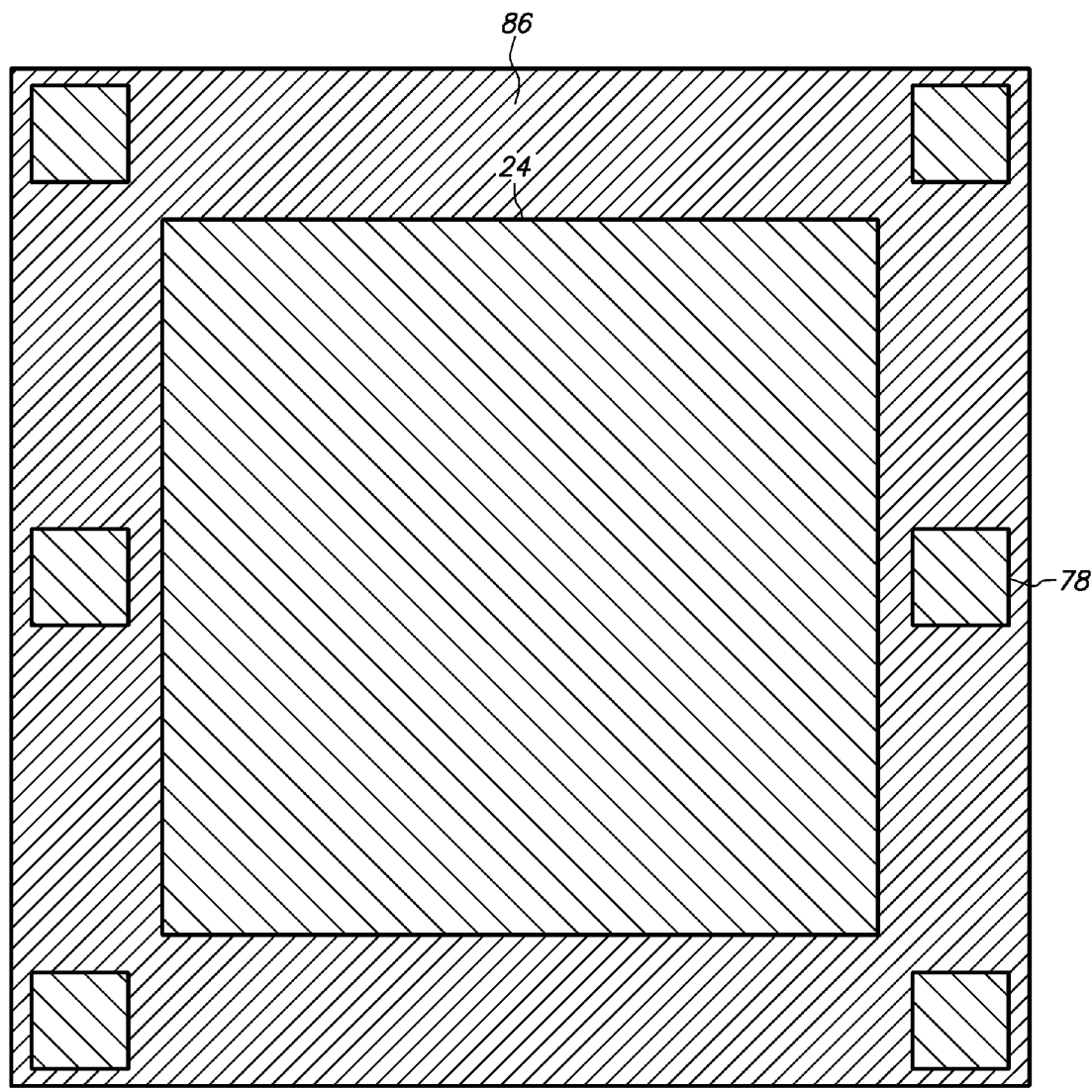

FIGS. 10A, 10B and 10C are cross-sectional, top and bottom views, respectively, of a thermal board with a rim in accordance with an embodiment of the present invention.

In this embodiment, a rim is mounted on the top surface. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 98 includes substrate 30, adhesive 54, conductive trace 80, heat spreader 82, solder masks 84 and 86 and rim 89. Substrate 30 includes conductive pattern 38 and dielectric layer 40. Conductive pattern 38 includes conductive segments 32 and 34 and electrical interconnect 36. Adhesive 54 includes adhesives 44 and 46. Conductive trace 80 includes conductive pattern 38, vias 64 and 66, pad 74 and terminal 78. Heat spreader 82 includes post 22, base 24 and cap 76.

Rim 89 is a square shaped frame that contacts and extends above solder mask 84. Post 22 and cap 76 are centrally located within the periphery of rim 89. For instance, rim 89 has a height of 600 microns, a width (between its inner and outer sidewalls) of 1000 microns and is laterally spaced from cap 76 by 500 microns.

Rim 89 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 89 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 89 can include a metal ring on the adhesive film.

Thermal board 98 can be manufactured in a manner similar to thermal board 90 with suitable adjustments for rim 89. For instance, adhesive 46 is mounted on base 24, substrate 30 is mounted on adhesive 46, adhesive 44 is mounted on substrate 30 and conductive layer 26 is mounted on adhesive 44. Thereafter, heat and pressure are applied to flow and solidify adhesives 44 and 46, grinding is applied to planarize the top surface, window 56 is formed through adhesive 44 to selectively expose conductive segment 32 in the upward direction and window 58 is formed through adhesive 46 to selectively expose conductive segment 34 in the downward direction and then plated layers 60 and 62 are deposited on the structure to form vias 64 and 66, respectively, in windows 56 and 58, respectively. Thereafter, conductive layer 26 and plated layer 60 are etched to form pad 74 and cap 76 and base 24 and plated layer 62 are etched to form terminal 78 and further define base 24, then solder mask 84 is formed on the top surface and solder mask 86 is formed on the bottom surface, then plated contacts 88 provide a surface finish for base 24, pad 74, cap 76 and terminal 78 and then rim 89 is mounted on solder mask 84. Thereafter, dielectric layer 40, adhesives 44 and 46 and solder masks 84 and 86 are cut or cracked at the peripheral edges of thermal board 98 to detach it from the batch.

Figure 11A:
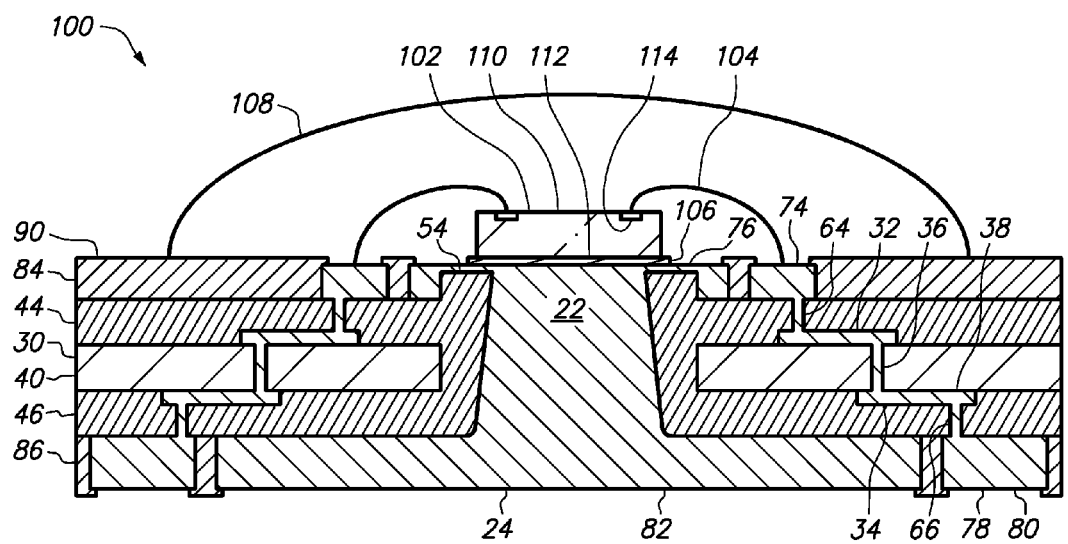
FIGS. 11A, 11B and 11C are cross-sectional, top and bottom views, respectively, of a semiconductor chip assembly that includes a thermal board, a semiconductor device and an encapsulant in accordance with an embodiment of the present invention.
Figure 11B:
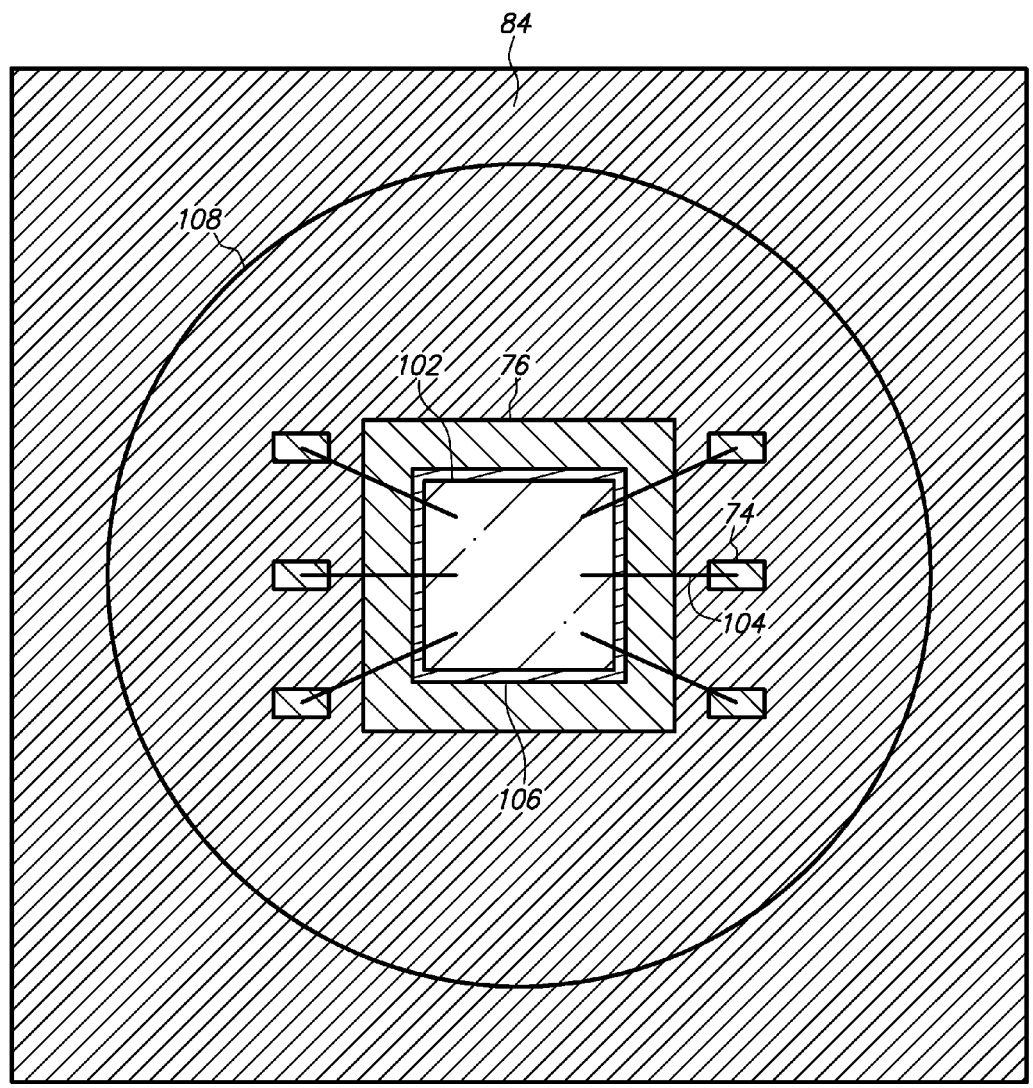
Figure 11C:
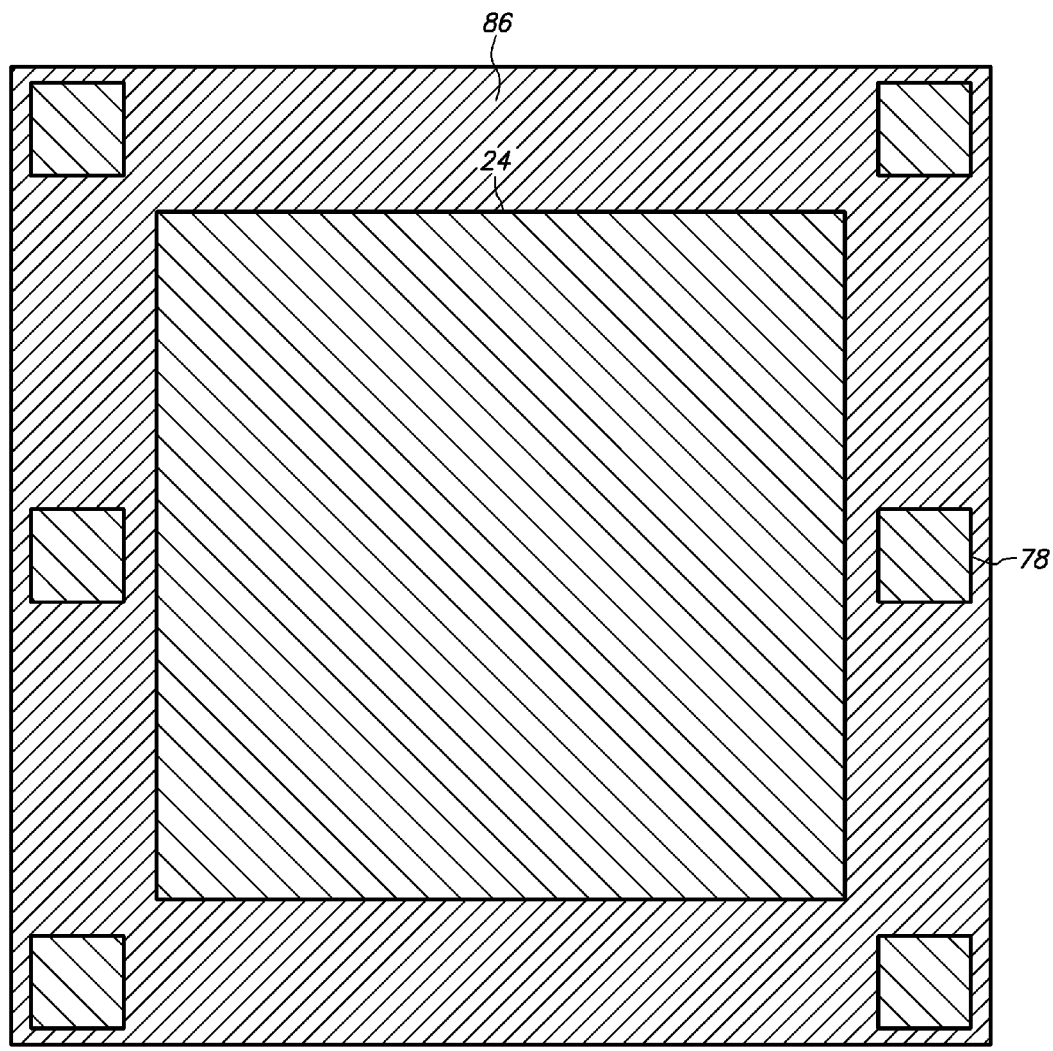

FIGS. 11A, 11B and 11C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the post, is electrically connected to the pad using a wire bond and is thermally connected to the post using a die attach. The semiconductor device is covered by a color-shifting encapsulant that converts the blue light to white light.

Semiconductor chip assembly 100 includes thermal board 90, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 82, electrically connected to conductive trace 80 and thermally connected to heat spreader 82. In particular, LED chip 102 is mounted on cap 76 (and thus post 22), overlaps post 22 but does not overlap substrate 30 or conductive trace 80, is electrically connected to pad 74 by wire bond 104 and is thermally connected to and mechanically attached to cap 76 by die attach 106.

For instance, wire bond 104 is bonded to and electrically connects pads 74 and 114, thereby electrically connecting LED chip 102 to terminal 78. Die attach 106 contacts and is sandwiched between and thermally connects and mechanically attaches cap 76 and thermal contact surface 112, thereby thermally connecting LED chip 102 to post 22, thereby thermally connecting LED chip 102 to base 24.

Encapsulant 108 is a solid adherent electrically insulative color-shifting protective enclosure that provides environmental protection such as moisture resistance and particle protection for LED chip 102 and wire bond 104. Encapsulant 108 contacts pad 74, cap 76, solder mask 84, LED chip 102, wire bond 104 and die attach 106, is spaced from post 22, base 24, substrate 30, adhesives 44 and 46, vias 64 and 66 and terminal 78 and covers post 22, base 24, via 64, pad 74, cap 76, LED chip 102, wire bond 104 and die attach 106 in the upward direction. Encapsulant 108 is transparent for convenience of illustration.

Pad 74 is spot plated with nickel/silver to bond well with wire bond 104, thereby improving signal transfer from conductive trace 80 to LED chip 102, and cap 76 is spot plated with nickel/silver to bond well with die attach 106, thereby improving heat transfer from LED chip 102 to heat spreader 82. Pad 74 and cap 76 also provide a highly reflective surface which reflects the light emitted towards the silver surface layer by LED chip 102, thereby increasing light output in the upward direction. Furthermore, since cap 76 is shaped and sized to accommodate thermal contact surface 112, post 22 is not and need not be shaped and sized to accommodate thermal contact surface 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 76 using die attach 106, then wire bonding pads 74 and 114 and then forming encapsulant 108.

For instance, die attach 106 is initially a silver-filled epoxy paste with high thermal conductivity that is selectively screen printed on cap 76 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 74 and 114 and then encapsulant 108 is molded on the structure.

LED chip 102 can be electrically connected to pad 74 by a wide variety of connection media, thermally connected to and mechanically attached to heat spreader 82 by a wide variety of thermal adhesives and encapsulated by a wide variety of encapsulants.

Semiconductor chip assembly 100 is a first-level single-chip package.

Figure 12A:
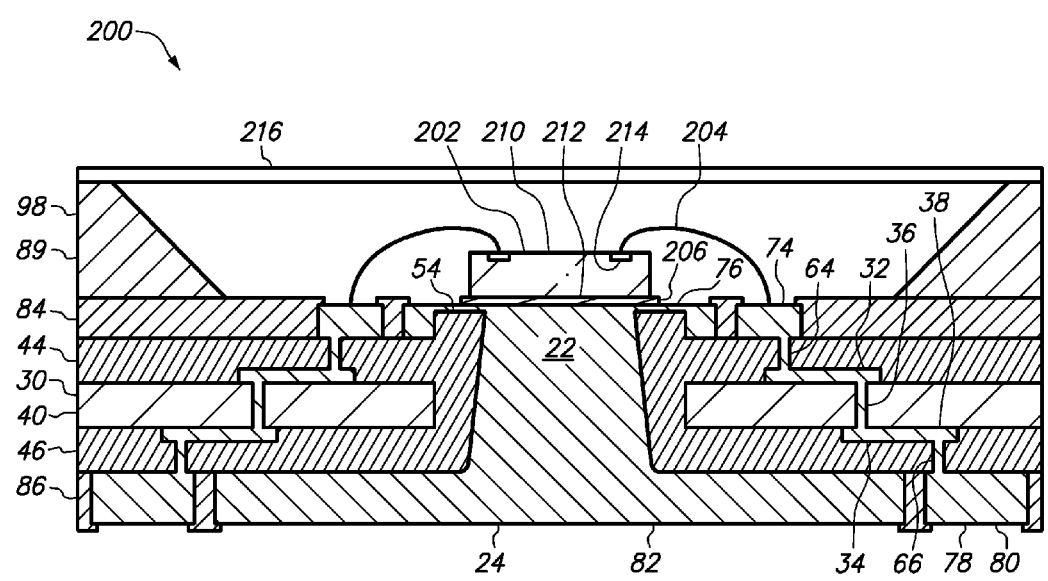
FIGS. 12A, 12B and 12C are cross-sectional, top and bottom views, respectively, of a semiconductor chip assembly that includes a thermal board with a rim, a semiconductor device and a lid in accordance with an embodiment of the present invention.
Figure 12B:
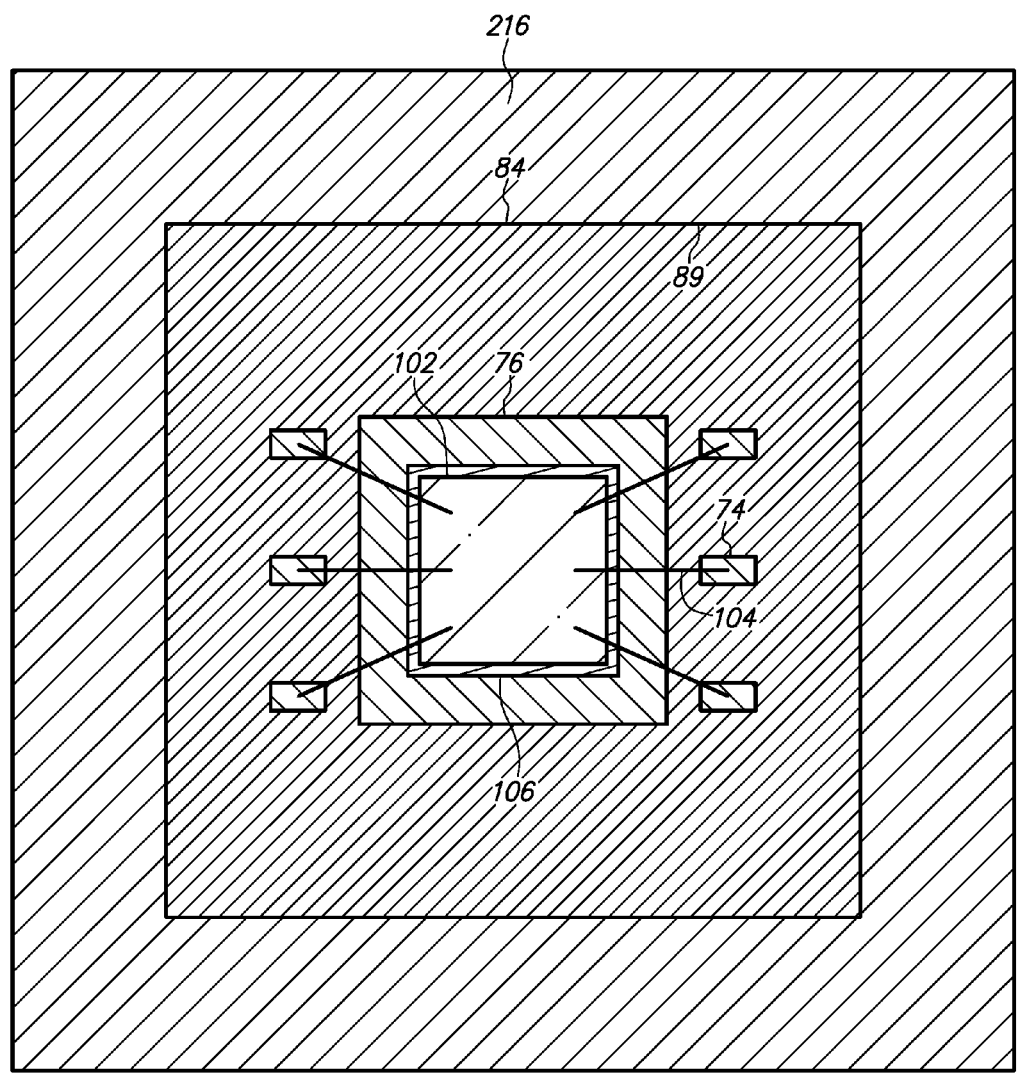
Figure 12C:
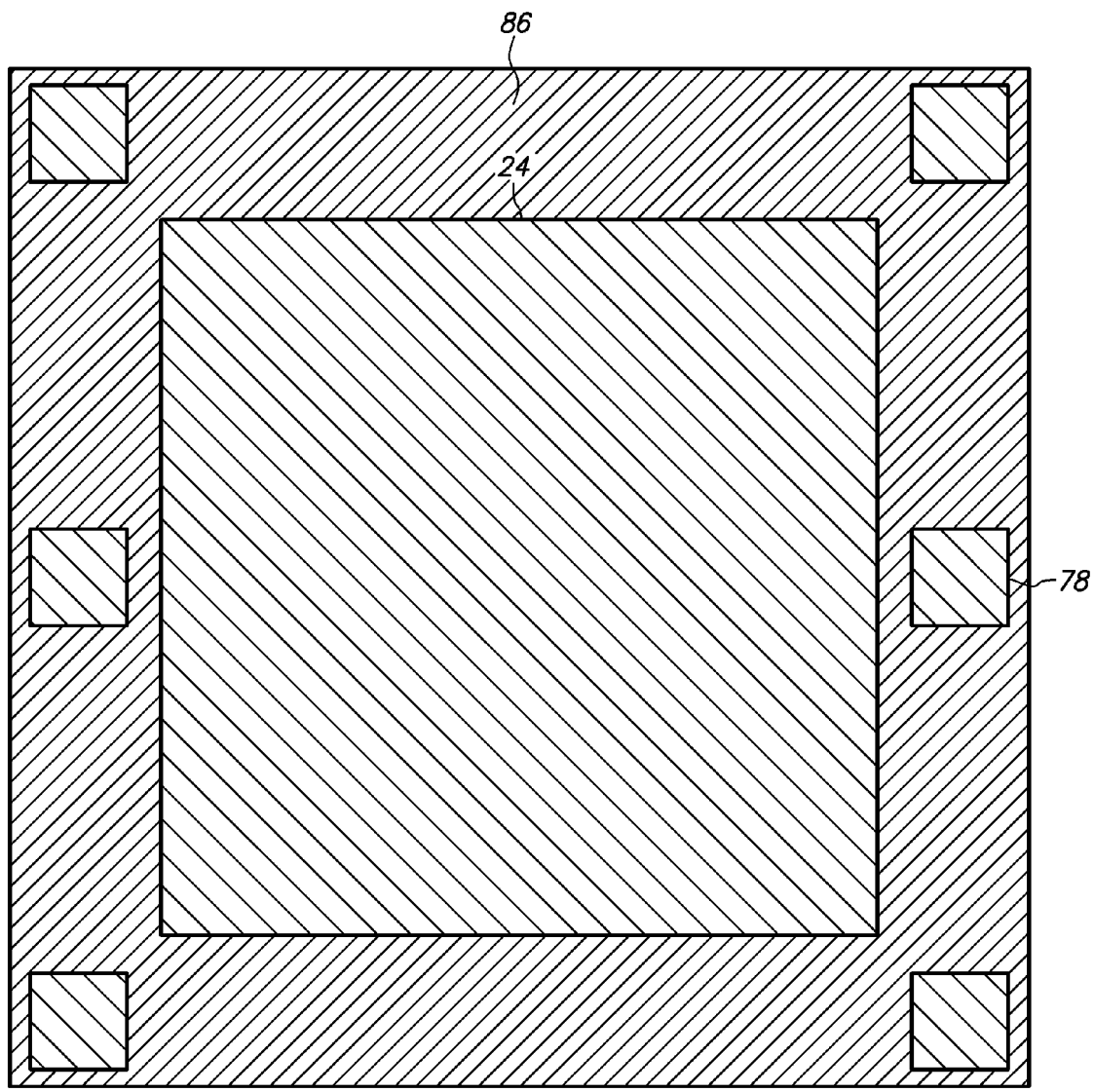

FIGS. 12A, 12B and 12C are cross-sectional, top and bottom views, respectively, of a semiconductor chip assembly that includes a thermal board with a rim, a semiconductor device and a lid in accordance with an embodiment of the present invention.

In this embodiment, the lid is mounted on the rim and the encapsulant is omitted. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 98, LED chip 202, wire bond 204, die attach 206 and lid 216. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 82, electrically connected to conductive trace 80 and thermally connected to heat spreader 82. In particular, LED chip 202 is mounted on cap 76, overlaps post 22 but does not overlap substrate 30 or conductive trace 80, is electrically connected to pad 74 by wire bond 204 and is thermally connected to and mechanically attached to cap 76 by die attach 206.

Lid 216 is a glass sheet that is mounted on rim 89, thereby forming a sealed enclosure for LED chip 202 and wire bond 204 in an air cavity. Furthermore, lid 216 is transparent and does not color-shift light.

LED chip 202 emits white light which in turn radiates through lid 216 and assembly 200 is a white light source.

Semiconductor chip assembly 200 can be manufactured by mounting LED chip 202 on cap 76 using die attach 206, then wire bonding pads 74 and 214 and then mounting lid 216 on rim 89.

Semiconductor chip assembly 200 is a first-level single-chip package.

Figure 13A:
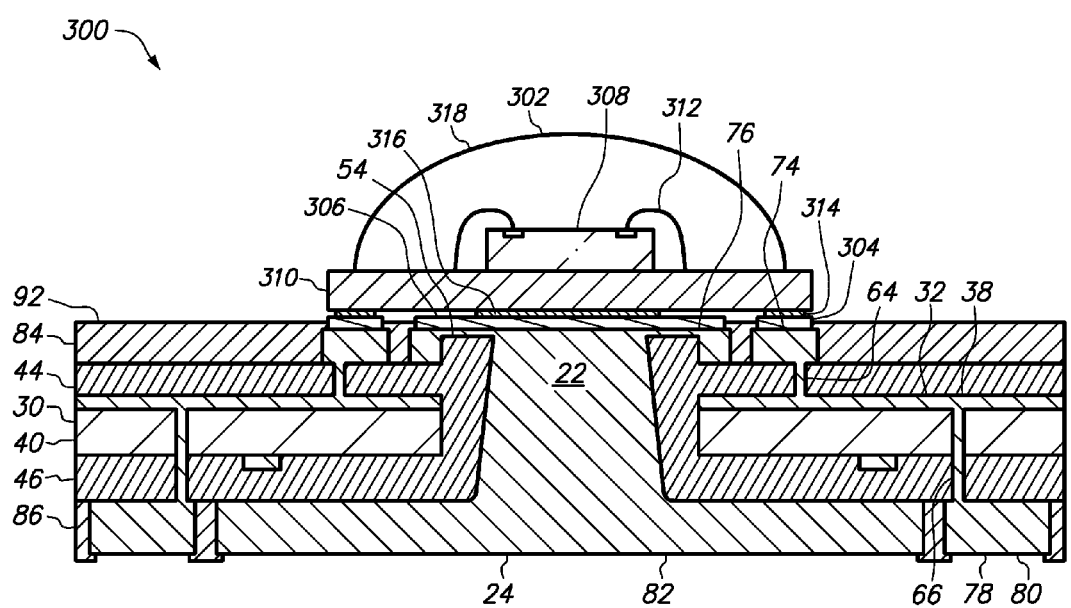
FIGS. 13A, 13B and 13C are cross-sectional, top and bottom views, respectively, of a semiconductor chip assembly that includes a thermal board with a power/ground plane and a semiconductor device with backside contacts in accordance with an embodiment of the present invention.
Figure 13B:
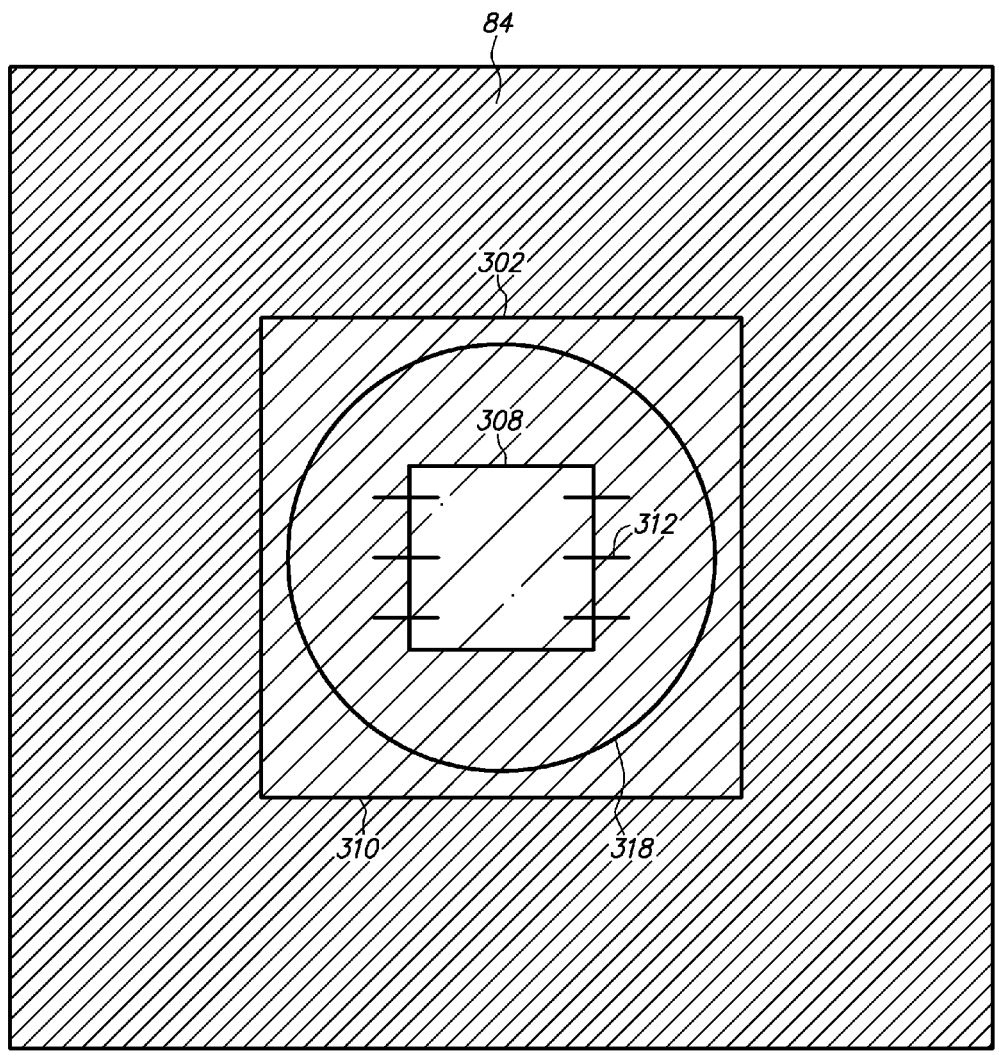
Figure 13C:
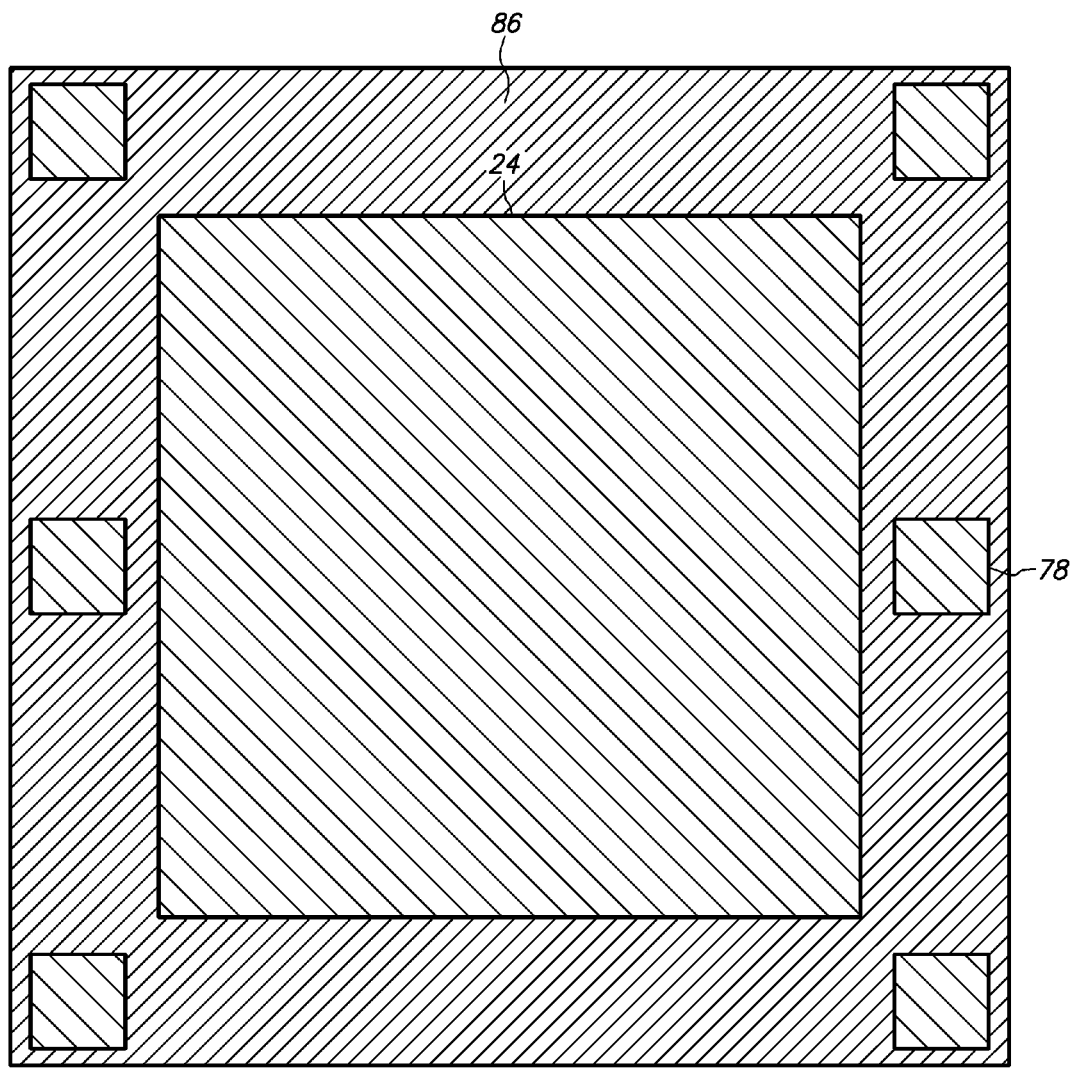

FIGS. 13A, 13B and 13C are cross-sectional, top and bottom views, respectively, of a semiconductor chip assembly that includes a thermal board with a power/ground plane and a semiconductor device with backside contacts in accordance with an embodiment of the present invention.

In this embodiment, the semiconductor device is an LED package rather than an LED chip and the conductive pattern is a power/ground plane. Furthermore, the semiconductor device is mounted on the heat spreader and the conductive trace, overlaps the post and the conductive trace, is electrically connected to the pad using a solder joint and is thermally connected to the cap using a solder joint.

Semiconductor chip assembly 300 includes thermal board 92, LED package 302 and solder joints 304 and 306. LED package 302 includes LED chip 308, submount 310, wire bond 312, electrical contact 314, thermal contact 316 and encapsulant 318. LED chip 308 includes a bond pad (not shown) electrically connected to a via (not shown) in submount 310 by wire bond 312, thereby electrically connecting LED chip 308 to electrical contact 314. LED chip 308 is mounted on and thermally connected to and mechanically attached to submount 310 by a die attach (not shown), thereby thermally connecting LED chip 308 to thermal contact 316. Submount 310 is a ceramic block with low electrical conductivity and high thermal conductivity, and contacts 314 and 316 are plated on and protrude downwardly from the backside of submount 310. Furthermore, LED chip 308 is similar to LED chip 102, wire bond 312 is similar to wire bond 104 and encapsulant 318 is similar to encapsulant 108.

LED package 302 is mounted on conductive trace 80 and heat spreader 82, electrically connected to conductive trace 80 and thermally connected to heat spreader 82. In particular, LED package 302 is mounted on pad 74 and cap 76 (and thus post 22 and adhesive 44), overlaps post 22, base 24, substrate 30, adhesives 44 and 46, pad 74 and cap 76 but does not overlap terminal 78, is electrically connected to pad 74 by solder joint 304 and is thermally connected to cap 76 by solder joint 306.

For instance, solder joint 304 contacts and is sandwiched between and electrically connects and mechanically attaches pad 74 and electrical contact 314, thereby electrically connecting LED chip 308 to the power/ground plane and terminal 78. Likewise, solder joint 306 contacts and is sandwiched between and thermally connects and mechanically attaches cap 76 and thermal contact 316, thereby thermally connecting LED chip 308 to base 24.

Pad 74 is spot plated with nickel/silver to bond well with solder joint 304, thereby improving signal transfer from conductive trace 80 to LED chip 308, and cap 76 is spot plated with nickel/silver to bond well with solder joint 306, thereby improving heat transfer from LED chip 308 to heat spreader 82. Furthermore, since cap 76 is shaped and sized to accommodate thermal contact 316, post 22 is not and need not be shaped and sized to accommodate thermal contact 316.

Semiconductor chip assembly 300 can be manufactured by depositing a solder material on pad 74 and cap 76, then placing contacts 314 and 316 on the solder material over pad 74 and cap 76, respectively, and then reflowing the solder material to provide solder joints 304 and 306.

For instance, solder paste is selectively screen printed on pad 74 and cap 76, then LED package 302 is positioned over thermal board 92 using a pick-up head and an automated pattern recognition system in step-and-repeat fashion. The pick-up head places contacts 314 and 316 on the solder paste over pad 74 and cap 76, respectively. Next, the solder paste is heated and reflowed at a relatively low temperature such as 190° C. and then the heat is removed and the solder paste cools and solidifies to form hardened solder joints 304 and 306. Alternatively, solder balls are placed on pad 74 and cap 76, then contacts 314 and 316 are placed on the solder balls over pad 74 and cap 76, respectively, and then the solder balls are heated and reflowed to form solder joints 304 and 306.

The solder material can be initially deposited on thermal board 92 or LED package 302 by plating or printing or placement techniques, then sandwiched between thermal board 92 and LED package 302 and then reflowed. The solder material can also be deposited on terminal 78 if required for the next level assembly. Furthermore, a conductive adhesive such as silver-filled epoxy or other connection media can be used instead of solder, and the connection media on pad 74, cap 76 and terminal 78 need not be the same.

Semiconductor chip assembly 300 is a second-level single-chip module.

Figure 14A:
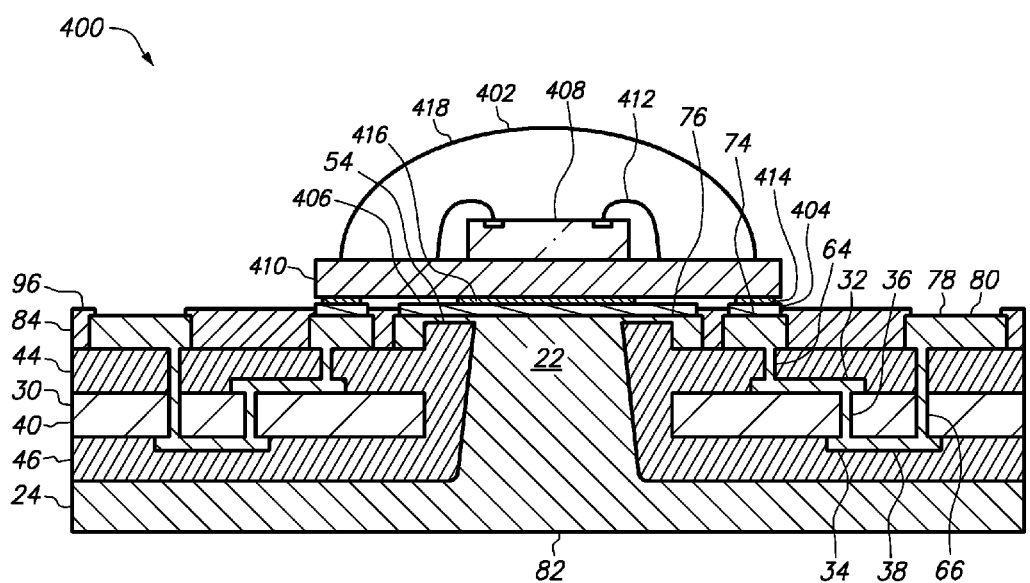
FIGS. 14A, 14B and 14C are cross-sectional, top and bottom views, respectively, of a semiconductor chip assembly that includes a thermal board with horizontal signal routing and a semiconductor device with backside contacts in accordance with an embodiment of the present invention.
Figure 14B:
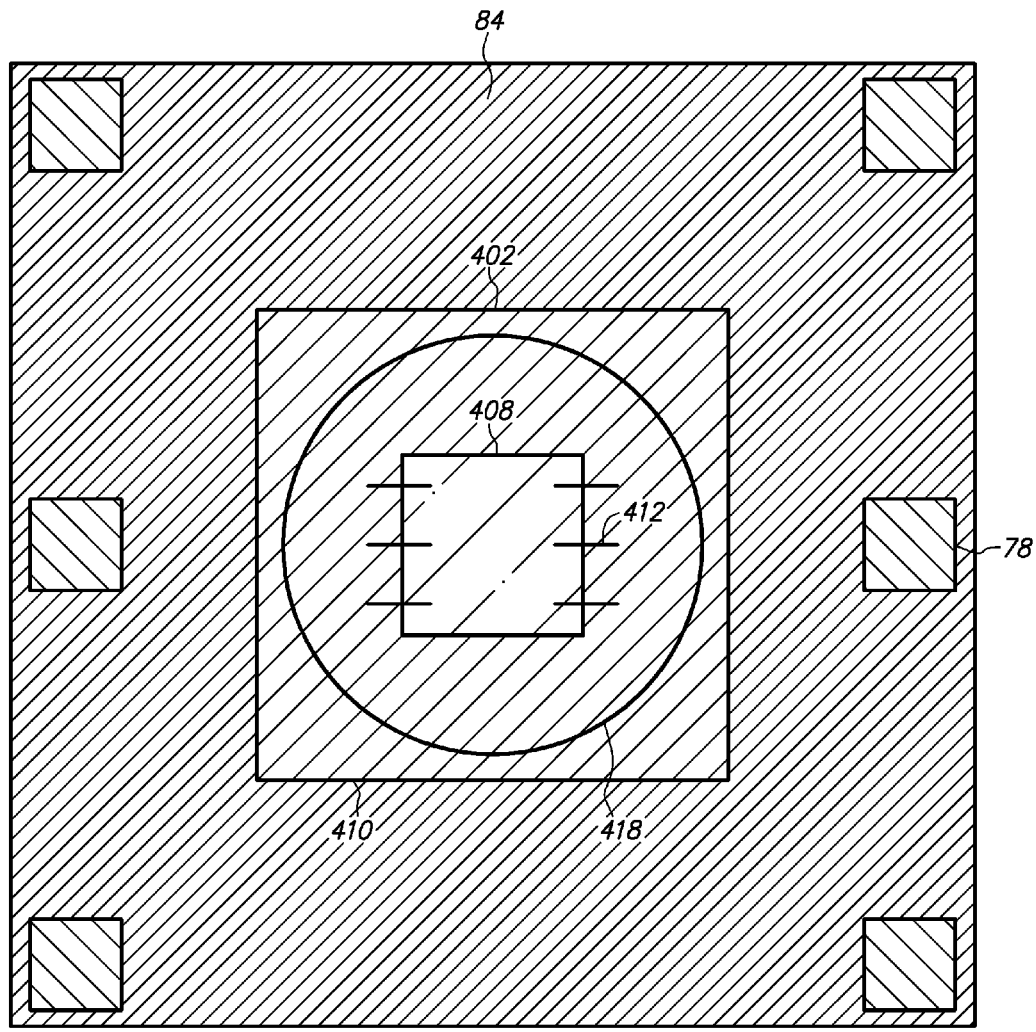
Figure 14C:
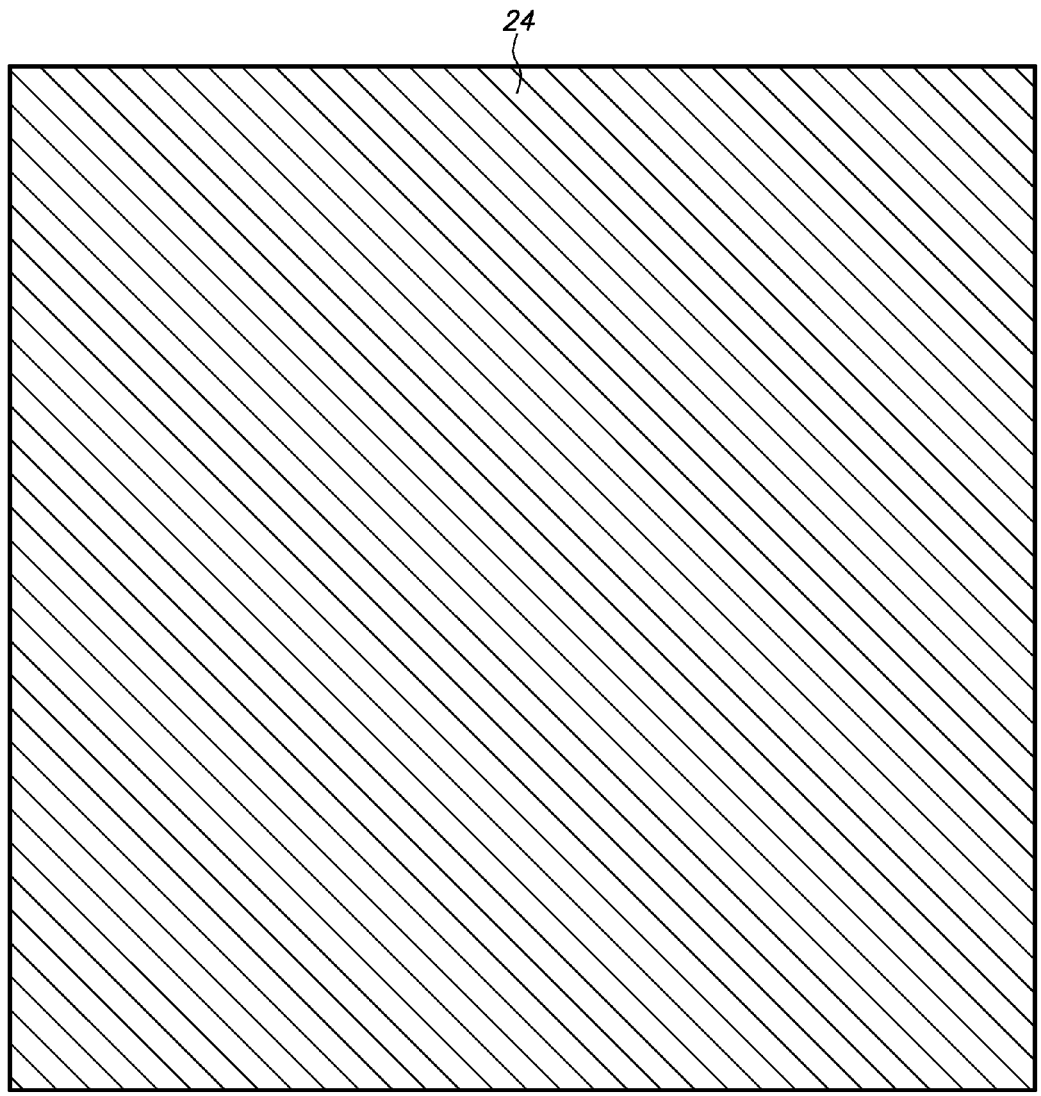

FIGS. 14A, 14B and 14C are cross-sectional, top and bottom views, respectively, of a semiconductor chip assembly that includes a thermal board with horizontal routing and a semiconductor device with backside contacts in accordance with an embodiment of the present invention.

In this embodiment, the semiconductor device is an LED package rather than an LED chip and the pad and the terminal extend above the adhesive. Furthermore, the semiconductor device is mounted on the heat spreader and the conductive trace, overlaps the post and the conductive trace, is electrically connected to the pad using a solder joint and is thermally connected to the cap using a solder joint. For purposes of brevity, any description of assembly 300 is incorporated herein insofar as the same is applicable, and the same description need not be repeated. Likewise, elements of the assembly similar to those in assembly 300 have corresponding reference numerals indexed at four-hundred rather than three-hundred. For instance, LED package 402 corresponds to LED package 302, solder joint 404 corresponds to solder joint 304, etc.

Semiconductor chip assembly 400 includes thermal board 96, LED package 402 and solder joints 404 and 406. LED package 402 includes LED chip 408, submount 410, wire bond 412, electrical contact 414, thermal contact 416 and encapsulant 418. LED chip 408 includes a bond pad (not shown) electrically connected to a via (not shown) in submount 410 by wire bond 412, thereby electrically connecting LED chip 408 to electrical contact 414. LED chip 408 is mounted on and thermally connected to and mechanically attached to submount 410 by a die attach (not shown), thereby thermally connecting LED chip 408 to thermal contact 416. Submount 410 is a ceramic block with low electrical conductivity and high thermal conductivity, and contacts 414 and 416 are plated on and protrude downwardly from the backside of submount 410.

LED package 402 is mounted on conductive trace 80 and heat spreader 82, electrically connected to conductive trace 80 and thermally connected to heat spreader 82. In particular, LED package 402 is mounted on pad 74 and cap 76 (and thus post 22 and adhesive 44), overlaps post 22, base 24, substrate 30, adhesives 44 and 46, pad 74 and cap 76 but does not overlap terminal 78, is electrically connected to pad 74 by solder joint 404 and is thermally connected to cap 76 by solder joint 406.

Semiconductor chip assembly 400 can be manufactured by depositing a solder material on pad 74 and cap 76, then placing contacts 414 and 416 on the solder material over pad 74 and cap 76, respectively, and then reflowing the solder material to provide solder joints 404 and 406.

Semiconductor chip assembly 400 is a second-level single-chip module.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the thermal board can include multiple posts arranged in an array for multiple semiconductor devices and additional conductive traces to accommodate the additional semiconductor devices. The thermal board can also include the pad and the terminal located above and electrically connected to a power/ground plane. The thermal board can also include the first and/or second via at a peripheral edge. The thermal board can also include the vias axially aligned and integral with one another at a power/ground plane. The semiconductor device can be flip-chip bonded to the pad and the cap by solder joints, overlap the pad and cover the post in the upward direction. The semiconductor device can be covered in the upward direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the thermal board can include additional conductive traces to receive and route additional wire bonds to the chips. This may be more cost effective than providing a miniature post for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a post and a base that are integral with one another and a cap that is metallurgically bonded and thermally connected to the post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the cap can have a square or rectangular shape in a lateral plane with the same or similar topography as the thermal contact of the semiconductor device. In any case, the heat spreader can be a wide variety of thermally conductive structures.

The heat spreader can be electrically connected to or isolated from the conductive trace. For instance, a routing line above the adhesive can electrically connect the pad and the cap, a routing line below the adhesive can electrically connect the base and the terminal or the pad and the cap can be merged. Thereafter, the terminal can be electrically connected to ground, thereby electrically connecting the cap to ground.

The post can be deposited on or integral with the base. The post can be integral with the base when they are a single-piece metal such as copper or aluminum. The post can also be integral with the base when they include a single-piece metal such as copper at their interface as well as additional metal elsewhere such as a solder upper post portion and a copper lower post portion and base. The post can also be integral with the base when they share single-piece metals at their interface such as a copper coating on a nickel buffer layer on an aluminum core.

The post can include a flat top surface that is coplanar with the adhesive. For instance, the post can be coplanar with the adhesive or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified. The cap can be the same metal as the post or the adjacent top of the post. Furthermore, the cap cover the aperture or reside within a periphery of the aperture. In any case, the cap extends upwardly from the top of the post.

The adhesive can provide a robust mechanical bond between the heat spreader and the substrate. For instance, the adhesive can extend laterally from the post beyond the conductive trace to the peripheral edges of the assembly, the adhesive can fill the space between the post spreader and the dielectric layer and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gaps and essentially all the adhesive is within structure once it is solidified and/or grinded. For instance, the optimal prepreg thickness for the first and/or second adhesive can be established through trial and error. Likewise, the dielectric layer thickness can be adjusted to achieve this result.

The substrate can be a low cost laminated structure that need not have high thermal conductivity.

The conductive layer alone can be mounted on the first adhesive. Alternatively, the conductive layer and a dielectric layer can be mounted on the first adhesive. For instance, the conductive layer can be provided on the dielectric layer, then the hole can be formed in the conductive layer and the dielectric layer, and then the conductive layer and the dielectric layer can be mounted on the first adhesive so that the conductive layer is exposed in the upward direction, the dielectric layer contacts and is sandwiched between and separates the conductive layer and the first adhesive and the post is aligned with and exposed in the upward direction by the hole. In this instance, the conductive layer can have a thickness of 10 to 50 microns such as 30 microns which is thick enough for reliable signal transfer yet thin enough to reduce weight and cost. Furthermore, the dielectric layer can be located above the substrate and be a permanent part of the thermal board.

The conductive layer and a carrier can be mounted on the first adhesive. For instance, the conductive layer can be attached to a carrier such biaxially-oriented polyethylene terephthalate polyester (Mylar) by a thin film, then the hole can be formed in the conductive layer but not the carrier, then the conductive layer and the carrier can be mounted on the first adhesive so that the carrier covers the conductive layer and is exposed in the upward direction, the thin film contacts and is sandwiched between the carrier and the conductive layer, the conductive layer contacts and is sandwiched between the thin film and the first adhesive, and the post is aligned with the hole and covered in the upward direction by the carrier. After the adhesives are solidified, the thin film can be decomposed by UV light so that the carrier can be peeled off the conductive layer, thereby exposing the conductive layer in the upward direction, and then the conductive layer can be grinded and patterned for the pad and the cap. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the cap can be coplanar at their top surfaces, thereby enhancing solder joints between the semiconductor device and the thermal board by controlling solder ball collapse.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers. Furthermore, the conductive layer can be patterned to provide the pad before or after the first via is formed. Likewise, the base can be patterned to provide the terminal before or after the second via is formed.

The plated contact surface finish can be formed before or after the pad and the terminal are formed. For instance, the plated contacts can be deposited on the base and the conductive layer before or after they are etched to form the pad, the terminal and the cap.

The rim can be reflective or non-reflective and transparent or non-transparent. For instance, the rim can include a highly reflective metal such as silver or aluminum with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, plated layers, plated contacts and solder masks are generally desirable but may be omitted in some embodiments. For instance, if the hole, the aperture and the openings are punched rather than drilled so that the top of the post is shaped and sized to accommodate a thermal contact surface of the semiconductor device then the cap may be omitted. Likewise, if a reflector is unnecessary then the rim can be omitted.

The thermal board can include a thermal via that is spaced from the post, extends through the adhesive and the dielectric layer outside the aperture and the openings and is adjacent to and thermally connects the base and the cap to improve heat dissipation from the cap to the base and heat spreading in the base.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single conductive layer, a single substrate, a single first adhesive and a single second adhesive and then separated from one another. Likewise, numerous sets of heat spreaders and conductive traces that are each dedicated to a single semiconductor device can be simultaneously batch manufactured for each thermal board in the batch using a single metal plate, a single conductive layer, a single substrate, a single first adhesive and a single second adhesive.

For example, multiple recesses can be etched in the metal plate to form multiple posts and the base, then the non-solidified second adhesive with openings corresponding to the posts can be mounted on the base such that each post extends through an opening in the second adhesive, then the substrate (with a single dielectric layer, multiple conductive patterns and apertures corresponding to the posts) can be mounted on the second adhesive such that each post extends into an aperture, then the non-solidified first adhesive with openings corresponding to the posts can be mounted on the substrate such that each post is aligned with an opening in the first adhesive, then the conductive layer with holes corresponding to the posts can be mounted on the first adhesive such that each post is aligned with a hole, then the base and the conductive layer can be moved towards one another by platens to force the first adhesive into the gaps in the holes between the posts and the conductive layer and the second adhesive into the gaps in the apertures between the posts and the substrate, then the adhesives can be cured and solidified, then the posts, the first adhesive and the conductive layer can be grinded to form a lateral top surface, then the first windows can be formed in the first adhesive to expose the corresponding first conductive segments and the second windows can be formed in the second adhesive to expose the corresponding second conductive segments, then the first and second plated layers can be plated on the structure to form the first vias in the first windows and the second vias in the second windows, then the conductive layer and the first plated layer can be etched to form the caps corresponding to the posts and the pads corresponding to the first vias, the base and the second plated layer can be etched to form the bases corresponding to the posts and the terminals corresponding to the second vias, then the solder masks can be formed on the structure, then the plated contact surface finish can be formed on the bases, the caps, the pads and the terminals and then the dielectric layer, the adhesives and the solder masks can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap or the die attach is between the semiconductor device and the post and is intersected by the line, and regardless of whether another imaginary vertical line intersects the post but not the semiconductor device (outside the periphery of the semiconductor device). Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the conductive pattern but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet when it is mounted on the first adhesive, and the conductive layer can be a patterned circuit with spaced traces on the first adhesive when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" and "hole" refer to a through-hole and are synonymous. For instance, the post is exposed by the substrate in the upward direction when it is inserted into the aperture in the substrate.

The term "inserted" refers to relative motion between elements. For instance, the post is inserted into the aperture regardless of whether the post is stationary and the conductive layer moves towards the post, the conductive layer is stationary and the post moves towards the conductive layer or the post and the conductive layer both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the conductive layer move towards one another regardless of whether the base is stationary and the conductive layer moves towards the base, the conductive layer is stationary and the base moves towards the conductive layer or the base and the conductive layer both approach the other.

The phrase "aligned with" refers to relative position between elements. For instance, the post is aligned with the hole when the second adhesive is mounted on the base, the substrate is mounted on the second adhesive, the first adhesive is mounted on the substrate, the conductive layer is mounted on the first adhesive, post is inserted into and aligned with the aperture and the hole is aligned with the aperture regardless of whether the post is inserted into the hole or is below and spaced from the hole.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the second gap refers to the adhesive in the second gap that extends across the dielectric layer. Likewise, adhesive that contacts and is sandwiched between the post and the dielectric layer in the second gap refers to the adhesive in the second gap that contacts and is sandwiched between the post at the inner sidewall of the second gap and the dielectric layer at the outer sidewall of the second gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink. Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
   a semiconductor device;
   an adhesive that includes an opening;
   a heat spreader that includes a post and a base, wherein the post is adjacent to and integral with the base and extends above the base in an upward direction, and the base extends below the post in a downward direction opposite the upward direction, covers the post in the downward direction and extends laterally from the post in lateral directions orthogonal to the upward and downward directions;
   a substrate that includes a first conductive segment, a second conductive segment and a dielectric layer, wherein the first conductive segment is attached to and extends above the dielectric layer, the second conductive segment is attached to and extends below the dielectric layer, the dielectric layer contacts and is sandwiched between the conductive segments and an aperture extends through the substrate; and
   a conductive trace that includes a pad, a terminal, a conductive pattern, a first via and a second via, wherein the conductive pattern is a part of the substrate and includes the first and/or second conductive segment, the first via extends through the adhesive and extends to the conductive pattern, the second via extends through the adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via;
   wherein the semiconductor device overlaps the post, is electrically connected to the pad and thereby electrically connected to the terminal, and is thermally connected to the post and thereby thermally connected to the base;
   wherein the adhesive is mounted on and extends above the base, extends above and below the substrate, extends laterally from the post to or beyond the terminal and is sandwiched between the post and the substrate, between the base and the substrate, between the pad and the substrate and between the terminal and the substrate;
   wherein the substrate is mounted on the adhesive and extends above the base;
   wherein the post extends into the opening, extends through the aperture and extends above and below the substrate; and
   wherein the base extends below the semiconductor device and the substrate.

2. The assembly of claim 1, wherein the semiconductor device is an LED chip.

3. The assembly of claim 1, wherein the semiconductor device is an LED package.

4. The assembly of claim 1, wherein the semiconductor device is electrically connected to the pad using a wire bond and is thermally connected to the post using a die attach.

5. The assembly of claim 1, wherein the semiconductor device is electrically connected to the pad using a first solder joint and is thermally connected to the post using a second solder joint.

6. The assembly of claim 1, wherein the adhesive contacts the post, the base, the pad, the terminal, the dielectric layer, the conductive pattern and the vias.

7. The assembly of claim 1, wherein the adhesive covers and surrounds the post in the lateral directions.

8. The assembly of claim 1, wherein the adhesive is coplanar with the post above the substrate.

9. The assembly of claim 1, wherein the adhesive is coplanar with post below the substrate.

10. The assembly of claim 1, wherein the adhesive extends to peripheral edges of the assembly.

11. The assembly of claim 1, wherein the post has a diameter that decreases as it extends upwardly from the base to its top integral with the base.

12. The assembly of claim 1, wherein the base covers the semiconductor device and the pad in the downward direction.

13. The assembly of claim 1, wherein the pad and the first via are located above the conductive pattern and the terminal and the second via are located below the conductive pattern.

14. The assembly of claim 1, wherein the conductive pattern is a power/ground plane.

15. The assembly of claim 1, wherein the conductive pattern is the first conductive segment, the first via extends through the adhesive to the first conductive segment and the second via extends through the adhesive and the dielectric layer to the first conductive segment.

16. The assembly of claim 1, wherein the conductive pattern is the second conductive segment, the first via extends through the adhesive and the dielectric layer to the second conductive segment and the second via extends through the adhesive to the second conductive segment.

17. The assembly of claim 1, wherein the conductive pattern includes the conductive segments and an electrical interconnect that extends through the dielectric layer and electrically connects the conductive segments, the first via extends through the adhesive to the first conductive segment and the second via extends through the adhesive to the second conductive segment.

18. The assembly of claim 1, wherein the base and the terminal are the same metals and have the same thickness and are coplanar with one another.

19. The assembly of claim 1, wherein the heat spreader includes a cap that extends above and is adjacent to and covers in the upward direction and extends laterally from a top of the post and that contacts and overlaps the adhesive.

20. The assembly of claim 19, wherein the base, the cap, the pad and the terminal are primarily copper and the heat spreader includes a buried copper core shared by the post, the base and the cap.

21. A semiconductor chip assembly, comprising:
   a semiconductor device;
   an adhesive that includes an opening;
   a heat spreader that includes a post and a base, wherein the post is adjacent to and integral with the base and extends above the base in an upward direction, and the base extends below the post in a downward direction opposite the upward direction, covers the post in the downward direction and extends laterally from the post in lateral directions orthogonal to the upward and downward directions;
   a substrate that includes a first conductive segment, a second conductive segment and a dielectric layer, wherein the first conductive segment is attached to and extends above the dielectric layer, the second conductive segment is attached to and extends below the dielectric layer, the dielectric layer contacts and is sandwiched between the conductive segments and an aperture extends through the substrate; and a conductive trace that includes a pad, a terminal, a conductive pattern, a first via and a second via, wherein the pad is located above the substrate, the terminal is located below the substrate, the conductive pattern is a part of the substrate and includes the first and/or second conductive segment, the first via is located above the conductive pattern and extends through the adhesive and extends to the conductive pattern, the second via is located below the conductive pattern and extends through the adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via;

wherein the semiconductor device overlaps the post, is electrically connected to the pad and thereby electrically connected to the terminal, and is thermally connected to the post and thereby thermally connected to the base;

wherein the adhesive is mounted on and extends above the base, extends above and below the substrate, extends laterally from the post to or beyond the terminal and is sandwiched between the post and the substrate, between the base and the substrate, between the pad and the substrate and between the terminal and the substrate;

wherein the substrate is mounted on the adhesive and extends above the base;

wherein the post extends into the opening, extends through the aperture and extends above and below the substrate; and wherein the base extends below the semiconductor device and the substrate.

22. The assembly of claim 21, wherein the semiconductor device is an LED chip.

23. The assembly of claim 21, wherein the semiconductor device is electrically connected to the pad using a wire bond and is thermally connected to the post using a die attach.

24. The assembly of claim 21, wherein the adhesive contacts the post, the base, the pad, the terminal, the conductive pattern, the vias and the dielectric layer, covers and surrounds the post in the lateral directions and extends to peripheral edges of the assembly.

25. The assembly of claim 21, wherein the post is coplanar with the adhesive above and below the substrate.

26. The assembly of claim 21, wherein the conductive pattern is a power/ground plane.

27. The assembly of claim 21, wherein the base and the terminal are the same metals and have the same thickness and are coplanar with one another.

28. The assembly of claim 21, wherein the conductive trace is spaced from the heat spreader, the post, the base, the pad and the terminal contact the adhesive and are spaced from the conductive pattern and the dielectric layer, and the conductive pattern and the vias contact the adhesive.

29. The assembly of claim 21, wherein the heat spreader includes a cap that extends above and is adjacent to and covers in the upward direction and extends laterally from a top of the post and that contacts and overlaps the adhesive, and the pad and the cap have the same thickness where closest to one another, have different thickness where the cap is adjacent to the post and are coplanar with one another at a surface that faces in the upward direction.

30. The assembly of claim 29, wherein the base, the cap, the pad and the terminal are the same metals and are primarily copper and the heat spreader includes a buried copper core shared by the post, the base and the cap.

31. A semiconductor chip assembly, comprising:

a semiconductor device;

an adhesive that includes an opening;

a heat spreader that includes a post, a base and a cap, wherein the post is adjacent to and integral with the base, extends above the base in an upward direction and thermally connects the base and the cap, the base extends below the post in a downward direction opposite the upward direction, covers the post in the downward direction and extends laterally from the post in lateral directions orthogonal to the upward and downward directions, and the cap extends above and is adjacent to and covers in the upward direction and extends laterally from a top of the post;

a substrate that includes a first conductive segment, a second conductive segment and a dielectric layer, wherein the first conductive segment is attached to and extends above the dielectric layer, the second conductive segment is attached to and extends below the dielectric layer, the dielectric layer contacts and is sandwiched between the conductive segments and an aperture extends through the substrate; and a conductive trace that includes a pad, a terminal, a conductive pattern, a first via and a second via, wherein the pad is located above the substrate and extends above the adhesive, the terminal is located below the substrate and extends below the adhesive, the conductive pattern is a part of the substrate and includes the first and/or second conductive segment, the first via is located above the conductive pattern and extends through the adhesive and extends to the conductive pattern, the second via is located below the conductive pattern and extends through the adhesive and extends to the conductive pattern and an electrically conductive path between the pad and the terminal includes the conductive pattern and the vias, an electrically conductive path between the pad and the conductive pattern includes the first via and an electrically conductive path between the terminal and the conductive pattern includes the second via;

wherein the semiconductor device is mounted on the cap, overlaps the post, the base and the cap, is electrically connected to the pad and thereby electrically connected to the terminal, and is thermally connected to the cap and thereby thermally connected to the base;

wherein the adhesive is mounted on and extends above the base, extends above and below the substrate, contacts and is sandwiched between the post and the substrate, between the base and the substrate, between the pad and the substrate and between the terminal and the substrate, contacts the conductive pattern, the vias and the dielectric layer, extends laterally from the post to or beyond the terminal and extends to peripheral edges of the assembly;

wherein the substrate is mounted on the adhesive and extends above the base;

wherein the post extends into the opening, extends through the aperture and extends above and below the substrate;

wherein the base extends below the semiconductor device and the substrate;

wherein the cap contacts and overlaps the adhesive;

wherein the pad and the cap have the same thickness where closest to one another, have different thickness where the cap is adjacent to the post and are coplanar with one another at a surface that faces in the upward direction; and wherein the base and the terminal have the same thickness and are coplanar with one another at a surface that faces in the downward direction.

32. The assembly of claim 31, wherein the semiconductor device is an LED chip, is mounted on the cap using a die attach, is electrically connected to the pad using a wire bond and is thermally connected to the cap using the die attach.

33. The assembly of claim 31, wherein the post has a diameter that decreases as it extends upwardly from the base to its top and is coplanar with the adhesive above the substrate at the cap and below the substrate at the base.

34. The assembly of claim 31, wherein the adhesive alone can intersect an imaginary horizontal line between the post and the dielectric layer, an imaginary horizontal line between the post and the conductive pattern, an imaginary horizontal line between the post and the first via, an imaginary horizontal line between the post and the second via, an imaginary vertical line between the base and the cap, an imaginary vertical line between the base and the dielectric layer, an imaginary vertical line between the pad and the dielectric layer and an imaginary vertical line between the terminal and the dielectric layer.

35. The assembly of claim 31, wherein the base, the cap, the pad and the terminal are the same metals, include a gold, silver or nickel surface layer and are primarily copper, the post and the conductive pattern are copper, the heat spreader includes a buried copper core shared by the post, the base and the cap and the conductive trace includes a buried copper core shared by the pad, the terminal, the conductive pattern and the vias.

* * * * *